United States Patent
Yamazaki et al.

(10) Patent No.: US 10,079,312 B2
(45) Date of Patent: Sep. 18, 2018

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Tokyo (JP); Yukie Suzuki, Kanagawa (JP); Kosei Noda, Kanagawa (JP); Yoshiaki Oikawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/496,014

(22) Filed: Apr. 25, 2017

(65) Prior Publication Data

US 2017/0229585 A1    Aug. 10, 2017

Related U.S. Application Data

(62) Division of application No. 13/742,415, filed on Jan. 16, 2013, now Pat. No. 9,653,614.

(30) Foreign Application Priority Data

Jan. 23, 2012 (JP) ................................. 2012-011160

(51) Int. Cl.
*H01L 27/12* (2006.01)
*H01L 29/786* (2006.01)
*H01L 29/66* (2006.01)

(52) U.S. Cl.
CPC .... *H01L 29/78693* (2013.01); *H01L 27/1225* (2013.01); *H01L 29/66969* (2013.01)

(58) Field of Classification Search
None
See application file for complete search history.

(56) References Cited

U.S. PATENT DOCUMENTS 4,862,237 A    8/1989  Morozumi
5,208,476 A    5/1993  Inoue
(Continued)

FOREIGN PATENT DOCUMENTS

EP    1737044 A    12/2006
EP    2120267 A    11/2009
(Continued)

OTHER PUBLICATIONS

Morosawa.N et al.; "35.3: Distinguished Paper: A Novel Self-Aligned Top-Gate Oxide TFT for AM-OLED Displays"; SID Digest '11: SID International Symposium Digest of Technical Papers; May 17, 2011; pp. 479-482.

(Continued)

*Primary Examiner* — Benjamin Sandvik
(74) *Attorney, Agent, or Firm* — Fish & Richardson P.C.

(57) ABSTRACT

A metal element of a metal film is introduced into the oxide semiconductor film by performing heat treatment in the state where the oxide semiconductor film is in contact with the metal film, so that a low-resistance region having resistance lower than that of a channel formation region is formed. A region of the metal film, which is in contact with the oxide semiconductor film, becomes a metal oxide insulating film by the heat treatment. After that, an unnecessary metal film is removed. Thus, the metal oxide insulating film can be formed over the low-resistance region.

13 Claims, 25 Drawing Sheets

(56) References Cited

U.S. PATENT DOCUMENTS

| | | |
|---|---|---|
| 5,372,958 A | 12/1994 | Miyasaka et al. |
| 5,482,870 A | 1/1996 | Inoue |
| 5,561,075 A | 10/1996 | Nakazawa |
| 5,583,366 A | 12/1996 | Nakazawa |
| 5,614,730 A | 3/1997 | Nakazawa et al. |
| 5,731,856 A | 3/1998 | Kim et al. |
| 5,744,864 A | 4/1998 | Cillessen et al. |
| 5,814,539 A | 9/1998 | Nakazawa |
| 6,087,679 A | 7/2000 | Yamazaki et al. |
| 6,136,625 A | 10/2000 | Nakazawa |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,003,981 B2 | 8/2011 | Iwasaki et al. |
| 8,164,090 B2 | 4/2012 | Iwasaki et al. |
| 8,384,076 B2 | 2/2013 | Park et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0286952 A1 | 11/2008 | Miyairi et al. |
| 2008/0296568 A1 | 12/2008 | Ryu et al. |
| 2009/0008645 A1 | 1/2009 | Yamazaki et al. |
| 2009/0068773 A1 | 3/2009 | Lai et al. |
| 2009/0073325 A1 | 3/2009 | Kuwabara et al. |
| 2009/0081849 A1 | 3/2009 | Yamazaki et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117073 A1 | 5/2010 | Yamazaki et al. |
| 2010/0193782 A1 | 8/2010 | Sakata |
| 2011/0114940 A1 | 5/2011 | Kim et al. |
| 2011/0204362 A1 | 8/2011 | Akimoto et al. |
| 2011/0240998 A1 | 10/2011 | Morosawa et al. |
| 2011/0263083 A1 | 10/2011 | Yamazaki |
| 2011/0280061 A1 | 11/2011 | Saito et al. |
| 2012/0001167 A1 | 1/2012 | Morosawa |
| 2012/0119212 A1 | 5/2012 | Endo et al. |
| 2012/0161121 A1 | 6/2012 | Yamazaki |
| 2012/0161122 A1 | 6/2012 | Yamazaki |
| 2012/0161123 A1 | 6/2012 | Yamazaki |
| 2012/0161124 A1 | 6/2012 | Yamazaki |
| 2012/0161126 A1 | 6/2012 | Yamazaki |
| 2012/0218495 A1 | 8/2012 | Oshima |
| 2012/0315730 A1 | 12/2012 | Koezuka et al. |
| 2012/0315735 A1 | 12/2012 | Koezuka et al. |
| 2013/0009148 A1 | 1/2013 | Yamazaki |
| 2013/0221347 A1 | 8/2013 | Isobe et al. |
| 2013/0267068 A1 | 10/2013 | Hanaoka et al. |

FOREIGN PATENT DOCUMENTS

| | | |
|---|---|---|
| EP | 2226847 A | 9/2010 |
| EP | 2408011 A | 1/2012 |
| EP | 2927965 A | 10/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |

(56) References Cited

FOREIGN PATENT DOCUMENTS

| | | |
|---|---|---|
| JP | 2004-103957 A | 4/2004 |
| JP | 2004-273614 A | 9/2004 |
| JP | 2004-273732 A | 9/2004 |
| JP | 2007-220817 A | 8/2007 |
| JP | 2008-112909 A | 5/2008 |
| JP | 2009-278115 A | 11/2009 |
| JP | 2011-228622 A | 11/2011 |
| JP | 2012-015436 A | 1/2012 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Oxygen Vacancies in ZnO", Appl. Phys. Lett. (Applied Physics Letters), 2005, vol. 87, pp. 122102-1-122102-3.

Janotti.A et al., "Native Point Defects in ZnO", Phys. Rev. B (Physical Review. B), Oct. 4, 2007, vol. 76, No. 16, pp. 165202-1-165202-22.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper: Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Syntheses and Single-Crystal Data of Homologous Compounds, In2O3(ZnO)m (m=3, 4, and 5), In GaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kimizuka.N et al., Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C., Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura, "Synthesis of Homologous Compound with New Long-Period Structure", NIRIM Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nowatari.H et al., "60.2:Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3: 4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.S et al., "Challenge to Future Displays: Transparent AM-OLED Driven by PEALD Grown ZnO TFT", IMID '07 Digest, 2007, pp. 1249-1252.

Park, Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

SEMICONDUCTOR DEVICE AND METHOD FOR MANUFACTURING THE SAME

CROSS-REFERENCE TO RELATED APPLICATIONS

This application is a divisional of U.S. application Ser. No. 13/742,415, filed Jan. 16, 2013, now allowed, which claims the benefit of a foreign priority application filed in Japan as Serial No. 2012-011160 on Jan. 23, 2012, both of which are incorporated by reference.

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and an electronic appliance are all semiconductor devices.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

Better electric characteristics of a transistor including an oxide semiconductor are required for application to semiconductor devices with higher performance. For example, a transistor having a self-aligned structure, in which a gate electrode and a gate insulating film are formed over a region of an oxide semiconductor film serving as a channel formation region of the transistor, and a source region and a drain region are formed in such a manner that the resistance of a region of the oxide semiconductor film, which is covered with neither the gate electrode nor the gate insulating film, is reduced, is reported (for example, see Patent Document 1). Further, a transistor having a structure in which an oxide semiconductor including aluminum, titanium, or the like as dopant in the depth direction from a top surface is used for a source region and a drain region is reported (for example, see Patent Document 2).

REFERENCE

Patent Document

[Patent Document 1] Japanese Published Patent Application No. 2007-220817
[Patent Document 2] Japanese Published Patent Application No. 2011-228622

SUMMARY OF THE INVENTION

In Patent Document 1, in order to form the low-resistance source region and drain region in a self-aligned manner, a silicon nitride film is formed as an interlayer insulating film by a plasma CVD method over the region of the oxide semiconductor film, which is covered with neither the gate electrode nor the gate insulating film, and hydrogen included in the silicon nitride film is introduced into the oxide semiconductor film; thus, the low-resistance regions are formed. However, in this method, hydrogen might diffuse to the channel formation region and it is difficult to obtain stable semiconductor characteristics.

Further, in Patent Document 2, in order to form the low-resistance source region and drain region in a self-aligned manner, a metal film (e.g., aluminum or titanium) is formed over a region of the oxide semiconductor film, which is covered with neither a gate electrode nor a gate insulating film, and heat treatment is performed in an oxidizing gas atmosphere so that the metal film and the oxide semiconductor film react with each other; thus, the low-resistance regions are formed. However, in this method, the metal film is oxidized by being subjected to heat treatment in the oxidizing gas atmosphere after formation of the metal film. If the metal film is not completely oxidized and even part of the metal film remains in the state of not being oxidized, unnecessary capacitance is formed between the metal film and a gate electrode or the like, or the source region and the drain region are electrically connected to each other through the metal film, which might adversely influence electric characteristics of the transistor.

In view of the above problems, an object of an embodiment of the present invention is to provide a self-aligned transistor including an oxide semiconductor film, which has excellent and stable electric characteristics. Further, an object is to provide a method for manufacturing the transistor. Furthermore, an object is to provide a high-performance semiconductor device including the transistor.

In the self-aligned transistor including the oxide semiconductor film, heat treatment is performed in an inert gas atmosphere in the state where the oxide semiconductor film and a metal film are in contact with each other, whereby an element included in the metal film is introduced into the oxide semiconductor film to form a low-resistance region having resistance lower than that of a channel formation region. A region of the metal film, which is in contact with the oxide semiconductor film, becomes a metal oxide insulating film by the heat treatment. Then, an unnecessary region of the metal film is removed. By the removal of the unnecessary region of the metal film, unnecessary capacitance due to the metal film is not formed. Thus, the metal oxide insulating film can be formed over the low-resistance region and the metal oxide insulating film can prevent diffusion of an impurity entering the oxide semiconductor film from the outside or release of oxygen from the oxide semiconductor film. Details thereof will be described below.

An embodiment of the present invention is a semiconductor device including an oxide film, an oxide semiconductor film which is formed over the oxide film and includes a channel formation region and a low-resistance region having resistance lower than that of the channel formation region, a metal oxide insulating film formed in contact with the low-resistance region, a gate insulating film formed over the oxide semiconductor film, and a gate electrode which is formed in contact with the gate insulating film and overlaps with the channel formation region. The low-resistance region includes at least a metal element included in the metal oxide insulating film.

Another embodiment of the present invention is a semiconductor device including an oxide film, an oxide semiconductor film which is formed over the oxide film and includes a channel formation region and low-resistance regions having resistance lower than that of the channel formation region, metal oxide insulating films formed in contact with the low-resistance regions, a gate insulating film formed over the oxide semiconductor film, a gate electrode which is formed in contact with the gate insulating film and overlaps with the channel formation region, a sidewall insulating film which is formed over the gate insulating film and formed on a side surface of the gate electrode in a cross section taken along the channel length direction, a protective insulating film formed over the metal oxide insulating films, the sidewall insulating film, and the gate electrode, and a source electrode and a drain electrode electrically connected to the low-resistance regions. The low-resistance regions include at least a metal element included in the metal oxide insulating films.

In the above structure, an impurity region having resistance different from that of the low-resistance regions may be formed between the channel formation region and each of the low-resistance regions.

Another embodiment of the present invention is a semiconductor device including an oxide film, an oxide semiconductor film which is formed over the oxide film and includes a channel formation region and low-resistance regions having resistance lower than that of the channel formation region, metal oxide insulating films formed in contact with the low-resistance regions, a gate insulating film formed over the oxide semiconductor film, a gate electrode which is formed in contact with the gate insulating film and overlaps with the channel formation region, a sidewall insulating film which is formed over the metal oxide insulating films and formed on a side surface of the gate electrode in a cross section taken along the channel length direction, a protective insulating film formed over the metal oxide insulating films, the sidewall insulating film, and the gate electrode, and a source electrode and a drain electrode electrically connected to the low-resistance regions. The low-resistance regions include at least a metal element included in the metal oxide insulating films.

Another embodiment of the present invention is a semiconductor device including an oxide film, a source electrode and a drain electrode formed over the oxide film, an oxide semiconductor film which is formed over the oxide film, the source electrode, and the drain electrode and includes a channel formation region and low-resistance regions having resistance lower than that of the channel formation region, metal oxide insulating films formed in contact with the low-resistance regions, a gate insulating film formed over the oxide semiconductor film, a gate electrode which is formed in contact with the gate insulating film and overlaps with the channel formation region, a sidewall insulating film which is formed over the gate insulating film and formed on a side surface of the gate electrode in a cross section taken along the channel length direction, and a protective insulating film formed over the metal oxide insulating films, the sidewall insulating film, and the gate electrode. The low-resistance regions include at least a metal element included in the metal oxide insulating films.

In the above structure, an impurity region having resistance different from that of the low-resistance regions may be formed between the channel formation region and each of the low-resistance regions.

Another embodiment of the present invention is a semiconductor device including an oxide film, a source electrode and a drain electrode formed over the oxide film, an oxide semiconductor film which is formed over the oxide film, the source electrode, and the drain electrode and includes a channel formation region and low-resistance regions having resistance lower than that of the channel formation region, metal oxide insulating films formed in contact with the oxide semiconductor film, a gate electrode which is formed in contact with the gate insulating film and overlaps with the channel formation region, a sidewall insulating film which is formed over the metal oxide insulating films and formed on a side surface of the gate electrode in a cross section taken along the channel length direction, and a protective insulating film formed over the metal oxide insulating films, the sidewall insulating film, and the gate electrode. The low-resistance regions include at least a metal element included in the metal oxide insulating films.

In any of the above structures, the metal oxide insulating films preferably include one or more elements selected from aluminum, indium, titanium, tin, tungsten, nickel, molybdenum, and zinc. Further, the low-resistance regions are preferably formed with the channel formation region interposed therebetween, and preferably include one or more elements selected from aluminum, indium, titanium, tin, tungsten, nickel, molybdenum, zinc, phosphorus, arsenic, antimony, boron, nitrogen, helium, neon, argon, fluorine, and chlorine.

Further, in any of the above structures, the oxide semiconductor film preferably includes an oxide comprising one or more elements selected from indium, zinc, gallium, tin, hafnium, zirconium, titanium, scandium, yttrium, cerium, neodymium, and gadolinium. In addition, it is preferable that the channel formation region include a crystal portion and the c-axis of the crystal portion be aligned in the direction parallel to a normal vector of a surface where the oxide semiconductor film is formed.

In the oxide semiconductor film including the channel formation region, the low-resistance regions are provided with the channel formation region interposed therebetween in a cross section taken along the channel length direction, whereby an on-state characteristic (e.g., on-state current and field-effect mobility) which is one of electric characteristics of the transistor including the oxide semiconductor film can be increased.

Further, heat treatment is performed in an inert gas atmosphere in the state where an oxide semiconductor film is in contact with a metal film, whereby an element in the metal film is introduced into the oxide semiconductor film to form a low-resistance region having resistance lower than that of a channel formation region in a self-aligned manner. In addition, a region of the metal film, which is in contact with the oxide semiconductor film, becomes a metal oxide insulating film by the heat treatment. Then, an unnecessary region of the metal film is removed. Thus, the metal oxide insulating film can be formed over the low-resistance region. Further, the metal oxide insulating film can effectively prevent diffusion of an impurity entering the oxide semiconductor film from the outside or release of oxygen from the oxide semiconductor film. Furthermore, by the removal of the unnecessary region of the metal film, unnecessary capacitance due to the metal film is not formed.

Another embodiment of the present invention is a method for manufacturing a semiconductor device, including the steps of forming an oxide film; forming an oxide semiconductor film including a channel formation region over the oxide film; forming a stack of a gate insulating film and a gate electrode over the oxide semiconductor film; selectively introducing dopant into the oxide semiconductor film through the gate insulating film with the use of the gate electrode as a mask; forming a sidewall insulating film on a side surface of the gate electrode in a cross section taken along the channel length direction; removing part of the gate insulating film with the use of the gate electrode and the sidewall insulating film as masks to expose a surface of the oxide semiconductor film; forming a metal film in contact with part of the oxide semiconductor film; forming low-resistance regions including a metal element by heat treatment performed in the state where the oxide semiconductor film is in contact with the metal film to introduce the metal element into the oxide semiconductor film from the metal film; forming metal oxide insulating films by selectively oxidizing the metal film which is in contact with the oxide film and the oxide semiconductor film by the heat treatment; and removing the metal film.

Another embodiment of the present invention is a method for manufacturing a semiconductor device, including the steps of forming an oxide film; forming an oxide semiconductor film including a channel formation region over the oxide film; forming a stack of a gate insulating film and a gate electrode over the oxide semiconductor film; removing part of the gate insulating film with the use of the gate electrode as a mask to expose a surface of the oxide semiconductor film; forming a metal film in contact with part of the oxide semiconductor film; forming low-resistance regions including a metal element by heat treatment performed in the state where the oxide semiconductor film is in contact with the metal film to introduce the metal element into the oxide semiconductor film from the metal film; forming metal oxide insulating films by selectively oxidizing the metal film which is in contact with the oxide film and the oxide semiconductor film by the heat treatment; removing the metal film; forming a sidewall insulating film on a side surface of the gate electrode in a cross section taken along the channel length direction; and selectively introducing dopant into the oxide semiconductor film through the metal oxide insulating films with the use of the gate electrode and the sidewall insulating film as masks.

Each of the above embodiments may further include the steps of forming a protective insulating film and an interlayer insulating film for covering the metal oxide insulating films, the sidewall insulating film, and the gate electrode; forming opening portions reaching the low-resistance regions in the interlayer insulating film; and forming a source electrode and a drain electrode in the opening portions.

Another embodiment of the present invention is a method for manufacturing a semiconductor device, including the steps of forming an oxide film; forming a source electrode and a drain electrode over the oxide film; forming an oxide semiconductor film including a channel formation region over the source electrode and the drain electrode; forming a stack of a gate insulating film and a gate electrode over the oxide semiconductor film; selectively introducing dopant into the oxide semiconductor film through the gate insulating film with the use of the gate electrode as a mask; forming a sidewall insulating film on a side surface of the gate electrode in a cross section taken along the channel length direction; removing part of the gate insulating film with the use of the gate electrode and the sidewall insulating film as masks to expose a surface of the oxide semiconductor film; forming a metal film in contact with part of the oxide semiconductor film; forming low-resistance regions including a metal element by heat treatment performed in the state where the oxide semiconductor film is in contact with the metal film to introduce the metal element into the oxide semiconductor film from the metal film; forming metal oxide insulating films by selectively oxidizing the metal film which is in contact with the oxide semiconductor film by the heat treatment; and removing the metal film.

Another embodiment of the present invention is a method for manufacturing a semiconductor device, including the steps of forming an oxide film; forming a source electrode and a drain electrode over the oxide film; forming an oxide semiconductor film including a channel formation region over the source electrode and the drain electrode; forming a stack of a gate insulating film and a gate electrode over the oxide semiconductor film; removing part of the gate insulating film with the use of the gate electrode as a mask to expose a surface of the oxide semiconductor film; forming a metal film in contact with part of the oxide semiconductor film; forming low-resistance regions including a metal element by heat treatment performed in the state where the oxide semiconductor film is in contact with the metal film to introduce the metal element into the oxide semiconductor film from the metal film; forming metal oxide insulating films by selectively oxidizing the metal film which is in contact with the oxide semiconductor film by the heat treatment; removing the metal film; forming a sidewall insulating film on a side surface of the gate electrode in a cross section taken along the channel length direction; and selectively introducing dopant into the oxide semiconductor film through the metal oxide insulating films with the use of the gate electrode and the sidewall insulating film as masks.

Each of the above embodiments may further include the step of forming a protective insulating film and an interlayer insulating film for covering the metal oxide insulating films, the sidewall insulating film, and the gate electrode.

Further, in any of the above embodiments, the heat treatment is preferably performed in an inert gas atmosphere. Furthermore, one or more of nitrogen, helium, neon, and argon are preferably used as the inert gas atmosphere. Thus, the heat treatment can be performed in an atmosphere in which a surface of the metal film is not oxidized, and the metal film can be favorably removed in a later step.

Further, in any of the above embodiments, the metal film preferably includes one or more elements selected from aluminum, indium, titanium, tin, tungsten, nickel, molybdenum, and zinc. As the dopant, one or more elements selected from aluminum, indium, titanium, tin, tungsten, nickel, molybdenum, zinc, phosphorus, arsenic, antimony, boron, nitrogen, helium, neon, argon, fluorine, and chlorine are preferably used.

A self-aligned transistor including an oxide semiconductor film, which has excellent and stable electric characteristics can be provided. Further, a method for manufacturing the transistor can be provided. Furthermore, a high-performance semiconductor device including the transistor can be provided.

DETAILED DESCRIPTION OF THE INVENTION

Figure 1A:
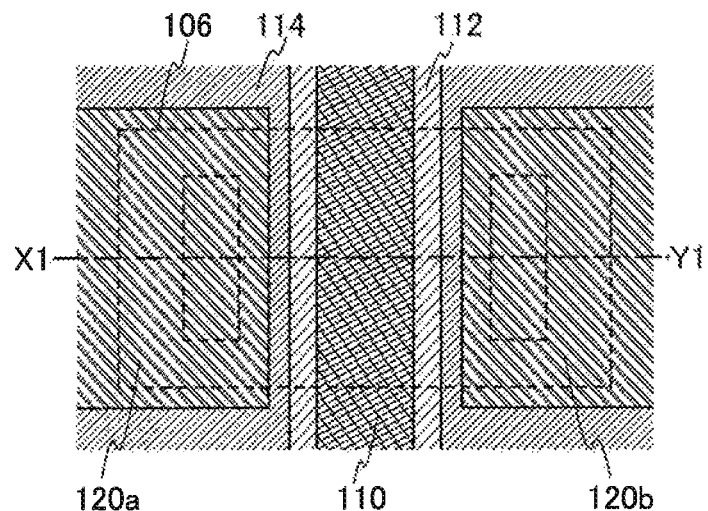
FIGS. 1A and 1B are a plan view and a cross-sectional view illustrating an embodiment of a semiconductor device.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Note that in this specification and the like, the term such as "over" or "below" does not necessarily mean that a component is placed "directly on" or "directly under" another component. For example, the expression "a gate electrode over a gate insulating film" can mean the case where there is an additional component between the gate insulating film and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object. Examples of an object having any electric function are a switching element such as a transistor, a resistor, an inductor, a capacitor, and an element with a variety of functions as well as an electrode and a wiring.

(Embodiment 1)

In this embodiment, an embodiment of a semiconductor device and a method for manufacturing the semiconductor device will be described with reference to FIGS. 1A and 1B, FIGS. 2A to 2E, FIGS. 3A to 3E, and FIGS. 4A to 4D.

<Structure Example 1 of Semiconductor Device>

Figure 1B:
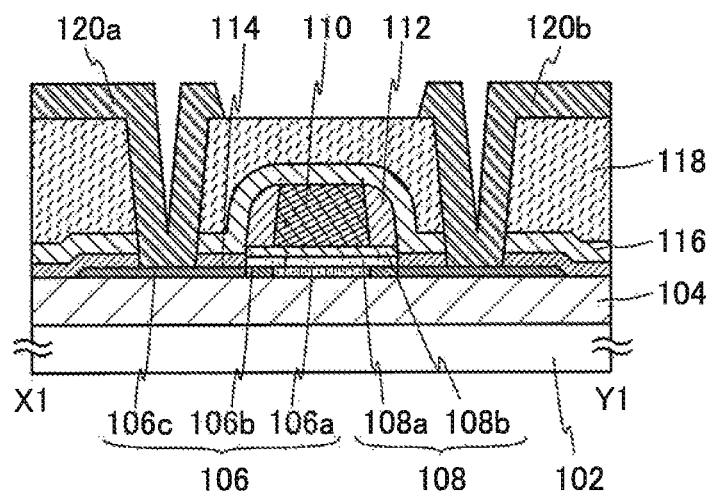

FIGS. 1A and 1B are a plan view and a cross-sectional view of a top-gate self-aligned transistor as an example of a semiconductor device. FIG. 1A is a plan view and FIG. 1B is a cross-sectional view taken along line X1-Y1 in FIG. 1A. Note that in FIG. 1A, some components of the transistor (e.g., a gate insulating film 108) are not illustrated for simplification.

The semiconductor device illustrated in FIGS. 1A and 1B includes a substrate 102, an oxide film 104 formed over the substrate 102, an oxide semiconductor film 106 which is formed over the oxide film 104 and includes a channel formation region 106a and low-resistance regions 106c having resistance lower than that of the channel formation region 106a, metal oxide insulating films 114 formed in contact with the low-resistance regions 106c, a gate insulating film 108 formed over the oxide semiconductor film 106, a gate electrode 110 which is formed in contact with the gate insulating film 108 and overlaps with the channel formation region 106a, and sidewall insulating films 112 formed on side surfaces of the gate electrode 110 in a cross section taken along the channel length direction. The low-resistance regions 106c include at least a metal element included in the metal oxide insulating films 114.

In addition, a protective insulating film 116 formed over the metal oxide insulating films 114, the sidewall insulating films 112, and the gate electrode 110, an interlayer insulating film 118 formed over the protective insulating film 116, and a source electrode 120a and a drain electrode 120b electrically connected to the low-resistance regions 106c may be included.

Note that as illustrated in FIG. 1B, the gate insulating film 108 preferably has a stacked structure of a first gate insulating film 108a and a second gate insulating film 108b. In the stacked structure of the gate insulating film 108, the first gate insulating film 108a is an oxide film containing excess oxygen and the second gate insulating film 108b is an insulating film having a blocking function, whereby oxygen can be supplied to the oxide semiconductor film 106 (particularly the channel formation region 106a), and an impurity can be prevented from entering the oxide semiconductor film 106 (particularly the channel formation region 106a) or oxygen can be prevented from being released upward from the first gate insulating film 108a. For example, a silicon oxynitride film can be used as the first gate insulating film 108a and an aluminum oxide film can be used as the second gate insulating film 108b.

The oxide semiconductor film 106 includes impurity regions 106b having resistance different from that of the low-resistance regions 106c between the channel formation region 106a and each of the low-resistance regions 106c. The low-resistance regions 106c and the impurity regions 106b can be formed in a self-aligned manner. Specifically, after the oxide semiconductor film 106 including the channel formation region 106a is formed, a stack of the gate insulating film 108 and the gate electrode 110 is formed over the oxide semiconductor film 106. Then, dopant is selectively introduced into the oxide semiconductor film 106 through the gate insulating film 108 with the use of the gate electrode 110 as a mask, so that the impurity regions 106b are formed. After that, the sidewall insulating films 112 are formed on the side surfaces of the gate electrode 110 in a cross section taken along the channel length direction. Then, part of the gate insulating film 108 is removed with the use of the gate electrode 110 and the sidewall insulating films 112 as masks; thus, a surface of the oxide semiconductor film 106 is exposed. After that, a metal film is formed in contact with part of the oxide semiconductor film and heat treatment is performed in the state where the oxide semiconductor film 106 is in contact with the metal film so that a metal element is introduced into the oxide semiconductor film 106 from the metal film; thus, the low-resistance regions 106c including the metal element can be formed. Further, the metal film which is in contact with the oxide film 104 and the oxide semiconductor film 106 is selectively oxidized by the heat treatment, whereby the metal oxide insulating films 114 are formed. The metal film is removed.

With such a structure, the low-resistance regions 106c and the impurity regions 106b are formed in the oxide semiconductor film 106 in a self-aligned manner, and the metal oxide insulating films 114 are formed over the low-resistance regions 106c. The metal oxide insulating films 114 can effectively prevent entry of an impurity to the oxide semiconductor film 106 or release of oxygen included in the oxide film 104 and the oxide semiconductor film 106. Further, since the metal film is removed, unnecessary capacitance due to the metal film is not formed.

Further, in the oxide semiconductor film 106, the impurity region 106b having resistance different from that of the low-resistance regions 106c is formed between the channel formation region 106a and each of the low-resistance regions 106c. The low-resistance regions 106c are, in other words, regions into which an impurity imparting n-type conductivity to the oxide semiconductor film 106 is introduced at high concentration. The impurity regions 106b are, in other words, regions into which an impurity imparting n-type conductivity to the oxide semiconductor film 106 is introduced at low concentration. With such a structure, a potential difference between the source and the drain which are associated with the channel formation region 106a can be reduced, and the semiconductor device can be highly reliable.

The following will show each component that can be included in the semiconductor device of the present invention in detail.

[Detailed Description of Substrate]

Although there is no particular limitation on a substrate that can be used as the substrate 102, it is necessary that the substrate have heat resistance to withstand at least heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium or the like; an SOI substrate; or the like can be used.

[Detailed Description of Oxide Film]

The oxide film 104 has the effect of preventing diffusion of an impurity element such as hydrogen or moisture from the substrate 102, and can be formed with a single-layer structure or a stacked structure using one or more of a silicon oxide film, a silicon nitride oxide film, and a silicon oxynitride film. In addition, the oxide film 104 preferably has the effect of supplying oxygen to the oxide semiconductor film 106 to be formed later. In the case where a silicon oxide film is used as the oxide film 104 for example, part of oxygen therein can be released by heating the oxide film 104, so that oxygen can be supplied to the oxide semiconductor film 106 to repair oxygen deficiency in the oxide semiconductor film 106. In particular, the oxide film 104 preferably contains oxygen at an amount that exceeds at least the stoichiometry. For example, a silicon oxide film of $SiO_{2+\alpha}$ ($\alpha>0$) is preferably used as the oxide film 104. With the use of such a silicon oxide film as the oxide film 104, oxygen can be supplied to the oxide semiconductor film 106.

[Detailed Description of Oxide Semiconductor Film]

An oxide semiconductor to be used for the oxide semiconductor film 106 preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. In addition, it is also preferable that one or more selected from hafnium (Hf), zirconium (Zr), titanium (Ti), scandium (Sc), yttrium (Y), and lanthanoid (e.g., cerium (Ce), neodymium (Nd), or gadolinium (Gd)) be contained as a stabilizer.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co, or the above-described element as a stabilizer. Alternatively, as the oxide semiconductor, a material represented by $In_2SnO_5(ZnO)_n$ (n>0, n is a natural number) may be used.

For example, an In—Ga—Zn-based oxide with an atomic ratio where In:Ga:Zn=1:1:1, In:Ga:Zn=3:1:2, or In:Ga:Zn=2:1:3, or an oxide having a composition in the neighborhood of the above composition can be used.

Further, the oxide semiconductor film 106 can be formed by a sputtering method, an atomic layer deposition (ALD) method, an evaporation method, a coating method, or the like. The thickness of the oxide semiconductor film 106 is greater than 5 nm and less than or equal to 200 nm, preferably greater than or equal to 10 nm and less than or equal to 30 nm. Further, the oxide semiconductor film 106 preferably has a structure with crystallinity, such as a single crystal structure, a polycrystalline (also referred to as poly crystal) structure, or a microcrystalline structure.

Further, the oxide semiconductor film 106 is preferably a CAAC-OS (c-axis aligned crystalline oxide semiconductor) film. The CAAC-OS film is not completely single crystal nor completely amorphous. The CAAC-OS film is an oxide semiconductor film with a crystal-amorphous mixed phase structure where crystal portions are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing treatment for crystallization such as heat treatment after film formation.

With the use of the CAAC-OS film in a transistor, change in electrical characteristics of the transistor due to irradiation with visible light or ultraviolet light can be reduced. Change and variation in threshold voltages can be suppressed. Thus, the transistor has high reliability.

In an oxide semiconductor film having a crystal portion or an oxide semiconductor film having crystallinity, defects in the bulk can be further reduced. Further, when the surface planarity of the oxide semiconductor film having a crystal portion or the oxide semiconductor film having crystallinity is enhanced, a transistor including the oxide semiconductor can have higher field-effect mobility than a transistor including an amorphous oxide semiconductor. In order to enhance the surface planarity of the oxide semiconductor film, the oxide semiconductor is preferably formed over a flat surface. Specifically, the oxide semiconductor is preferably formed over a surface with an average surface roughness (Ra) less than or equal to 0.15 nm, preferably less than or equal to 0.1 nm.

Note that Ra is obtained by expanding, into three dimensions, arithmetic mean surface roughness that is defined by JIS B 0601: 2001 (ISO4287:1997) so as to be able to apply it to a curved surface. Ra can be expressed as an "average value of the absolute values of deviations from a reference surface to a specific surface" and is defined by Formula 1.

$$Ra = \frac{1}{S_0} \int_{y_1}^{y_2} \int_{x_1}^{x_2} |f(x, y) - Z_0| dxdy \qquad \text{[Formula 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

There are three methods for forming a CAAC-OS film when the CAAC-OS film is used as the oxide semiconductor film 106. The first method is to form an oxide semiconductor film at a temperature higher than or equal to 200° C. and lower than or equal to 450° C. to form, in the oxide semiconductor film, crystal portions in which the c-axes are aligned in the direction parallel to a normal vector of a surface where the oxide semiconductor film is formed or a normal vector of a surface of the oxide semiconductor film. The second method is to form an oxide semiconductor film with a small thickness and then heat it at a temperature higher than or equal to 200° C. and lower than or equal to 700° C., to form, in the oxide semiconductor film, crystal portions in which the c-axes are aligned in the direction parallel to a normal vector of a surface where the oxide semiconductor film is formed or a normal vector of a surface of the oxide semiconductor film. The third method is to form a first oxide semiconductor film with a small thickness, then heat it at a temperature higher than or equal to 200° C. and lower than or equal to 700° C., and form a second oxide semiconductor film, to form, in the oxide semiconductor film, crystal portions in which the c-axes are aligned in the direction parallel to a normal vector of a surface where the oxide semiconductor film is formed or a normal vector of a surface of the oxide semiconductor film.

The oxide semiconductor film 106 is deposited while the substrate 102 is heated, whereby the concentration of an impurity such as hydrogen or water in the oxide semiconductor film 106 can be reduced. In addition, damage by sputtering can be reduced, which is preferable. The oxide semiconductor film 106 may be formed by an ALD method, an evaporation method, a coating method, or the like.

Note that when an oxide semiconductor film having crystallinity (single crystal or microcrystalline) other than a CAAC-OS film is formed as the oxide semiconductor film 106, there is no particular limitation on the deposition temperature.

The energy gap of the oxide semiconductor film 106 is preferably 2.8 eV to 3.2 eV, and is greater than that of silicon (1.1 eV). The minority carrier density of the oxide semiconductor film 106 is, for example, $10^{-9}/cm^3$, which is much smaller than the intrinsic carrier density of silicon ($10^{11}/cm^3$).

Majority carriers (electrons) of the oxide semiconductor film 106 are only carriers flowing from a source of a transistor. Further, a channel formation region can be depleted completely. Thus, an off-state current of the transistor can be extremely small. The off-state current of the transistor including the oxide semiconductor film 106 is 10 yA/µm or smaller at room temperature and is 1 zA/µm or smaller at 85° C. to 95° C., which is preferably small In the case of an n-channel transistor, the off-state current in this specification is current that flows between a source electrode and a drain electrode when the potential of a gate electrode is lower than or equal to 0 V with the potential of the source electrode as a reference potential while the potential of the drain electrode is higher than those of the source electrode and the gate electrode. Alternatively, in the case of a p-channel transistor, the off-state current in this specification is current that flows between a source electrode and a drain electrode when the potential of a gate electrode is higher than or equal to 0 V with the potential of the source electrode as a reference potential while the potential of the drain electrode is lower than those of the source electrode and the gate electrode.

Further, the subthreshold swing (S value) of the transistor including the oxide semiconductor film 106 is small. Further, the transistor has high reliability.

Note that the oxide semiconductor film 106 may have a structure in which a plurality of oxide semiconductor films is stacked. For example, the oxide semiconductor film 106 may have a stacked-layer structure of a first oxide semiconductor layer and a second oxide semiconductor layer which are formed using metal oxides with different compositions. For example, the first oxide semiconductor layer may be formed using a three-component metal oxide, and the second oxide semiconductor layer may be formed using a two-component metal oxide. Alternatively, for example, both the first oxide semiconductor layer and the second oxide semiconductor layer may be formed using three-component metal oxides.

Further, the constituent elements of the first oxide semiconductor layer and the second oxide semiconductor layer are made to be the same and the composition ratio of the constituent elements of the first oxide semiconductor layer and the second oxide semiconductor layer may be made to be different. For example, the first oxide semiconductor layer may have an atomic ratio of In:Ga:Zn=1:1:1 and the second oxide semiconductor layer may have an atomic ratio of In:Ga:Zn=3:1:2. Alternatively, the first oxide semiconductor layer may have an atomic ratio of In:Ga:Zn=1:3:2 and the second oxide semiconductor layer may have an atomic ratio of In:Ga:Zn=2:1:3.

At this time, one of the first oxide semiconductor layer and the second oxide semiconductor layer, which is closer to the gate electrode (on a channel side), preferably contains In and Ga at a proportion of In>Ga. The other which is farther from the gate electrode (on a back channel side) preferably contains In and Ga at a proportion of In≤Ga. In an oxide semiconductor, the s orbital of heavy metal mainly contributes to carrier conduction, and when the percentage of In content in the oxide semiconductor is increased, overlap of the s orbital is likely to be increased. Therefore, an oxide having a composition of In>Ga has higher mobility than an oxide having a composition of In≤Ga. Further, in Ga, the formation energy of oxygen vacancy is larger and thus oxygen vacancy is less likely to occur, than in In; therefore, the oxide having a composition of In≤Ga has more stable characteristics than the oxide having a composition of In>Ga. Accordingly, an oxide semiconductor containing In and Ga at a proportion of In>Ga is used on a channel side, and an oxide semiconductor containing In and Ga at a proportion of In≤Ga is used on a back channel side, so that mobility and reliability of the transistor can be further improved.

Further, when the oxide semiconductor film 106 is formed to have a stacked structure, the first oxide semiconductor layer and the second oxide semiconductor layer may be formed using oxide semiconductor layers having different crystallinity. That is, the oxide semiconductor film 106 may be formed by combining a single crystal oxide semiconductor, a polycrystalline oxide semiconductor, an amorphous oxide semiconductor, and an oxide semiconductor having crystallinity (e.g., a CAAC-OS) as appropriate. When an amorphous oxide semiconductor is applied to at least either the first oxide semiconductor layer or the second oxide semiconductor layer, internal stress or external stress of the oxide semiconductor film is relieved, variation in characteristics of a transistor is reduced, and reliability of the transistor can be further improved. On the other hand, an amorphous oxide semiconductor easily absorbs an impurity such as hydrogen, which serves as a donor, and oxygen deficiency is easily generated; therefore, the amorphous oxide semiconductor film is likely to be n-type. Accordingly, an oxide semiconductor having crystallinity (e.g., a CAAC-OS) is preferably used as the oxide semiconductor layer on a channel side.

As for the composition and crystallinity of the oxide semiconductor film 106 in the case where the oxide semiconductor film 106 has a stacked structure, for example, a stacked structure of an amorphous oxide semiconductor with an atomic ratio in the neighborhood of In:Ga:Zn=1:1:1 and a crystalline oxide semiconductor with an atomic ratio in the neighborhood of In:Ga:Zn=3:1:2 from the oxide film 104 side, and a stacked structure of a crystalline oxide semiconductor with an atomic ratio in the neighborhood of In:Ga:Zn=1:1:1 and a crystalline oxide semiconductor with an atomic ratio in the neighborhood of In:Ga:Zn=3:1:2 from the oxide film 104 side are given. With such a structure, crystallinity of the oxide semiconductor film 106 in the vicinity of the gate insulating film 108 can be improved, and mobility can be increased because the percentage of indium content in the oxide semiconductor in the vicinity of the gate insulating film 108 is larger than that in the oxide semiconductor on the oxide film 104 side. As another stacked structure, a stacked structure of a crystalline oxide semiconductor with an atomic ratio in the neighborhood of In:Ga:Zn=3:1:2 and a crystalline oxide semiconductor with an atomic ratio in the neighborhood of In:Ga:Zn=1:1:1 may be used. With such a structure, crystallinity of the oxide semiconductor in the vicinity of the gate insulating film 108 can be improved. Further, as another stacked structure, a stacked structure of an amorphous oxide semiconductor with an atomic ratio in the neighborhood of In:Ga:Zn=1:1:1 and an amorphous oxide semiconductor with an atomic ratio in the neighborhood of In:Ga:Zn=3:1:2, or a stacked structure of an amorphous oxide semiconductor with an atomic ratio in the neighborhood of In:Ga:Zn=3:1:2 and an amorphous oxide semiconductor with an atomic ratio in the neighborhood of In:Ga:Zn=1:1:1 may be used. With such a structure, a constituent element of the oxide film 104 can be prevented from entering the oxide semiconductor film 106 in the vicinity of the gate insulating film 108.

Further, in the oxide semiconductor film 106, it is preferable that the channel formation region 106a be an oxide semiconductor having crystallinity (e.g., a CAAC-OS) and the low-resistance regions 106c be an amorphous oxide semiconductor. For example, after the oxide semiconductor film 106 including the channel formation region 106a is formed using a CAAC-OS film, the low-resistance regions 106c are made to be n-type or amorphous because the crystal structure of the CAAC-OS film cannot be maintained, by reaction with a metal film, doping treatment, or the like.

[Detailed Description of First Gate Insulating Film]

Silicon oxide, gallium oxide, silicon oxynitride, or the like can be used for the first gate insulating film 108a. It is preferable that the first gate insulating film 108a include oxygen in a portion which is in contact with the oxide semiconductor film 106. In particular, the first gate insulating film 108a preferably contains oxygen at an amount that exceeds at least the stoichiometry. For example, in the case where a silicon oxide film is used as the first gate insulating film 108a, a film of $SiO_{2+\alpha}$ ($\alpha>0$) is preferably used. With the use of the silicon oxide film as the first gate insulating film 108a, oxygen can be supplied to the oxide semiconductor film 106 and favorable electric characteristics can be obtained.

The first gate insulating film 108a can have a thickness greater than or equal to 1 nm and less than or equal to 500 nm, for example. There is no particular limitation on a method for forming the first gate insulating film 108a; for example, a sputtering method, an MBE method, a PE-CVD method, a pulse laser deposition method, an ALD method, or the like can be used as appropriate.

[Detailed Description of Second Gate Insulating Film]

Aluminum oxide, silicon nitride, aluminum oxynitride, silicon nitride oxide, or the like can be used for the second gate insulating film 108b. The second gate insulating film 108b is preferably a film which can prevent oxygen from being released from the first gate insulating film 108a. The second gate insulating film 108b can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide. By using such a material, gate leakage current can be reduced.

As described in this embodiment, the gate insulating film 108 preferably has a stacked structure of the first gate insulating film 108a and the second gate insulating film 108b. Note that the structure of the gate insulating film 108 is not limited thereto and may have a single-layer structure or a stacked structure of three or more layers.

The second gate insulating film 108b can have a thickness greater than or equal to 1 nm and less than or equal to 500 nm, for example. There is no particular limitation on a method for forming the second gate insulating film 108b; for example, a sputtering method, an MBE method, a PE-CVD method, a pulse laser deposition method, an ALD method, or the like can be used as appropriate.

[Detailed Description of Gate Electrode]

For the gate electrode 110, it is possible to use a metal material such as molybdenum, titanium, tantalum, tungsten, aluminum, copper, neodymium, or scandium, or an alloy material containing any of these materials, for example. Alternatively, the gate electrode 110 may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials containing silicon or silicon oxide can be used. The gate electrode 110 can be formed to have a single-layer structure or a stacked structure using any of the above materials. There is no particular limitation on a method for forming the gate electrode 110, and a variety of deposition methods such as an evaporation method, a PE-CVD method, a sputtering method, and a spin coating method can be employed.

[Detailed Description of Metal Oxide Insulating Film]

A material containing one or more elements selected from aluminum, indium, titanium, tin, tungsten, and zinc can be used for the metal oxide insulating films 114. For example, when aluminum or titanium is used for a metal film and reacts with the oxide semiconductor film 106, aluminum oxide or titanium oxide can be formed. The thickness of the metal oxide insulating films 114 can be greater than or equal to 1 nm and less than or equal to 100 nm, preferably greater than or equal to 1 nm and less than or equal to 10 nm, more preferably greater than or equal to 2 nm and less than or equal to 5 nm. There is no particular limitation on a method for forming the metal oxide insulating films 114; for example, a sputtering method, an MBE method, a PE-CVD method, a pulse laser deposition method, an ALD method, or the like can be used as appropriate.

[Detailed Description of Sidewall Insulating Film]

The sidewall insulating films 112 are preferably formed using a material which does not react with the metal film to be formed later by heat treatment. For example, a single layer or a stacked layer using any of nitrides such as silicon nitride, aluminum nitride, and gallium nitride can be used. There is no particular limitation on a method for forming the sidewall insulating films 112, and a variety of film formation methods such as an evaporation method, a PE-CVD method, a sputtering method, and a spin coating method can be used.
[Detailed Description of Protective Insulating Film]

The protective insulating film 116 is preferably formed using an inorganic insulating film and may be formed as a single layer or a stacked layer using any of oxide insulating films such as a silicon oxide film, a silicon oxynitride film, an aluminum oxide film, an aluminum oxynitride film, a gallium oxide film, and a hafnium oxide film. Further, over the above oxide insulating film, a single layer or a stacked layer using any of nitride insulating films such as a silicon nitride film, a silicon nitride oxide film, an aluminum nitride film, and an aluminum nitride oxide film may be formed. For example, as a stacked layer, a silicon oxide film and an aluminum oxide film can be formed in this order over the gate electrode 110 by a sputtering method. There is no particular limitation on a method for forming the protective insulating film 116; for example, a sputtering method, an MBE method, a PE-CVD method, a pulse laser deposition method, an ALD method, or the like can be employed as appropriate.

Alternatively, in particular, a dense inorganic insulating film is preferably formed as the protective insulating film 116. For example, an aluminum oxide film can be formed by a sputtering method. By forming an aluminum oxide film having high density (a film density of 3.2 $g/cm^3$ or higher, preferably 3.6 $g/cm^3$ or higher), a shielding effect (blocking effect) of preventing the protective insulating film 116 from transmitting both oxygen and an impurity such as hydrogen or moisture which might enter the oxide semiconductor film 106 can be obtained. Therefore, in and after the manufacturing process, the aluminum oxide film functions as a protective film to prevent an impurity such as hydrogen or moisture, which causes a change of the oxide semiconductor film 106, from being mixed into the oxide semiconductor film 106 and to prevent oxygen from being released, which is a main constituent material of the oxide semiconductor film 106. Note that the film density can be measured by Rutherford backscattering spectrometry (RBS) or X-ray reflection (XRR).

[Detailed Description of Interlayer Insulating Film]

The interlayer insulating film 118 is preferably formed using an inorganic insulating film and may be formed as a single layer or a stacked layer using any of a silicon oxide film, a silicon oxynitride film, a silicon nitride film, and a silicon nitride oxide film. There is no particular limitation on a method for forming the interlayer insulating film 118; for example, a sputtering method, an MBE method, a PE-CVD method, a pulse laser deposition method, an ALD method, or the like can be employed as appropriate.

[Detailed Description of Source Electrode and Drain Electrode]

As the source electrode 120a and the drain electrode 120b, for example, a metal film containing an element selected from aluminum, chromium, copper, tantalum, titanium, molybdenum, and tungsten can be used. Alternatively, the source electrode 120a and the drain electrode 120b may have a structure in which a film of a high-melting-point metal such as titanium, molybdenum, or tungsten, or a nitride film of any of these metals (e.g., a titanium nitride film, a molybdenum nitride film, or a tungsten nitride film) is stacked on either or both of the bottom surface and the top surface of a metal film of aluminum, copper, or the like. Further, a conductive film used for the source electrode 120a and the drain electrode 120b may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, abbreviated to ITO), or indium zinc oxide ($In_2O_3$—ZnO) can be used. The conductive film used for the source electrode and the drain electrode can be formed with a single-layer structure or a stacked structure using any of the above materials. There is no particular limitation on a method for forming the conductive film, and a variety of deposition methods such as an evaporation method, a PE-CVD method, a sputtering method, and a spin coating method can be employed.

Note that details of the other components will be described in <Method 1 for Manufacturing Semiconductor Device> below, with reference to FIGS. 2A to 2E, FIGS. 3A to 3E, and FIGS. 4A to 4D.

<Method 1 for Manufacturing Semiconductor Device>

An example of a method for manufacturing the semiconductor device illustrated in FIGS. 1A and 1B of this embodiment will be described below with reference to FIGS. 2A to 2E, FIGS. 3A to 3E, and FIGS. 4A to 4D.

Figure 2A:
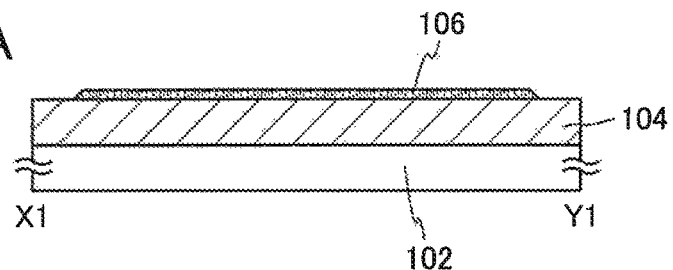
FIGS. 2A to 2E are cross-sectional views illustrating an example of a manufacturing process of a semiconductor device.

First, the substrate 102 is prepared, and then the oxide film 104 and the oxide semiconductor film 106 including a channel formation region are formed over the substrate 102 (see FIG. 2A).

The substrate 102 may be subjected to plasma treatment or the like before the oxide film 104 is formed. As plasma treatment, reverse sputtering in which an argon gas is introduced and plasma is generated can be performed. The reverse sputtering refers to a method in which an RF power source is used for application of voltage to the substrate 102 side in an argon atmosphere so that plasma is generated in the vicinity of the substrate 102 to modify a surface of the substrate. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the substrate 102.

The oxide semiconductor film 106 can be formed by a wet etching method or a dry etching method. An etching gas such as $BCl_3$, $Cl_2$, or $O_2$ can be used in the dry etching method. Further, a dry etching apparatus using a high-density plasma source such as electron cyclotron resonance (ECR) or inductive coupled plasma (ICP) can be used to improve a dry etching rate. An end portion of the oxide semiconductor film 106 is preferably tapered at an angle of 20° to 50°.

The oxide film 104 and the oxide semiconductor film 106 are preferably formed successively without exposure to the air because an impurity element such as moisture or hydrogen contained in the air can be prevented from entering the interface between the oxide film 104 and the oxide semiconductor film 106.

In a formation step of the oxide semiconductor film 106, it is preferable that hydrogen or water be contained in the oxide semiconductor film 106 as little as possible. For example, it is preferable that the substrate 102 over which the oxide film 104 is already formed be preheated in a preheating chamber of a sputtering apparatus as pretreatment for formation of the oxide semiconductor film 106 so that impurities such as hydrogen and moisture adsorbed to the substrate 102 and the oxide film 104 are removed and exhausted. Note that the temperature of the preheating is preferably set such that no oxygen, or little oxygen, if any, is released from the oxide film 104. Further, the oxide semiconductor film 106 is preferably formed in a deposition chamber from which remaining moisture has been exhausted.

To remove the moisture in a preheating chamber and the deposition chamber, an entrapment vacuum pump, for example, a cryopump, an ion pump, or a titanium sublimation pump is preferably used. Further, an exhaustion unit may be a turbo pump provided with a cold trap. From the preheating chamber and the deposition chamber which are evacuated with a cryopump, a hydrogen atom, a compound containing a hydrogen atom such as water ($H_2O$) (more preferably, also a compound containing a carbon atom), and the like are removed, whereby the concentration of an impurity such as hydrogen or moisture in the oxide semiconductor film 106 can be reduced.

In this embodiment, the oxide semiconductor film 106 is formed by a sputtering method using a metal oxide target having an atomic ratio of In:Ga:Zn=1:1:1 or a metal oxide target having an atomic ratio of In:Ga=2:1. Note that the target used for forming the oxide semiconductor film 106 is not limited to the targets including the above materials and having the above ratios. The oxide semiconductor film 106 can be formed by a sputtering method in a rare gas (typically argon) atmosphere, an oxygen atmosphere, or a mixed atmosphere of a rare gas and oxygen. The target used for forming the oxide semiconductor film 106 preferably has crystallinity; that is, a single crystal target, a polycrystalline target, or the like is preferably used. With the use of the target having crystallinity, a formed thin film also has crystallinity. In particular, the formed thin film tends to have a c-axis-aligned crystal.

In addition, shortly after the oxide semiconductor film 106 is deposited, it is preferable that the oxide semiconductor film contain oxygen at an amount that exceeds the stoichiometry, i.e., the oxide semiconductor films be supersaturated. As an example, in the case where the oxide semiconductor film 106 is deposited by a sputtering method, the deposition is preferably performed under the condition where the proportion of oxygen in a deposition gas is large, and in particular, the deposition is preferably performed in an oxygen atmosphere (an oxygen gas: 100%). For example, in the case where an In—Ga—Zn-based oxide (IGZO) is to be used for the oxide semiconductor film 106 and the deposition is performed under the condition where the proportion of oxygen in the deposition gas is large (in particular, in an atmosphere of an oxygen gas of 100%), Zn release from the film can be suppressed even when the deposition temperature is 300° C. or higher.

Further, when the oxide semiconductor film 106 is formed using the metal oxide target with an atomic ratio of In:Ga:Zn=1:1:1, the composition of the thin film formed over the substrate is different from that of the target in some cases. For example, when the metal oxide target with an atomic ratio of In:Ga:Zn=1:1:1 is used, the composition of the oxide semiconductor film 106, which is a thin film, becomes In:Ga:Zn=1:1:0.6 to 1:1:0.8 [atomic ratio] in some cases, although it depends on the deposition conditions. This is because in deposition of the oxide semiconductor film 106, Zn is sublimed, or because a sputtering rate differs between the components of In, Ga, and Zn.

Accordingly, in order to form a thin film having a desired composition ratio, the composition of the metal oxide target needs to be adjusted in advance. For example, in order to make the composition of the oxide semiconductor film 106, which is a thin film, be In:Ga:Zn=1:1:1 [atomic ratio], the composition of the metal oxide target is preferably In:Ga:Zn=1:1:1.5 [atomic ratio]. In other words, the percentage of Zn content in the metal oxide target is preferably made higher in advance. The composition of the target is not limited to the above value, and can be adjusted as appropriate depending on the deposition conditions or the composition of the thin film to be formed. Further, it is preferable to increase the percentage of Zn content in the metal oxide target because in that case, the obtained thin film can have higher crystallinity.

The relative density of the metal oxide target is higher than or equal to 90% and lower than or equal to 100%, preferably higher than or equal to 95%, more preferably higher than or equal to 99.9%. With the use of a metal oxide target with a high relative density, the formed oxide semiconductor film 106 can be dense.

As a sputtering gas used for depositing the oxide semiconductor film 106, it is preferable to use a high-purity gas from which an impurity such as hydrogen, water, a hydroxyl group, or hydride is removed.

After the oxide semiconductor film 106 is formed, the oxide semiconductor film 106 may be subjected to heat treatment. The temperature of the heat treatment is higher than or equal to 300° C. and lower than or equal to 700° C., or lower than the strain point of the substrate. The heat treatment can remove excess hydrogen (including water and a hydroxyl group) from the oxide semiconductor film 106. Note that the heat treatment is also referred to as dehydration treatment (dehydrogenation treatment) in this specification and the like in some cases.

The heat treatment can be performed in such a manner that, for example, an object to be processed is introduced into an electric furnace in which a resistance heater or the like is used and heated at 450° C. in a nitrogen atmosphere for one hour. The oxide semiconductor film 106 is not exposed to the air during the heat treatment so that the entry of water and hydrogen can be prevented.

A heat treatment apparatus is not limited to the electric furnace and may be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

As the heat treatment, for example, a GRTA process may be performed as follows. The object is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be switched to a gas containing oxygen during the process.

Note that as the inert gas atmosphere, an atmosphere that contains nitrogen or a rare gas (e.g., helium, neon, or argon) as its main component and does not contain water, hydrogen, or the like is preferably used. The purity of nitrogen or a rare gas such as helium, neon, or argon introduced into a heat treatment apparatus is, for example, 6N (99.9999%) or higher, preferably 7N (99.99999%) or higher (that is, the concentration of an impurity is 1 ppm or lower, preferably 0.1 ppm or lower).

The dehydration treatment (dehydrogenation treatment) might be accompanied by release of oxygen which is a main constituent material of the oxide semiconductor film 106 to lead to a reduction in oxygen. Oxygen deficiency exists in a portion where oxygen is released in the oxide semiconductor film 106, and a donor level which leads to a change in the electrical characteristics of a transistor is formed owing to the oxygen deficiency. Therefore, in the case where the dehydration treatment (dehydrogenation treatment) is performed, oxygen is preferably supplied to the oxide semiconductor film 106. By supply of oxygen to the oxide semiconductor film 106, oxygen deficiency in the oxide semiconductor film 106 can be repaired.

The oxygen deficiency in the oxide semiconductor film 106 may be repaired in the following manner for example: after the oxide semiconductor film 106 is subjected to the dehydration treatment (dehydrogenation treatment), a high-purity oxygen gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) is introduced into the same furnace. It is preferable that water, hydrogen, or the like not be contained in the oxygen gas or the nitrous oxide gas. The purity of the oxygen gas or the nitrous oxide gas which is introduced into the heat treatment apparatus is preferably 6N (99.9999%) or higher, more preferably 7N (99.99999%) or higher (i.e., the impurity concentration in the oxygen gas or the nitrous oxide gas is preferably 1 ppm or lower, more preferably 0.1 ppm or lower).

As an example of a method for supplying oxygen to the oxide semiconductor film 106, oxygen (including at least any one of oxygen radicals, oxygen atoms, and oxygen ions) may be added to the oxide semiconductor film 106 in order to supply oxygen to the oxide semiconductor film 106. An ion implantation method, an ion doping method, a plasma immersion ion implantation method, plasma treatment, or the like can be employed as a method for adding oxygen.

As another example of a method for supplying oxygen to the oxide semiconductor film 106, oxygen may be supplied to the oxide semiconductor film 106 in such a manner that the oxide film 104, the gate insulating film 108 to be formed later, or the like is heated and part of oxygen is released. In particular, in this embodiment, oxygen that is released from the oxide film 104 is preferably supplied to the oxide semiconductor film 106.

As described above, after the oxide semiconductor film 106 is formed, it is preferable that the dehydration treatment (dehydrogenation treatment) be performed to remove hydrogen or moisture from the oxide semiconductor film 106, so that the oxide semiconductor film 106 is highly purified so as to include as few impurities as possible, and oxygen whose amount is reduced in the dehydration treatment (dehydrogenation treatment) be added to the oxide semiconductor film 106 or oxygen be supplied to repair oxygen deficiency in the oxide semiconductor film 106. In this specification and the like, supplying oxygen to the oxide semiconductor film 106 may be expressed as oxygen adding treatment. Alternatively, making the oxide semiconductor film 106 contain oxygen at an amount that exceeds the stoichiometry may be expressed as treatment for making an oxygen-excess state.

Note that the case is described where dehydration treatment (dehydrogenation treatment) and oxygen adding treatment are performed after the oxide semiconductor film 106 is processed into an island shape; however, an embodiment of the disclosed invention is not construed as being limited to the case. Such treatment may be performed before the oxide semiconductor film 106 is processed into an island shape. Alternatively, after the interlayer insulating film 118 is formed, which is to be formed later, heat treatment may be performed so that oxygen is supplied from the oxide film 104, the gate insulating film 108, or the like to the oxide semiconductor film 106.

In this manner, hydrogen or moisture is removed from the oxide semiconductor film 106 by the dehydration treatment (dehydrogenation treatment) and oxygen deficiency therein are repaired by the oxygen adding treatment, whereby the oxide semiconductor film can be an i-type (intrinsic) or substantially i-type oxide semiconductor film. The oxide semiconductor film formed in such a manner contains extremely few (close to zero) carriers derived from a donor, and the carrier concentration thereof is lower than $1\times10^{14}/cm^3$, preferably lower than $1\times10^{12}/cm^3$, more preferably lower than $1\times10^{11}/cm^3$.

It is preferable that the oxide semiconductor film 106 be highly purified and hardly contain an impurity such as copper, aluminum, or chlorine. In a process for manufacturing a transistor, it is preferable to select steps as appropriate where such an impurity might not be mixed into the oxide semiconductor film 106 or be attached onto a surface thereof. In the case where such an impurity is attached onto the surface of the oxide semiconductor film 106, the oxide semiconductor film 106 is preferably exposed to oxalic acid, dilute hydrofluoric acid, or the like or subjected to plasma (e.g., $N_2O$ plasma) treatment, for example, so that the impurity on the surface of the oxide semiconductor film 106 can be removed. Specifically, the oxide semiconductor film 106 has a copper concentration of $1\times10^{18}$ atoms/cm$^3$ or lower, preferably $1\times10^{17}$ atoms/cm$^3$ or lower, an aluminum concentration of $1\times10^{18}$ atoms/cm$^3$ or lower, and a chlorine concentration of $2\times10^{18}$ atoms/cm$^3$ or lower.

The oxide semiconductor film 106 is preferably highly purified by sufficient removal of an impurity such as hydrogen or sufficient supply of oxygen so as to be supersaturated with oxygen. Specifically, the oxide semiconductor film 106 has a hydrogen concentration of $5\times10^{19}$ atoms/cm$^3$ or lower, preferably $5\times10^{18}$ atoms/cm$^3$ or lower, more preferably $5\times10^{17}$ atoms/cm$^3$ or lower. Note that the concentration of hydrogen in the oxide semiconductor film 106 is measured by secondary ion mass spectrometry (SIMS). In order that the oxide semiconductor film 106 is supersaturated with oxygen by sufficient supply of oxygen, it is preferable that an insulating film containing excess oxygen (e.g., a silicon oxide film) be provided so as to cover and be in contact with the oxide semiconductor film 106.

As the insulating film containing excess oxygen, a silicon oxide film or a silicon oxynitride film including a large amount of oxygen by adjusting deposition conditions as appropriate in a PE-CVD method or a sputtering method is used. To make excess oxygen be further contained in the insulating film, oxygen is added to the insulating film by an ion implantation method, an ion doping method, or plasma treatment.

Further, in the case where the hydrogen concentration in the insulating film containing excess oxygen is $7.2\times10^{20}$ atoms/cm$^3$ or higher, variations in initial characteristics of transistors are increased, a channel length dependence of electrical characteristics of a transistor is increased, and a transistor is significantly degraded in the BT stress test; therefore, the hydrogen concentration in the insulating film containing excess oxygen is set to lower than $7.2\times10^{20}$ atoms/cm$^3$. In other words, the hydrogen concentration in the oxide semiconductor film 106 is preferably lower than or equal to $5\times10^{19}$ atoms/cm$^3$, and the hydrogen concentration in the insulating film containing excess oxygen is preferably lower than $7.2\times10^{20}$ atoms/cm$^3$.

Further, a blocking film (e.g., an aluminum oxide film) that suppresses oxygen release from the oxide semiconductor film 106 is preferably formed to cover the oxide semiconductor film 106 and to be provided outside the insulating film containing excess oxygen.

The oxide semiconductor film 106 is covered with the insulating film containing excess oxygen or the blocking film, so that the oxide semiconductor film 106 can be in a state in which oxygen the amount of which is approximately the same as the stoichiometry is contained or in a supersaturated state in which oxygen which exceeds the stoichiometry is contained.

Figure 2B:
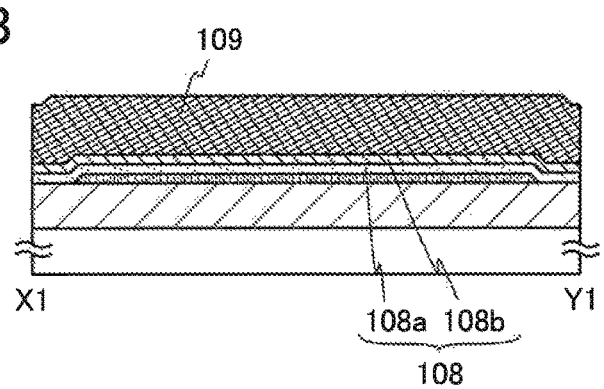
Figure 2C:
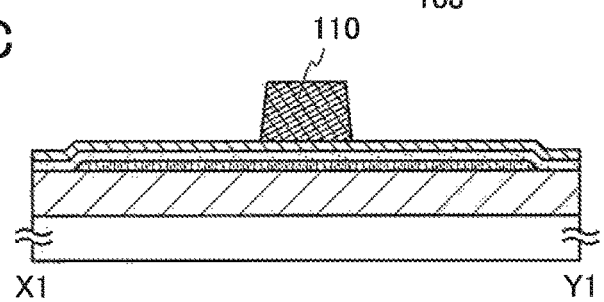
Figure 2D:
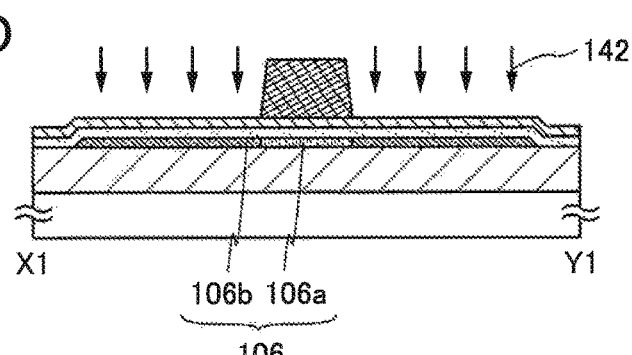

Next, the gate insulating film 108 (the first gate insulating film 108a and the second gate insulating film 108b), and a conductive film 109 are formed over the oxide semiconductor film 106 (see FIG. 2B).

Next, a resist mask is formed over the conductive film 109 through a photolithography step, selective etching is performed to form the gate electrode 110, and then the resist mask is removed. Thus, a stack of the gate insulating film 108 and the gate electrode 110 is formed over the oxide semiconductor film 106 (see FIG. 2C).

Note that the resist mask for forming the gate electrode 110 may be formed by an inkjet method, in which case manufacturing costs can be reduced because a photomask is not used. The gate electrode 110 may be etched by either dry etching or wet etching, or by both of them.

Next, with the use of the gate electrode 110 as a mask, dopant 142 is selectively introduced into the oxide semiconductor film 106 through the gate insulating film 108 (the first gate insulating film 108a and the second gate insulating film 108b). In the introduction of the dopant 142, the gate electrode 110 serves as a mask, so that the channel formation region 106a is formed in a region of the oxide semiconductor film 106, which overlaps with the gate electrode 110, and the impurity regions 106b are formed in regions into which the dopant 142 is introduced (see FIG. 2D).

The dopant 142 is an impurity that changes the conductivity of the oxide semiconductor film 106. One or more selected from the following can be used as the dopant 142: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

The dopant 142 can be introduced into the oxide semiconductor film 106 through another film (e.g., the gate insulating film 108) by an implantation method. As the method for introducing the dopant 142, an ion implantation method, an ion doping method, a plasma immersion ion implantation method, or the like can be used. In that case, it is preferable to use a single ion of the dopant 142, or a fluoride ion or chloride ion thereof The introduction of the dopant 142 may be controlled by setting as appropriate the implantation conditions such as the acceleration voltage and the dosage, or the thickness of the film through which the dopant passes. In this embodiment, phosphorus is used as the dopant 142, whose ion is implanted by an ion implantation method. Note that the dosage of the dopant 142 may be greater than or equal to $1\times10^{13}$ ions/cm$^2$ and less than or equal to $5\times10^{16}$ ions/cm$^2$.

The concentration of the dopant 142 in the impurity regions 106b is preferably higher than or equal to $5\times10^{18}$/cm$^3$ and lower than or equal to $1\times10^{22}$/cm$^3$.

The dopant 142 may be introduced while the substrate 102 is heated.

The introduction of the dopant 142 into the oxide semiconductor film 106 may be performed plural times, and the number of kinds of dopant may be plural.

In the case where the oxide semiconductor film 106 is formed using an oxide semiconductor having crystallinity (e.g., a CAAC-OS), the impurity regions 106b preferably become an amorphous oxide semiconductor by the introduction of the dopant 142. In other words, the channel formation region 106a is an oxide semiconductor film having crystallinity, and the impurity regions 106b are an amorphous oxide semiconductor. In a cross section taken along the channel length direction, the oxide semiconductor film 106 including adjacent regions having different crystal structures in the lateral direction is formed. With such a structure, oxygen deficiency or hydrogen which is an impurity in the channel formation region 106a is extracted to the impurity regions 106b which is an amorphous oxide semiconductor, so that the channel formation region 106a can be further purified.

Figure 2E:
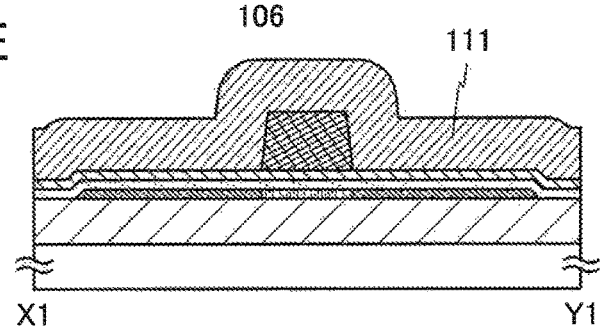

Next, an insulating film 111 is formed over the gate insulating film 108 (specifically, over the second gate insulating film 108b) and the gate electrode 110 (see FIG. 2E).

Then, the insulating film 111 is etched, so that the sidewall insulating films 112 are formed. Thus, the sidewall insulating films 112 are formed on the side surfaces of the gate electrode 110 in a cross section taken along the channel length direction (see FIG. 3A).

The sidewall insulating films 112 can be formed in a self-aligned manner by performing a highly anisotropic etching step on the insulating film 111. As an example of an etching method, a dry etching method is preferably employed. As an etching gas used for dry etching, for example, a gas including fluorine such as trifluoromethane, octafluorocyclobutane, or tetrafluoromethane can be used. A rare gas or hydrogen may be added to the etching gas. As the dry etching method, a reactive ion etching (RIE) method in which high-frequency voltage is applied to a substrate is preferably used.

Note that the sidewall insulating films 112 may be formed in such a manner that a resist mask is formed over the insulating film 111 and etching is performed.

Figure 3A:
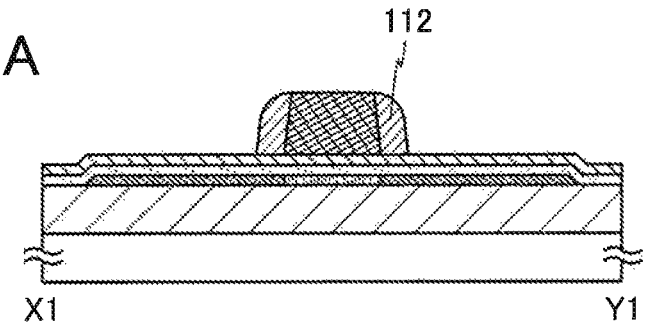
FIGS. 3A to 3E are cross-sectional views illustrating an example of a manufacturing process of a semiconductor device.
Figure 3B:
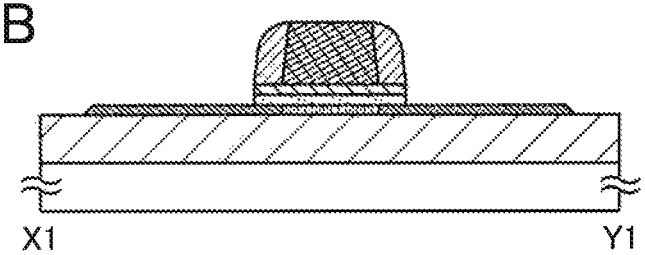
Figure 3C:
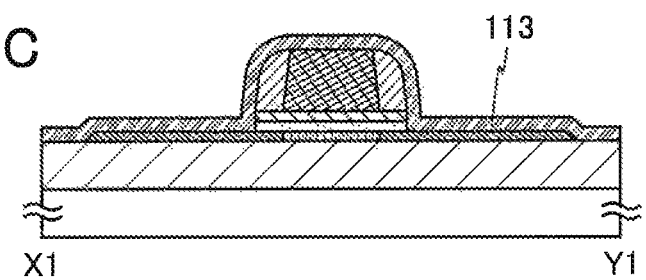
Figure 3D:
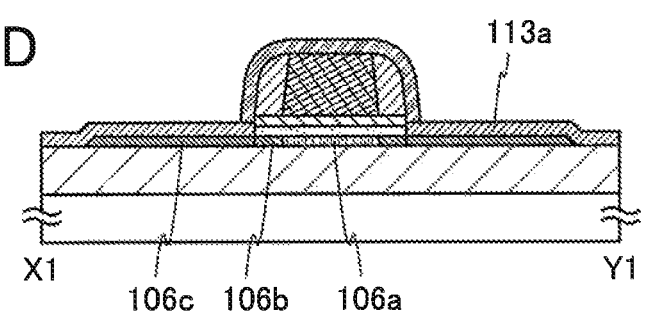
Figure 3E:
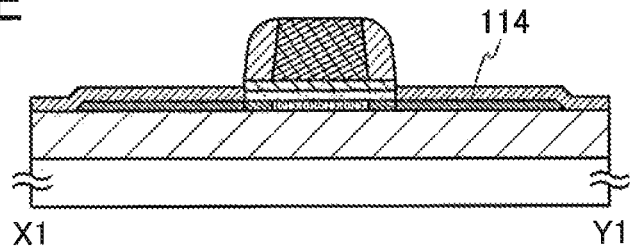

Next, after the formation of the sidewall insulating films 112, part of the gate insulating film 108 is removed with the use of the gate electrode 110 and the sidewall insulating films 112 as masks, so that the surface of the oxide semiconductor film 106 (specifically, part of the impurity regions 106b) is exposed (see FIG. 3B).

Note that the gate insulating film 108 may be processed in the formation of the sidewall insulating films 112.

Next, a metal film 113 is formed over the oxide film 104, the oxide semiconductor film 106, the gate electrode 110, and the sidewall insulating films 112. Thus, the metal film 113 is formed in contact with part of the oxide semiconductor film 106 (see FIG. 3C).

A metal material selected from aluminum, indium, titanium, tin, tungsten, nickel, molybdenum, and zinc can be used for the metal film 113. In this embodiment, an aluminum film with a thickness of 10 nm is formed by a sputtering method.

Next, heat treatment is performed in the state where the metal film 113 and the oxide semiconductor film 106 (specifically, the part of the impurity regions 106b) are in contact with each other, so that the metal element is introduced into the oxide semiconductor film 106 from the metal film 113 and the low-resistance regions 106c including the metal element are formed. Further, oxygen is diffused into the metal film 113 from the oxide film 104 and the oxide semiconductor film 106 by the heat treatment, so that the metal film 113 is selectively oxidized. Thus, metal oxide insulating films 113a are formed. Note that in the oxide semiconductor film 106, the channel formation region 106a is formed under the gate electrode 110, the impurity regions 106b are formed under the sidewall insulating films 112, and the low-resistance regions 106c are formed in contact with the metal oxide insulating films 113a (see FIG. 3D).

The heat treatment is preferably performed at a temperature higher than or equal to 300° C. and lower than or equal to 700° C., more preferably higher than or equal to 300° C. and lower than or equal to 450° C. under an inert gas atmosphere or reduced pressure. The inert gas atmosphere is preferably an atmosphere which contains nitrogen or a rare gas (e.g., helium, neon, or argon) as its main component and does not contain water, hydrogen, or the like. The heat treatment is preferably performed in an atmosphere in which the surface of the metal film 113 is not oxidized by the heat treatment. Further, the heating time can be set as appropriate by a practitioner such that the oxide semiconductor film 106 and the metal film 113 can react with each other.

By such heat treatment, oxidation of the metal film 113 does not proceed from its surface but proceeds from a portion in contact with the oxide film 104 or the oxide semiconductor film 106. Therefore, the metal oxide insulating films 113a can be formed in regions in contact with the oxide film 104 and the oxide semiconductor film 106, and the metal film 113 remains in another region.

Next, the metal film 113 is removed. Thus, the metal oxide insulating films 114 are formed (see FIG. 3E).

For example, in the case where aluminum is used for the metal film, the metal film 113 can be removed by a wet etching method using an etchant such as HCl, $H_2SO_4$, $H_3PO_4$, or $H_2C_2O_4$. However, the method for removing the metal film 113 is not limited thereto. Depending on the materials of the metal film 113 and the metal oxide insulating films 114, a practitioner can select an etchant or an etching method as appropriate as long as etching selectivity is ensured.

Figure 4A:
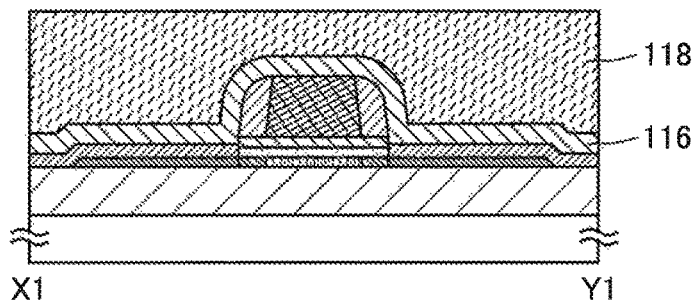
FIGS. 4A to 4D are cross-sectional views illustrating an example of a manufacturing process of a semiconductor device.

Next, the protective insulating film 116 and the interlayer insulating film 118 are formed to cover the oxide film 104, the gate electrode 110, the sidewall insulating films 112, and the metal oxide insulating films 114 (see FIG. 4A).

Figure 4B:
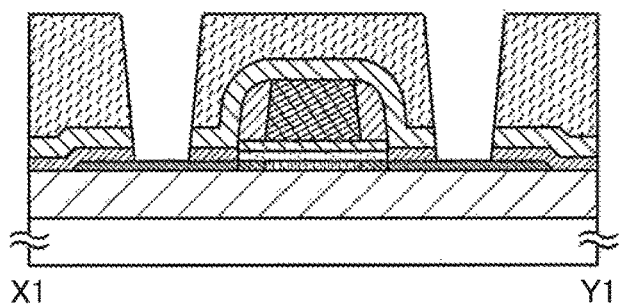

Then, a resist mask is formed in a desired region over the interlayer insulating film 118, and the interlayer insulating film 118, the protective insulating film 116, and the metal oxide insulating films 114 are selectively etched; thus, opening portions reaching the low-resistance regions 106c are formed (see FIG. 4B).

Figure 4C:
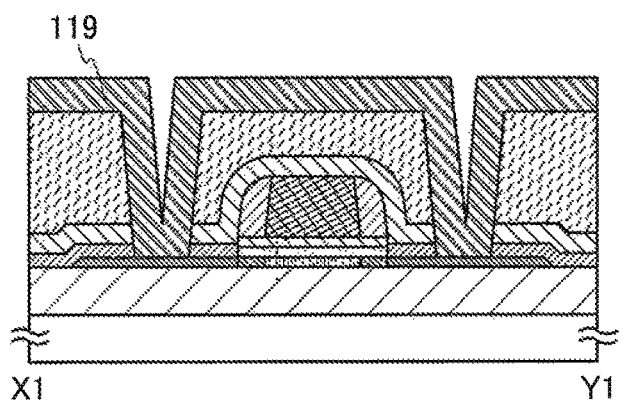

Next, a conductive film 119 is formed over the interlayer insulating film 118 and in the opening portions (see FIG. 4C).

Figure 4D:
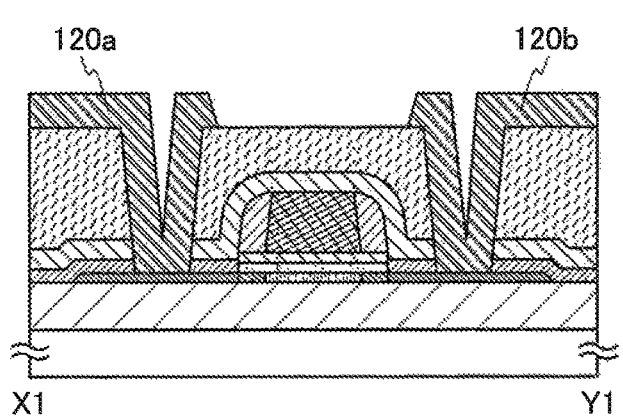

Next, a resist mask is formed in a desired region over the conductive film 119, and the conductive film 119 is selectively etched; thus, the source electrode 120a and the drain electrode 120b are formed (see FIG. 4D).

Through the above manufacturing steps, the semiconductor device shown in FIGS. 1A and 1B can be manufactured.

As described in this embodiment, one of the technical ideas of the present invention is as follows. By reaction between an oxide semiconductor film and a metal film, low-resistance regions are formed in the oxide semiconductor film including a channel formation region in a self-aligned manner and part of the metal film is oxidized to form metal oxide insulating films for covering the low-resistance regions. Then, another part of the metal film, which is not oxidized, is removed. Thus, the metal oxide insulating films can prevent release of oxygen contained in an oxide film and the oxide semiconductor film. Accordingly, oxygen can be favorably supplied to the oxide semiconductor film including the channel formation region from the oxide film, and a transistor with stable electric characteristics can be provided.

The method and structure described in this embodiment can be combined as appropriate with any of the methods and structures described in the other embodiments.

(Embodiment 2)

In this embodiment, a modification example of the semiconductor device described in Embodiment 1, and a method for manufacturing a semiconductor device, which is different from that described in Embodiment 1, will be described with reference to FIGS. 5A and 5B, FIGS. 6A to 6E, FIGS. 7A to 7E, and FIGS. 8A to 8D. Note that portions similar to those in FIGS. 1A and 1B, FIGS. 2A to 2E, FIGS. 3A to 3E, and FIGS. 4A to 4D are denoted by the same reference numerals, and description thereof is skipped.

<Structure Example 2 of Semiconductor Device>

Figure 5A:
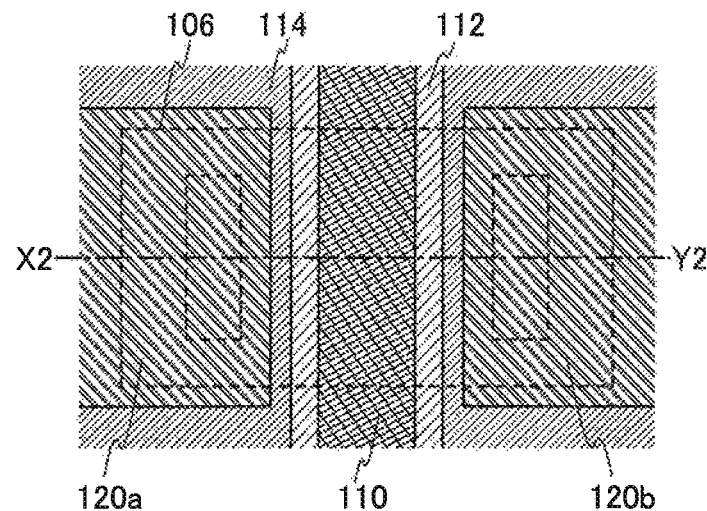
FIGS. 5A and 5B are a plan view and a cross-sectional view illustrating an embodiment of a semiconductor device.
Figure 5B:
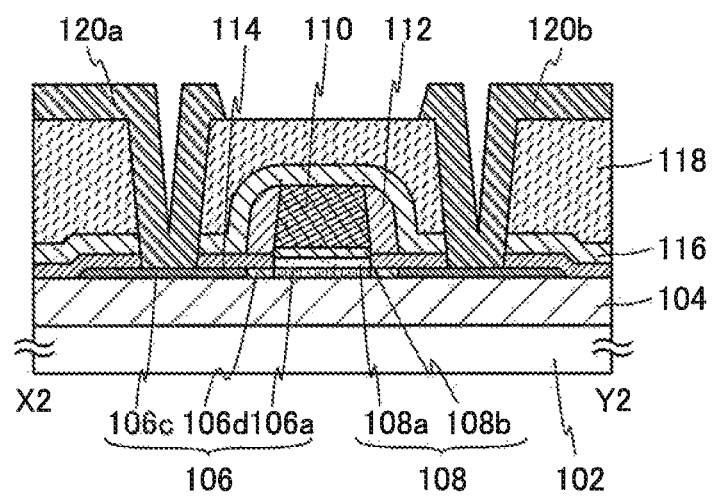

FIGS. 5A and 5B are a plan view and a cross-sectional view of a top-gate self-aligned transistor as an example of a semiconductor device. FIG. 5A is a plan view and FIG. 5B is a cross-sectional view taken along line X2-Y2 in FIG. 5A. Note that in FIG. 5A, some components of the transistor (e.g., the gate insulating film 108) are not illustrated for simplification.

The semiconductor device illustrated in FIGS. 5A and 5B includes the substrate 102, the oxide film 104 formed over the substrate 102, the oxide semiconductor film 106 which is formed over the oxide film 104 and includes the channel formation region 106a and the low-resistance regions 106c and low-resistance regions 106d having resistance lower than that of the channel formation region 106a, the metal oxide insulating films 114 formed in contact with the low-resistance regions 106c and the low-resistance regions 106d, the gate insulating film 108 formed over the oxide semiconductor film 106, the gate electrode 110 which is formed in contact with the gate insulating film 108 and overlaps with the channel formation region 106a, and the sidewall insulating films 112 which are formed over the metal oxide insulating films 114 and formed on the side surfaces of the gate electrode 110 in a cross section taken along the channel length direction. The low-resistance regions 106c and the low-resistance regions 106d include at least a metal element included in the metal oxide insulating films 114.

In addition, the protective insulating film 116 formed over the metal oxide insulating films 114, the sidewall insulating films 112, and the gate electrode 110, the source electrode 120a and the drain electrode 120b electrically connected to the low-resistance regions 106c, and the interlayer insulating film 118 may be included.

Note that as illustrated in FIG. 5B, the gate insulating film 108 preferably has a stacked structure of the first gate insulating film 108a and the second gate insulating film 108b. In the stacked structure of the gate insulating film 108, the first gate insulating film 108a is an oxide film containing excess oxygen and the second gate insulating film 108b is an insulating film having a blocking function, whereby oxygen can be supplied to the oxide semiconductor film 106 (particularly the channel formation region 106a), and an impurity can be prevented from entering the oxide semiconductor film 106 (particularly the channel formation region 106a) or oxygen can be prevented from being released upward from the first gate insulating film 108a. For example, a silicon oxynitride film can be used as the first gate insulating film 108a and an aluminum oxide film can be used as the second gate insulating film 108b.

The oxide semiconductor film 106 includes the channel formation region 106a, the low-resistance regions 106c, and the low-resistance regions 106d. The low-resistance regions 106c and the low-resistance regions 106d can be formed in a self-aligned manner. Specifically, after the oxide semiconductor film 106 including the channel formation region 106a is formed, a stack of the gate insulating film 108 and the gate electrode 110 is formed over the oxide semiconductor film 106. Then, part of the gate insulating film 108 is removed with the use of the gate electrode 110 as a mask; thus, a surface of the oxide semiconductor film 106 is exposed. After that, a metal film is formed in contact with part of the oxide semiconductor film 106 and heat treatment is performed in the state where the oxide semiconductor film 106 is in contact with the metal film so that a metal element is introduced into the oxide semiconductor film 106 from the metal film; thus, the low-resistance regions 106d including the metal element are formed. Further, the metal film which is in contact with the oxide film 104 and the oxide semiconductor film 106 is selectively oxidized by the heat treatment, whereby the metal oxide insulating films 114 are formed. The metal film is removed. After that, the sidewall insulating films 112 are formed on the side surfaces of the gate electrode 110 in a cross section taken along the channel length direction. Then, dopant is selectively introduced into the oxide semiconductor film 106 through the metal oxide insulating films 114 with the use of the gate electrode 110 and the sidewall insulating films 112 as masks, so that the low-resistance regions 106c are formed.

With such a structure, the low-resistance regions 106c and the low-resistance regions 106d are formed in the oxide semiconductor film 106 in a self-aligned manner, and the metal oxide insulating films 114 are formed over the low-resistance regions 106c and the low-resistance regions 106d. The metal oxide insulating films 114 can effectively prevent entry of an impurity to the oxide semiconductor film 106 or release of oxygen included in the oxide film 104 and the oxide semiconductor film 106. Further, since the metal film is removed, unnecessary capacitance due to the metal film is not formed.

Further, in the oxide semiconductor film 106, the low-resistance region 106d having resistance different from that of the low-resistance regions 106c is formed between the channel formation region 106a and each of the low-resistance regions 106c. The low-resistance regions 106c are, in other words, regions into which an impurity imparting n-type conductivity to the oxide semiconductor film 106 is introduced at high concentration. The low-resistance regions 106d are, in other words, regions into which an impurity imparting n-type conductivity to the oxide semiconductor film 106 is introduced at low concentration. With such a structure, a potential difference between the source and the drain, which is associated with the channel formation region 106a, can be reduced, and the semiconductor device can be highly reliable.

The structure of the semiconductor device described in this embodiment is different from that of the semiconductor device described in Embodiment 1 in that the low-resistance region 106d having resistance different from that of the low resistance regions 106c is formed between the channel formation region 106a and each of the low-resistance regions 106c. Further, the shapes of the gate insulating film 108, the metal oxide insulating films 114, and the sidewall insulating films 112 in this embodiment are different from those in Embodiment 1.

Note that components that can be used for the semiconductor device in this embodiment can be similar to those in Embodiment 1; therefore, detailed description thereof is omitted.

Note that the details of other components are described in <Method 2 for Manufacturing Semiconductor Device> below, with reference to FIGS. 6A to 6E, FIGS. 7A to 7E, and FIGS. 8A to 8D.

<Method 2 for Manufacturing Semiconductor Device>

An example of a method for manufacturing the semiconductor device illustrated in FIGS. 5A and 5B of this embodiment will be described below with reference to FIGS. 6A to 6E, FIGS. 7A to 7E, and FIGS. 8A to 8D.

Figure 6A:
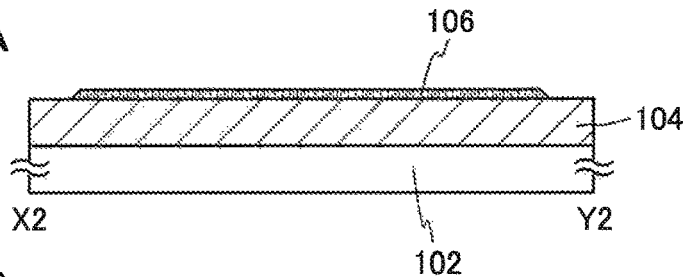
FIGS. 6A to 6E are cross-sectional views illustrating an example of a manufacturing process of a semiconductor device.

First, the substrate 102 is prepared, and then the oxide film 104 and the oxide semiconductor film 106 including a channel formation region are formed over the substrate 102 (see FIG. 6A).

Figure 6B:
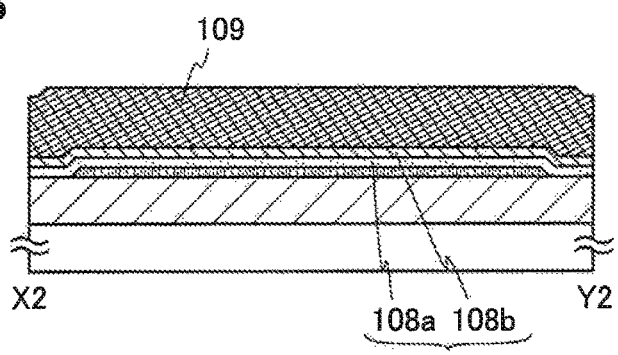
Figure 6C:
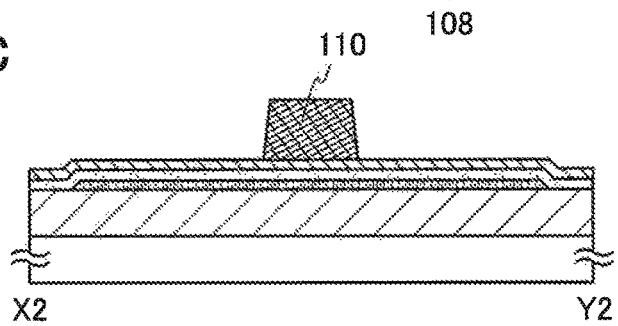

Next, the gate insulating film 108 (the first gate insulating film 108a and the second gate insulating film 108b), and the conductive film 109 are formed over the oxide semiconductor film 106 (see FIG. 6B).

Next, a resist mask is formed over the conductive film 109 through a photolithography step, selective etching is performed to form the gate electrode 110, and then the resist mask is removed. Thus, a stack of the gate insulating film 108 and the gate electrode 110 is formed over the oxide semiconductor film 106 (see FIG. 6C).

Figure 6D:
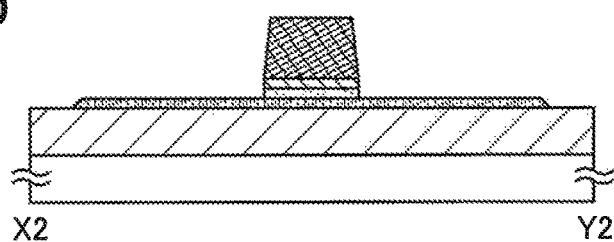
Figure 6E:
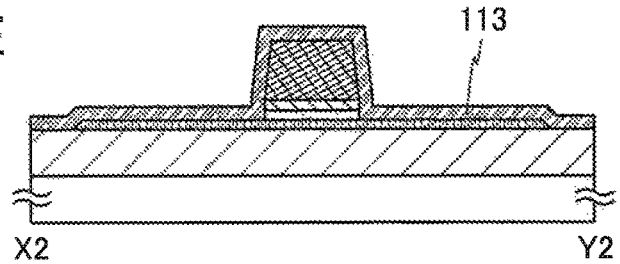

Next, part of the gate insulating film 108 is removed with the use of the gate electrode 110 as a mask, so that the surface of the oxide semiconductor film 106 is exposed (see FIG. 6D).

Note that the gate insulating film 108 may be processed in the formation of the gate electrode 110.

Next, the metal film 113 is formed over the oxide film 104, the oxide semiconductor film 106, and the gate electrode 110. Thus, the metal film 113 is formed in contact with part of the oxide semiconductor film 106 (see FIG. 6E).

A metal material selected from aluminum, indium, titanium, tin, tungsten, nickel, molybdenum, and zinc can be used for the metal film 113. In this embodiment, an aluminum film with a thickness of 10 nm is formed by a sputtering method.

Next, heat treatment is performed in the state where the metal film 113 and the oxide semiconductor film 106 are in contact with each other, so that the metal element is introduced from the metal film 113. Thus, the low-resistance regions 106d including the metal element are formed and the channel formation region 106a is formed under the gate electrode 110. Further, oxygen is diffused into the metal film 113 from the oxide film 104 and the oxide semiconductor film 106 by the heat treatment, so that the metal film 113 is selectively oxidized. Thus, the metal oxide insulating films 113a are formed (see FIG. 7A).

The heat treatment is preferably performed at a temperature higher than or equal to 300° C. and lower than or equal to 700° C., more preferably higher than or equal to 300° C. and lower than or equal to 450° C. under an inert gas atmosphere or reduced pressure. The inert gas atmosphere is preferably an atmosphere which contains nitrogen or a rare gas (e.g., helium, neon, or argon) as its main component and does not contain water, hydrogen, or the like. The heat treatment is preferably performed in an atmosphere in which the surface of the metal film 113 is not oxidized by the heat treatment. Further, the heating time can be set as appropriate by a practitioner such that the oxide semiconductor film 106 and the metal film 113 can react with each other.

By such heat treatment, oxidation of the metal film 113 does not proceed from its surface but proceeds from a portion in contact with the oxide film 104 or the oxide semiconductor film 106. Therefore, the metal oxide insulating films 113a can be formed in regions in contact with the oxide film 104 and the oxide semiconductor film 106 and the metal film 113 remains in another region.

Next, the metal film 113 is removed. Thus, the metal oxide insulating films 114 are formed (see FIG. 7B).

For example, in the case where aluminum is used for the metal film, the metal film 113 can be removed by a wet etching method using an etchant such as HCl, $H_2SO_4$, $H_3PO_4$, or $H_2C_2O_4$. However, the method for removing the metal film 113 is not limited thereto. Depending on the materials of the metal film 113 and the metal oxide insulating films 114, a practitioner can select an etchant or an etching method as appropriate as long as etching selectivity is ensured.

Figure 7A:
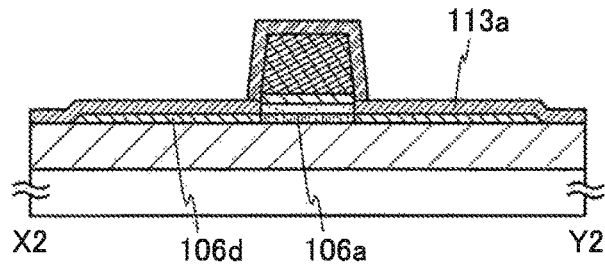
FIGS. 7A to 7E are cross-sectional views illustrating an example of a manufacturing process of a semiconductor device.
Figure 7B:
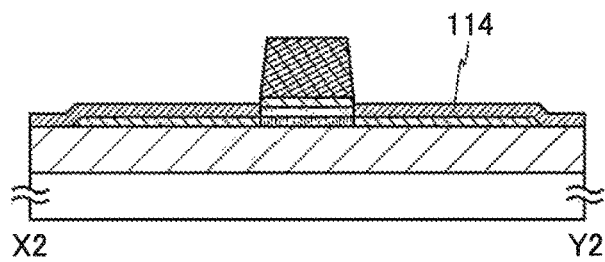
Figure 7C:
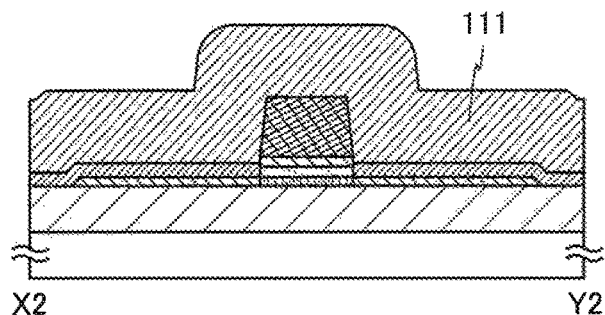
Figure 7D:
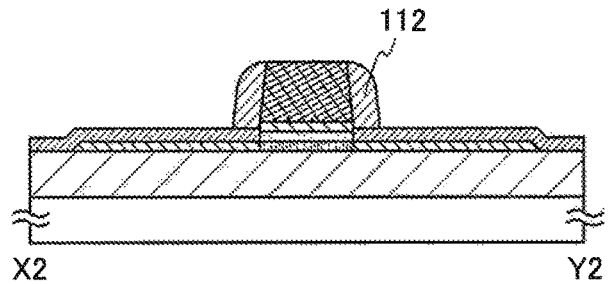
Figure 7E:
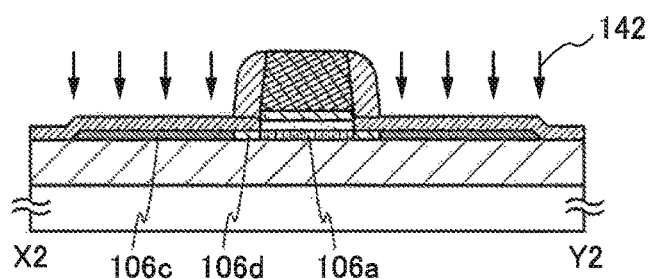

Next, the insulating film 111 is formed over the metal oxide insulating films 114 and the gate electrode 110 (see FIG. 7C).

Then, the insulating film 111 is etched, so that the sidewall insulating films 112 are formed. Thus, the sidewall insulating films 112 are formed on the side surfaces of the gate electrode 110 in a cross section taken along the channel length direction (see FIG. 7D).

The sidewall insulating films 112 can be formed in a self-aligned manner by performing a highly anisotropic etching step on the insulating film 111. In addition to the materials mentioned in [Detailed Description of Sidewall Insulating Film] in Embodiment 1, an oxide film formed of silicon oxide, silicon oxynitride, or the like can be used as the sidewall insulating films 112.

Note that the sidewall insulating films 112 may be formed in such a manner that a resist mask is formed over the insulating film 111 and etching is performed.

Next, the dopant 142 is selectively introduced into the oxide semiconductor film 106 through the metal oxide insulating films 114 with the use of the gate electrode 110 and the sidewall insulating films 112 as masks. In the oxide semiconductor film 106, the channel formation region 106a is formed under the gate electrode 110, the low resistance regions 106d are formed under the sidewall insulating films 112, and the low-resistance regions 106c are formed in contact with the metal oxide insulating films 114 (see FIG. 7E).

The dopant 142 is an impurity that changes the conductivity of the oxide semiconductor film 106. One or more selected from the following can be used as the dopant 142: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

The dopant 142 can be introduced into the oxide semiconductor film 106 through another film (e.g., the metal oxide insulating films 114) by an implantation method. As the method for introducing the dopant 142, an ion implantation method, an ion doping method, a plasma immersion ion implantation method, or the like can be used. In that case, it is preferable to use a single ion of the dopant 142, or a fluoride ion or chloride ion thereof.

The introduction of the dopant 142 may be controlled by setting as appropriate the implantation conditions such as the acceleration voltage and the dosage, or the thickness of the film through which the dopant passes. In this embodiment, phosphorus is used as the dopant 142, whose ion is implanted by an ion implantation method. Note that the dosage of the dopant 142 may be greater than or equal to $1 \times 10^{13}$ ions/cm$^2$ and less than or equal to $5 \times 10^{16}$ ions/cm$^2$.

The dopant 142 may be introduced with the substrate 102 heated.

The introduction of the dopant 142 into the oxide semiconductor film 106 may be performed plural times, and the number of kinds of dopant may be plural.

Although the case where the dopant 142 is introduced is described in this embodiment, the present invention is not limited thereto. It is possible that the dopant 142 is not introduced so that the oxide semiconductor film 106 includes the low-resistance regions 106d and does not include the low-resistance regions 106c.

Figure 8A:
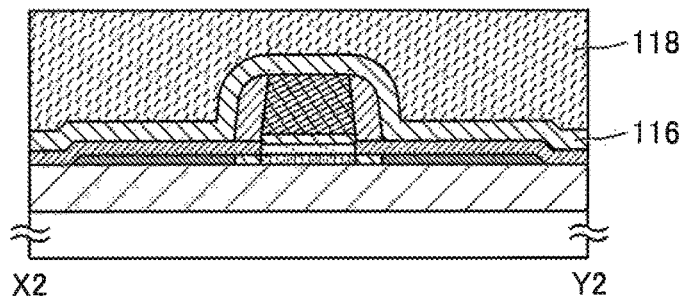
FIGS. 8A to 8D are cross-sectional views illustrating an example of a manufacturing process of a semiconductor device.

Next, the protective insulating film 116 and the interlayer insulating film 118 are formed to cover the gate electrode 110, the sidewall insulating films 112, and the metal oxide insulating films 114 (see FIG. 8A).

Figure 8B:
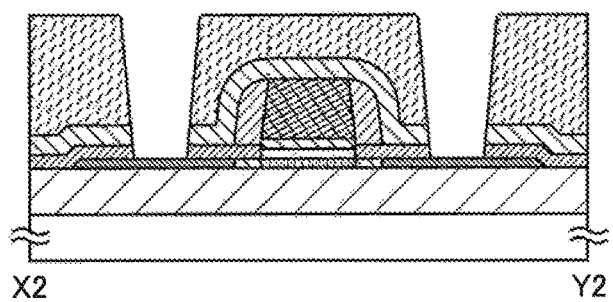

Then, a resist mask is formed in a desired region over the interlayer insulating film 118, and the interlayer insulating film 118, the protective insulating film 116, and the metal oxide insulating films 114 are selectively etched; thus, opening portions reaching the low-resistance regions 106c are formed (see FIG. 8B).

Figure 8C:
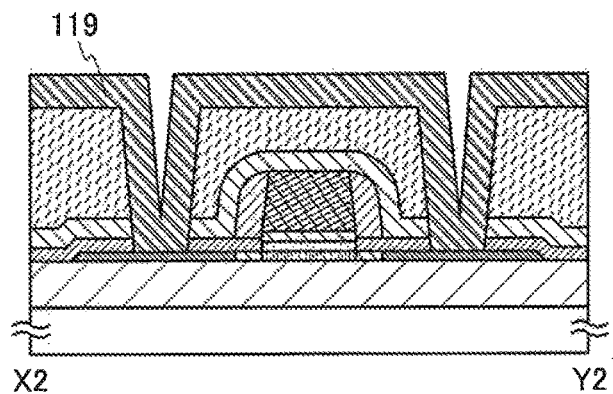

Next, the conductive film 119 is formed over the interlayer insulating film 118 and in the opening portions (see FIG. 8C).

Figure 8D:
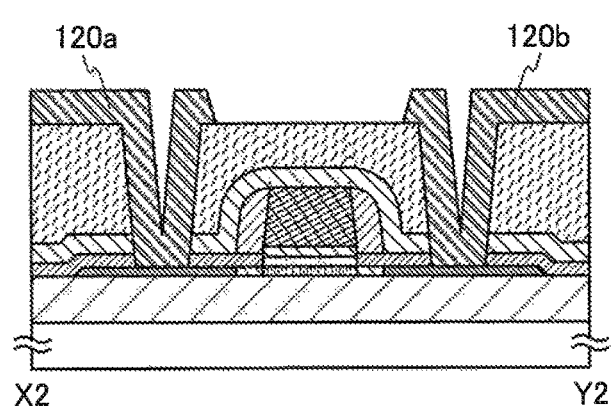

Next, a resist mask is formed in a desired region over the conductive film 119, and the conductive film 119 is selectively etched; thus, the source electrode 120a and the drain electrode 120b are formed (see FIG. 8D).

Through the above manufacturing steps, the semiconductor device shown in FIGS. 5A and 5B can be manufactured.

As described in this embodiment, one of the technical ideas of the present invention is as follows. By reaction between an oxide semiconductor film and a metal film, low-resistance regions are formed in the oxide semiconductor film including a channel formation region in a self-aligned manner and part of the metal film is oxidized to form metal oxide insulating films for covering the low-resistance regions. Then, another part of the metal film, which is not oxidized, is removed. Thus, the metal oxide insulating films can prevent release of oxygen contained in an oxide film and the oxide semiconductor film. Further, since the metal film is removed, unnecessary capacitance due to the metal film is not formed. Accordingly, oxygen can be favorably supplied to the oxide semiconductor film including the channel formation region from the oxide film, and a transistor with stable electric characteristics can be provided.

The method and structure described in this embodiment can be combined as appropriate with any of the methods and structures described in the other embodiments.

(Embodiment 3)

In this embodiment, a modification example of the semiconductor devices described in Embodiments 1 and 2, and a method for manufacturing a semiconductor device, which is different from those described in Embodiments 1 and 2, will be described with reference to FIGS. 9A and 9B, FIGS. 10A to 10D, FIGS. 11A to 11D, and FIGS. 12A to 12C. Note that portions similar to those in FIGS. 1A and 1B, FIGS. 2A to 2E, FIGS. 3A to 3E, FIGS. 4A to 4D, FIGS. 5A and 5B, FIGS. 6A to 6E, FIGS. 7A to 7E, and FIGS. 8A to 8D are denoted by the same reference numerals, and description thereof is skipped.

<Structure Example 3 of Semiconductor Device>

Figure 9A:
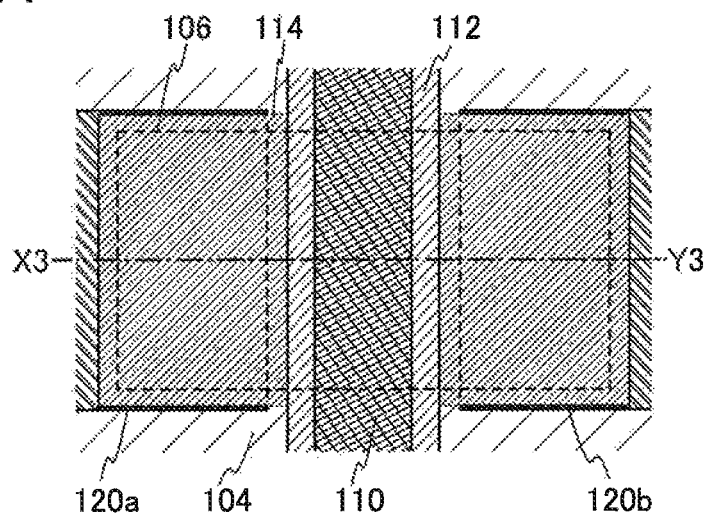
FIGS. 9A and 9B are a plan view and a cross-sectional view illustrating an embodiment of a semiconductor device.
Figure 9B:
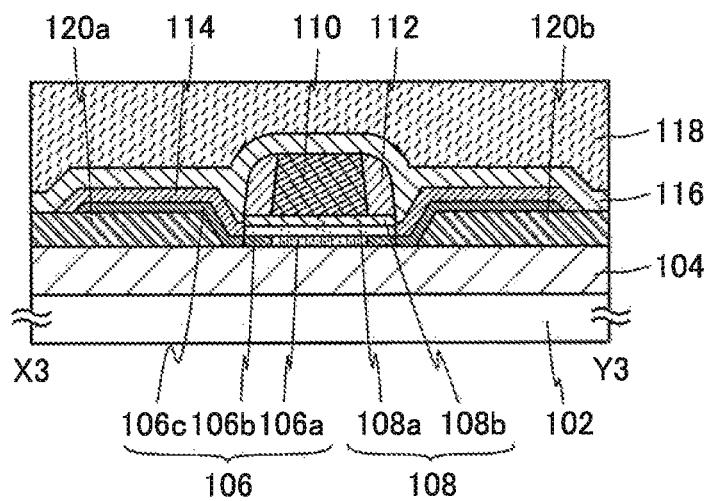

FIGS. 9A and 9B are a plan view and a cross-sectional view of a top-gate self-aligned transistor as an example of a semiconductor device. FIG. 9A is a plan view and FIG. 9B is a cross-sectional view taken along line X3-Y3 in FIG. 9A. Note that in FIG. 9A, some components of the transistor (e.g., the gate insulating film 108) are not illustrated for simplification.

The semiconductor device illustrated in FIGS. 9A and 9B includes the substrate 102, the oxide film 104 formed over the substrate 102, the source electrode 120a and the drain electrode 120b formed over the oxide film 104, the oxide semiconductor film 106 which is formed over the oxide film 104, the source electrode 120a, and the drain electrode 120b and includes the channel formation region 106a and the low-resistance regions 106c having resistance lower than that of the channel formation region 106a, the metal oxide insulating films 114 formed in contact with the low-resistance regions 106c, the gate insulating film 108 formed over the oxide semiconductor film 106, the gate electrode 110 which is formed in contact with the gate insulating film 108 and overlaps with the channel formation region 106a, the sidewall insulating films 112 which are formed over the gate insulating film 108 and formed on the side surfaces of the gate electrode 110 in a cross section taken along the channel length direction, and the protective insulating film 116 formed over the metal oxide insulating films 114, the sidewall insulating films 112, and the gate electrode 110. The low-resistance regions 106c include at least a metal element included in the metal oxide insulating films 114. Further, the interlayer insulating film 118 may be formed over the protective insulating film 116.

The source electrode 120a and the drain electrode 120b are electrically connected to the low-resistance regions 106c.

Note that as illustrated in FIG. 9B, the gate insulating film 108 preferably has a stacked structure of the first gate insulating film 108a and the second gate insulating film 108b. In the stacked structure of the gate insulating film 108, the first gate insulating film 108a is an oxide film containing excess oxygen and the second gate insulating film 108b is an insulating film having a blocking function, whereby oxygen can be supplied to the oxide semiconductor film 106 (particularly the channel formation region 106a), and an impurity can be prevented from entering the oxide semiconductor film 106 (particularly the channel formation region 106a) or oxygen can be prevented from being released upward from the first gate insulating film 108a. For example, a silicon oxynitride film can be used as the first gate insulating film 108a and an aluminum oxide film can be used as the second gate insulating film 108b.

The oxide semiconductor film 106 includes the impurity region 106b having resistance different from that of the low-resistance regions 106c between the channel formation region 106a and each of the low-resistance regions 106c. The low-resistance regions 106c and the impurity regions 106b can be formed in a self-aligned manner. Specifically, after the oxide semiconductor film 106 including the channel formation region 106a is formed, a stack of the gate insulating film 108 and the gate electrode 110 is formed over the oxide semiconductor film 106. Then, dopant is selectively introduced into the oxide semiconductor film 106 through the gate insulating film 108 with the use of the gate electrode 110 as a mask, so that the impurity regions 106b are formed. After that, the sidewall insulating films 112 are formed on the side surfaces of the gate electrode 110 in a cross section taken along the channel length direction. Then, part of the gate insulating film 108 is removed with the use of the gate electrode 110 and the sidewall insulating films 112 as masks; thus, a surface of the oxide semiconductor film 106 is exposed. After that, a metal film is formed in contact with part of the oxide semiconductor film and heat treatment is performed in the state where the oxide semiconductor film 106 is in contact with the metal film so that a metal element is introduced into the oxide semiconductor film 106 from the metal film; thus, the low-resistance regions 106c including the metal element can be formed. Further, the metal film which is in contact with the oxide semiconductor film 106 is selectively oxidized by the heat treatment, whereby the metal oxide insulating films 114 are formed. The metal film is removed.

With such a structure, the low-resistance regions 106c and the impurity regions 106b are formed in the oxide semiconductor film 106 in a self-aligned manner, and the metal oxide insulating films 114 are formed over the low-resistance regions 106c. The metal oxide insulating films 114 can effectively prevent entry of an impurity to the oxide semiconductor film 106 or release of oxygen included in the oxide film 104 and the oxide semiconductor film 106. Further, since the metal film is removed, unnecessary capacitance due to the metal film is not formed.

Further, in the oxide semiconductor film 106, the impurity region 106b having resistance different from that of the low-resistance regions 106c is formed between the channel formation region 106a and each of the low-resistance regions 106c. The low-resistance regions 106c are, in other words, regions into which an impurity imparting n-type conductivity to the oxide semiconductor film 106 is introduced at high concentration. The impurity regions 106b are, in other words, regions into which an impurity imparting n-type conductivity to the oxide semiconductor film 106 is introduced at low concentration. With such a structure, a potential difference between the source and the drain, which is associated with the channel formation region 106a, can be reduced, and the semiconductor device can be highly reliable.

The structure of the semiconductor device described in this embodiment is different from that of the semiconductor device described in Embodiment 1 in that the source electrode 120a and the drain electrode 120b are formed under the oxide semiconductor film 106 (specifically, under the low-resistance regions 106c).

Note that components that can be used for the semiconductor device in this embodiment can be similar to those in Embodiments 1 and 2; therefore, detailed description thereof is omitted.

Note that the details of other components are described in <Method 3 for Manufacturing Semiconductor Device> below, with reference to FIGS. 10A to 10D, FIGS. 11A to 11D, and FIGS. 12A to 12C.

<Method 3 for Manufacturing Semiconductor Device>

An example of a method for manufacturing the semiconductor device illustrated in FIGS. 9A and 9B of this embodiment will be described below with reference to FIGS. 10A to 10D, FIGS. 11A to 11D, and FIGS. 12A to 12C.

First, the substrate 102 is prepared. Then, the oxide film 104 and a conductive film are formed over the substrate 102. A resist mask is formed over the conductive film and the conductive film is selectively etched, so that the source electrode 120a and the drain electrode 120b are formed. After that, the oxide semiconductor film 106 including a channel formation region is formed over the oxide film 104, the source electrode 120a, and the drain electrode 120b (see FIG. 10A).

Figure 10A:
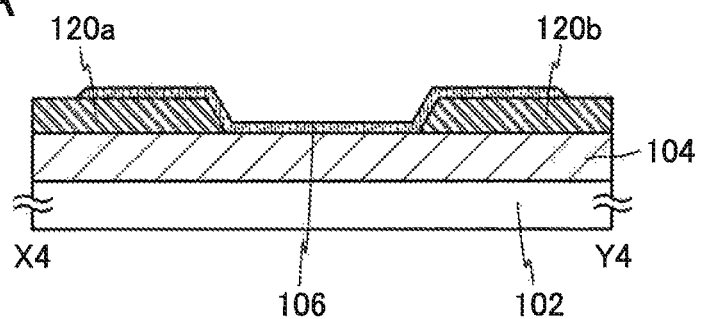
FIGS. 10A to 10D are cross-sectional views illustrating an example of a manufacturing process of a semiconductor device.
Figure 10B:
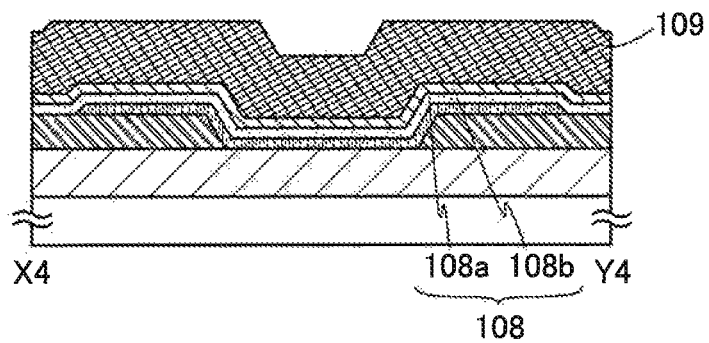
Figure 10C:
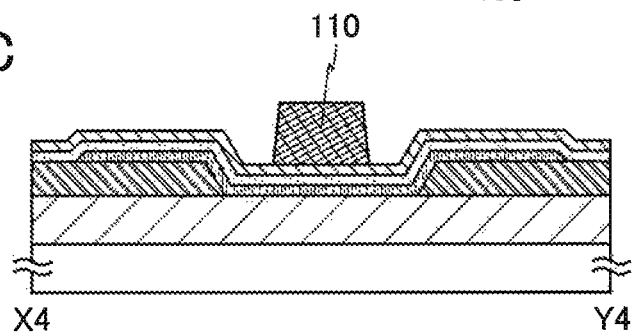
Figure 10D:
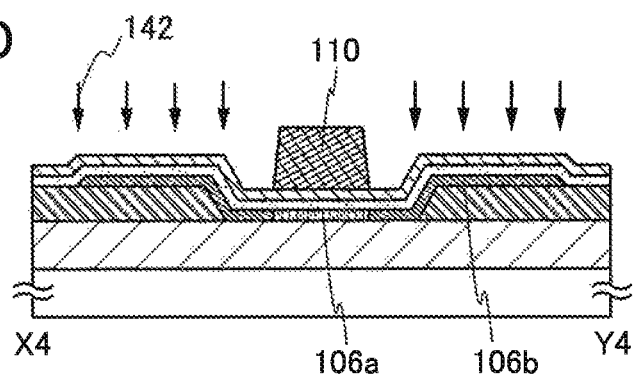

Next, the gate insulating film 108 (the first gate insulating film 108a and the second gate insulating film 108b) and the conductive film 109 are formed over the oxide semiconductor film 106, the source electrode 120a, and the drain electrode 120b (see FIG. 10B).

Next, a resist mask is formed over the conductive film 109 through a photolithography step, selective etching is performed to form the gate electrode 110, and then the resist mask is removed. Thus, a stack of the gate insulating film 108 and the gate electrode 110 is formed over the oxide semiconductor film 106 (see FIG. 10C).

Next, with the use of the gate electrode 110 as a mask, the dopant 142 is selectively introduced into the oxide semiconductor film 106 through the gate insulating film 108 (the first gate insulating film 108a and the second gate insulating film 108b). In the introduction of the dopant 142, the gate electrode 110 serves as a mask, so that the channel formation region 106a is formed in a region of the oxide semiconductor film 106, which overlaps with the gate electrode 110, and the impurity regions 106b are formed in regions into which the dopant 142 is introduced (see FIG. 10D).

The dopant 142 is an impurity that changes the conductivity of the oxide semiconductor film 106. One or more selected from the following can be used as the dopant 142: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

The dopant 142 can be introduced into the oxide semiconductor film 106 through another film (e.g., the gate insulating film 108) by an implantation method. As the method for introducing the dopant 142, an ion implantation method, an ion doping method, a plasma immersion ion implantation method, or the like can be used. In that case, it is preferable to use a single ion of the dopant 142, or a fluoride ion or chloride ion thereof.

The introduction of the dopant 142 may be controlled by setting as appropriate the implantation conditions such as the acceleration voltage and the dosage, or the thickness of the film through which the dopant passes. In this embodiment, phosphorus is used as the dopant 142, whose ion is implanted by an ion implantation method. Note that the dosage of the dopant 142 may be greater than or equal to $1\times10^{13}$ ions/cm$^2$ and less than or equal to $5\times10^{16}$ ions/cm$^2$.

The concentration of the dopant 142 in the impurity regions 106b is preferably higher than or equal to $5\times10^{18}$/cm$^3$ and lower than or equal to $1\times10^{22}$/cm$^3$.

The dopant 142 may be introduced with the substrate 102 heated.

The introduction of the dopant 142 into the oxide semiconductor film 106 may be performed plural times, and the number of kinds of dopant may be plural.

In the case where the oxide semiconductor film 106 is formed using an oxide semiconductor having crystallinity (e.g., a CAAC-OS), the impurity regions 106b preferably become an amorphous oxide semiconductor by the introduction of the dopant 142. In other words, the channel formation region 106a is an oxide semiconductor film having crystallinity, and the impurity regions 106b are an amorphous oxide semiconductor. In a cross section taken along the channel length direction, the oxide semiconductor film 106 including adjacent regions having different crystal structures in the lateral direction is formed. With such a structure, oxygen deficiency or hydrogen which is an impurity in the channel formation region 106a is extracted to the impurity regions 106b which is an amorphous oxide semiconductor, so that the channel formation region 106a can be further purified.

Figure 11A:
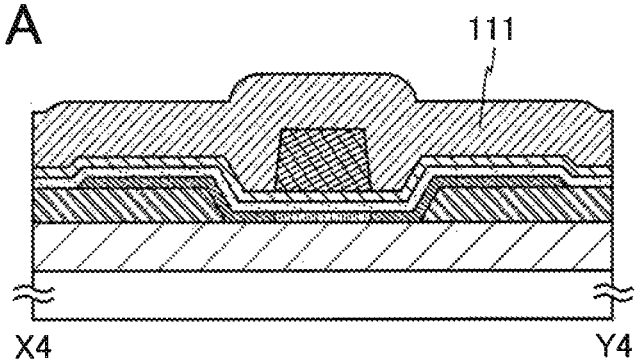
FIGS. 11A to 11D are cross-sectional views illustrating an example of a manufacturing process of a semiconductor device.
Figure 11B:
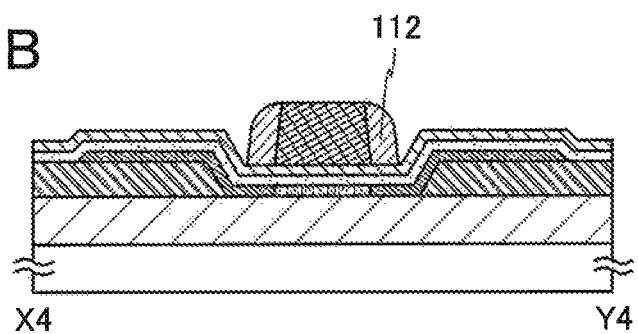

Next, the insulating film 111 is formed over the gate insulating film 108 (specifically, over the second gate insulating film 108b) and the gate electrode 110 (see FIG. 11A).

Then, the insulating film 111 is etched, so that the sidewall insulating films 112 are formed. Thus, the sidewall insulating films 112 are formed on the side surfaces of the gate electrode 110 in a cross section taken along the channel length direction (see FIG. 11B).

The sidewall insulating films 112 can be formed in a self-aligned manner by performing a highly anisotropic etching step on the insulating film 111. As an example of an etching method, a dry etching method is preferably employed. As an etching gas used for dry etching, for example, a gas including fluorine such as trifluoromethane, octafluorocyclobutane, or tetrafluoromethane can be used. A rare gas or hydrogen may be added to the etching gas. As the dry etching method, a reactive ion etching (RIE) method in which high-frequency voltage is applied to a substrate is preferably used.

Note that the sidewall insulating films 112 may be formed in such a manner that a resist mask is formed over the insulating film 111 and etching is performed.

Figure 11C:
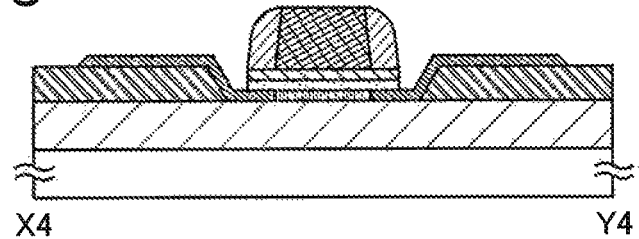
Figure 11D:
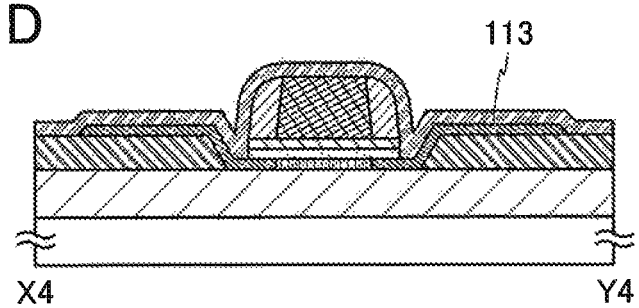

Next, after the formation of the sidewall insulating films 112, part of the gate insulating film 108 is removed with the use of the gate electrode 110 and the sidewall insulating films 112 as masks, so that the surface of the oxide semiconductor film 106 (specifically, part of the impurity regions 106b) is exposed (see FIG. 11C).

Note that the gate insulating film 108 may be processed in the formation of the sidewall insulating films 112.

Next, the metal film 113 is formed over the oxide semiconductor film 106, the gate electrode 110, the sidewall insulating films 112, the source electrode 120a, and the drain electrode 120b. Thus, the metal film 113 is formed in contact with part of the oxide semiconductor film 106 (see FIG. 11D).

A metal material selected from aluminum, indium, titanium, tin, tungsten, nickel, molybdenum, and zinc can be used for the metal film 113. In this embodiment, an aluminum film with a thickness of 10 nm is formed by a sputtering method.

Next, heat treatment is performed in the state where the metal film 113 and the oxide semiconductor film 106 (specifically, the part of the impurity regions 106b) are in contact with each other, so that the metal element is introduced from the metal film 113 and the low-resistance regions 106c including the metal element are formed. Further, oxygen is diffused into the metal film 113 from the oxide semiconductor film 106 by the heat treatment, so that the metal film 113 is selectively oxidized. Thus, the metal oxide insulating films 113a are formed. Note that in the oxide semiconductor film 106, the channel formation region 106a is formed under the gate electrode 110, the impurity regions 106b are formed under the sidewall insulating films 112, and the low-resistance regions 106c are formed in contact with the metal oxide insulating films 113a (see FIG. 12A).

The heat treatment is preferably performed at a temperature higher than or equal to 300° C. and lower than or equal to 700° C., more preferably higher than or equal to 300° C. and lower than or equal to 450° C. under an inert gas atmosphere or reduced pressure. The inert gas atmosphere is preferably an atmosphere which contains nitrogen or a rare gas (e.g., helium, neon, or argon) as its main component and does not contain water, hydrogen, or the like. The heat treatment is preferably performed in an atmosphere in which the surface of the metal film 113 is not oxidized by the heat treatment. Further, the heating time can be set as appropriate by a practitioner such that the oxide semiconductor film 106 and the metal film 113 can react with each other.

By such heat treatment, oxidation of the metal film 113 does not proceed from its surface but proceeds from a portion in contact with the oxide semiconductor film 106. Therefore, the metal oxide insulating films 113a can be formed in regions in contact with the oxide semiconductor film 106 and the metal film 113 remains in another region.

Next, the metal film 113 is removed. Thus, the metal oxide insulating films 114 are formed (see FIG. 12B).

For example, in the case where aluminum is used for the metal film, the metal film 113 can be removed by a wet etching method using an etchant such as HCl, $H_2SO_4$, $H_3PO_4$, or $H_2C_2O_4$. However, the method for removing the metal film 113 is not limited thereto. Depending on the materials of the metal film 113 and the metal oxide insulating films 114, a practitioner can select an etchant or an etching method as appropriate as long as etching selectivity is ensured.

Figure 12A:
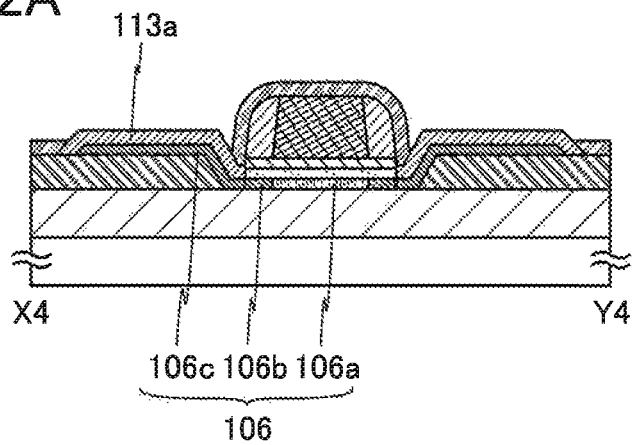
FIGS. 12A to 12C are cross-sectional views illustrating an example of a manufacturing process of a semiconductor device.
Figure 12B:
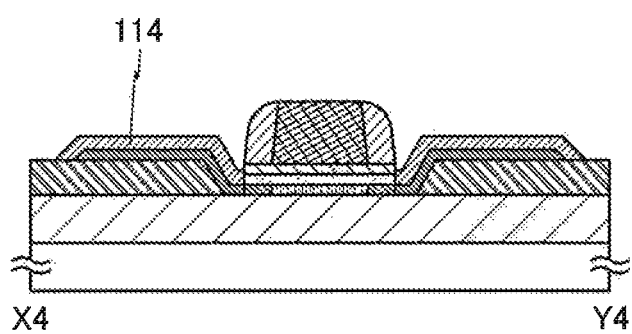
Figure 12C:
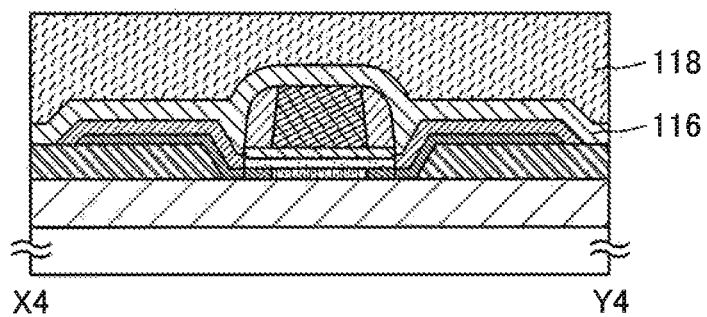

Next, the protective insulating film 116 and the interlayer insulating film 118 are formed to cover the gate electrode 110, the sidewall insulating films 112, the metal oxide insulating films 114, the source electrode 120a, and the drain electrode 120b (see FIG. 12C).

Through the above manufacturing steps, the semiconductor device shown in FIGS. 9A and 9B can be manufactured.

As described in this embodiment, one of the technical ideas of the present invention is as follows. By reaction between an oxide semiconductor film and a metal film, low-resistance regions are formed in the oxide semiconductor film including a channel formation region in a self-aligned manner and part of the metal film is oxidized to form metal oxide insulating films for covering the low-resistance regions. Then, another part of the metal film, which is not oxidized, is removed. Thus, the metal oxide insulating films can prevent release of oxygen contained in an oxide film and the oxide semiconductor film. Further, since the metal film is removed, unnecessary capacitance due to the metal film is not formed. Accordingly, oxygen can be favorably supplied to the oxide semiconductor film including the channel formation region from the oxide film, and a transistor with stable electric characteristics can be provided.

The method and structure described in this embodiment can be combined as appropriate with any of the methods and structures described in the other embodiments.

(Embodiment 4)

In this embodiment, a modification example of the semiconductor devices described in Embodiments 1 to 3, and a method for manufacturing a semiconductor device, which is different from those described in Embodiments 1 to 3, will be described with reference to FIGS. 13A and 13B, FIGS. 14A to 14D, FIGS. 15A to 15D, and FIGS. 16A to 16C. Note that portions similar to those in FIGS. 1A and 1B, FIGS. 2A to 2E, FIGS. 3A to 3E, FIGS. 4A to 4D, FIGS. 5A and 5B, FIGS. 6A to 6E, FIGS. 7A to 7E, FIGS. 8A to 8D, FIGS. 9A and 9B, FIGS. 10A to 10D, FIGS. 11A to 11D, and FIGS. 12A to 12C are denoted by the same reference numerals, and description thereof is skipped. In addition, detailed description of the same portions is not repeated, either.

<Structure Example 4 of Semiconductor Device>

Figure 13A:
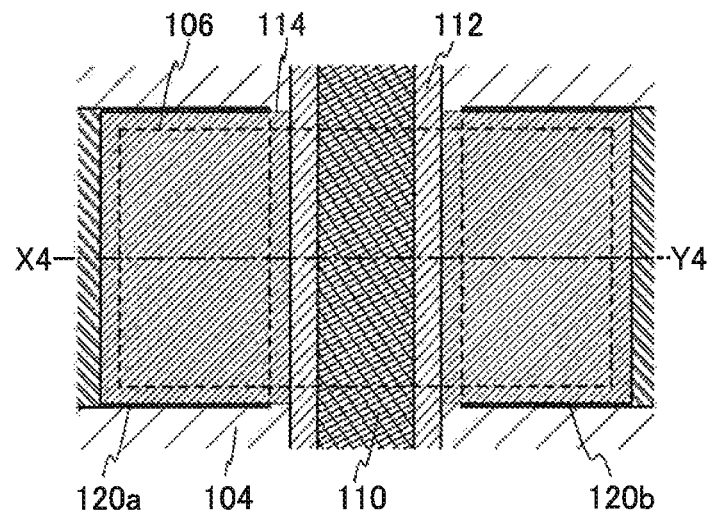
FIGS. 13A and 13B are a plan view and a cross-sectional view illustrating an embodiment of a semiconductor device.
Figure 13B:
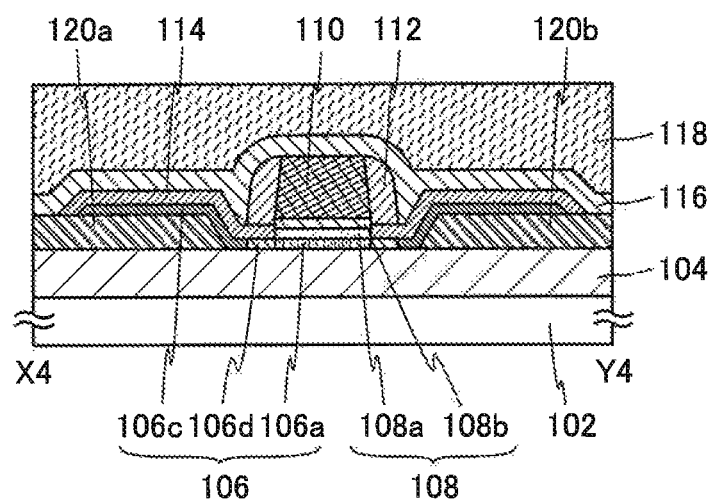

FIGS. 13A and 13B are a plan view and a cross-sectional view of a top-gate self-aligned transistor as an example of a semiconductor device. FIG. 13A is a plan view and FIG. 13B is a cross-sectional view taken along line X4-Y4 in FIG. 13A. Note that in FIG. 13A, some components of the transistor (e.g., the gate insulating film 108) are not illustrated for simplification.

The semiconductor device illustrated in FIGS. 13A and 13B includes the substrate 102, the oxide film 104 formed over the substrate 102, the source electrode 120a and the drain electrode 120b formed over the oxide film 104, the oxide semiconductor film 106 which is formed over the oxide film 104, the source electrode 120a, and the drain electrode 120b and includes the channel formation region 106a and the low-resistance regions 106c and the low-resistance regions 106d having resistance lower than that of the channel formation region 106a, the metal oxide insulating films 114 formed in contact with the low-resistance regions 106c and the low-resistance regions 106d, the gate insulating film 108 formed over the oxide semiconductor film 106, the gate electrode 110 which is formed in contact with the gate insulating film 108 and overlaps with the channel formation region 106a, the sidewall insulating films 112 which are formed over the metal oxide insulating films 114 and formed on the side surfaces of the gate electrode 110 in a cross section taken along the channel length direction, and the protective insulating film 116 formed over the metal oxide insulating films 114, the sidewall insulating films 112, and the gate electrode 110. The low-resistance regions 106c and the low-resistance regions 106d include at least a metal element included in the metal oxide insulating films 114. Further, the interlayer insulating film 118 may be formed over the protective insulating film 116.

The source electrode 120a and the drain electrode 120b are electrically connected to the low-resistance regions 106c.

Note that as illustrated in FIG. 13B, the gate insulating film 108 preferably has a stacked structure of the first gate insulating film 108a and the second gate insulating film 108b. In the stacked structure of the gate insulating film 108, the first gate insulating film 108a is an oxide film containing excess oxygen and the second gate insulating film 108b is an insulating film having a blocking function, whereby oxygen can be supplied to the oxide semiconductor film 106 (particularly the channel formation region 106a), and an impurity can be prevented from entering the oxide semiconductor film 106 (particularly the channel formation region 106a) or oxygen can be prevented from being released upward from the first gate insulating film 108a. For example, a silicon oxynitride film can be used as the first gate insulating film 108a and an aluminum oxide film can be used as the second gate insulating film 108b.

The oxide semiconductor film 106 includes the channel formation region 106a, the low-resistance regions 106c, and the low-resistance regions 106d. The low-resistance regions 106c and the low-resistance regions 106d can be formed in a self-aligned manner. Specifically, after the oxide semiconductor film 106 including the channel formation region 106a is formed, a stack of the gate insulating film 108 and the gate electrode 110 is formed over the oxide semiconductor film 106. Then, part of the gate insulating film 108 is removed with the use of the gate electrode 110 as a mask; thus, a surface of the oxide semiconductor film 106 is exposed. After that, a metal film is formed in contact with part of the oxide semiconductor film 106 and heat treatment is performed in the state where the oxide semiconductor film 106 is in contact with the metal film so that a metal element is introduced into the oxide semiconductor film 106 from the metal film; thus, the low-resistance regions 106d including the metal element are formed. Further, the metal film which is in contact with the oxide film 104 and the oxide semiconductor film 106 is selectively oxidized by the heat treatment, whereby the metal oxide insulating films 114 are formed. The metal film is removed. After that, the sidewall insulating films 112 are formed on the side surfaces of the gate electrode 110 in a cross section taken along the channel length direction. Then, dopant is selectively introduced into the oxide semiconductor film 106 through the metal oxide insulating films 114 with the use of the gate electrode 110 and the sidewall insulating films 112 as masks, so that the low-resistance regions 106c are formed.

With such a structure, the low-resistance regions 106c and the low-resistance regions 106d are formed in the oxide semiconductor film 106 in a self-aligned manner, and the metal oxide insulating films 114 are formed over the low-resistance regions 106c and the low-resistance regions 106d. The metal oxide insulating films 114 can effectively prevent entry of an impurity to the oxide semiconductor film 106 or release of oxygen included in the oxide film 104 and the oxide semiconductor film 106. Further, since the metal film is removed, unnecessary capacitance due to the metal film is not formed.

Further, in the oxide semiconductor film 106, the low-resistance region 106d having resistance different from that of the low-resistance regions 106c is formed between the channel formation region 106a and each of the low-resistance regions 106c. The low-resistance regions 106c are, in other words, regions into which an impurity imparting n-type conductivity to the oxide semiconductor film 106 is introduced at high concentration. The low-resistance regions 106d are, in other words, regions into which an impurity imparting n-type conductivity to the oxide semiconductor film 106 is introduced at low concentration. With such a structure, a potential difference between the source and the drain, which is associated with the channel formation region 106a, can be reduced, and the semiconductor device can be highly reliable.

The structure of the semiconductor device described in this embodiment is different from that of the semiconductor device described in Embodiment 1 in that the source electrode 120a and the drain electrode 120b are formed under the oxide semiconductor film 106 (specifically, under the low-resistance regions 106c) and that the low-resistance region 106d having resistance different from that of the low-resistance regions 106c is formed between the channel formation region 106a and each of the low-resistance regions 106c. Further, the shapes of the gate insulating film 108, the metal oxide insulating films 114, and the sidewall insulating films 112 in this embodiment are different from those in Embodiment 1.

Note that components that can be used for the semiconductor device in this embodiment can be similar to those in Embodiments 1 to 3; therefore, detailed description thereof is omitted.

Note that the details of other components are described in <Method 4 for Manufacturing Semiconductor Device> below, with reference to FIGS. 14A to 14D, FIGS. 15A to 15D, and FIGS. 16A to 16C.

<Method 4 for Manufacturing Semiconductor Device>

An example of a method for manufacturing the semiconductor device illustrated in FIGS. 13A and 13B of this embodiment will be described below with reference to FIGS. 14A to 14D, FIGS. 15A to 15D, and FIGS. 16A to 16C.

First, the substrate 102 is prepared. Then, the oxide film 104 and a conductive film are formed over the substrate 102. A resist mask is formed over the conductive film and the conductive film is selectively etched, so that the source electrode 120a and the drain electrode 120b are formed. After that, the oxide semiconductor film 106 including the channel formation region is formed over the oxide film 104, the source electrode 120a, and the drain electrode 120b (see FIG. 14A).

Figure 14A:
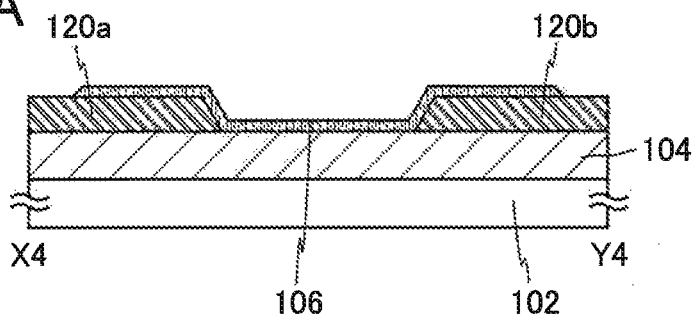
FIGS. 14A to 14D are cross-sectional views illustrating an example of a manufacturing process of a semiconductor device.
Figure 14B:
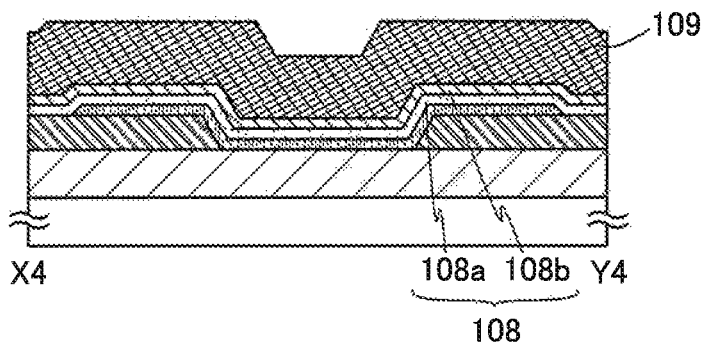
Figure 14C:
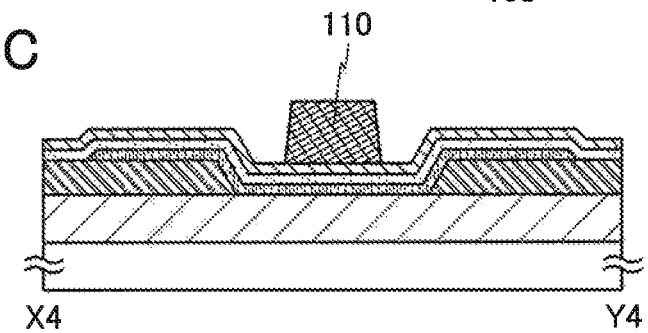

Next, the gate insulating film 108 (the first gate insulating film 108a and the second gate insulating film 108b) and the conductive film 109 are formed over the oxide semiconductor film 106, the source electrode 120a, and the drain electrode 120b (see FIG. 14B).

Next, a resist mask is formed over the conductive film 109 through a photolithography step, selective etching is performed to form the gate electrode 110, and then the resist mask is removed. Thus, a stack of the gate insulating film 108 and the gate electrode 110 is formed over the oxide semiconductor film 106 (see FIG. 14C).

Figure 14D:
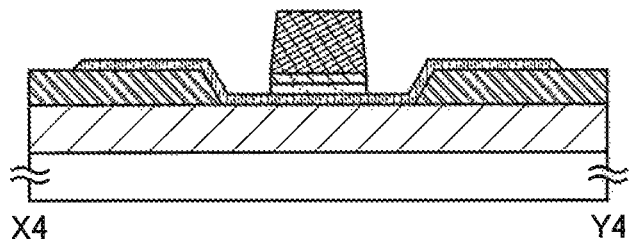

Next, part of the gate insulating film 108 is removed with the use of the gate electrode 110 as a mask, so that the surface of the oxide semiconductor film 106 is exposed (see FIG. 14D).

Note that the gate insulating film 108 may be processed in the formation of the gate electrode 110.

Next, the metal film 113 is formed over the oxide semiconductor film 106, the gate electrode 110, the source electrode 120a, and the drain electrode 120b. Thus, the metal film 113 is formed in contact with part of the oxide semiconductor film 106 (see FIG. 15A).

A metal material selected from aluminum, indium, titanium, tin, tungsten, nickel, molybdenum, and zinc can be used for the metal film 113. In this embodiment, an aluminum film with a thickness of 10 nm is formed by a sputtering method.

Next, heat treatment is performed in the state where the metal film 113 and the oxide semiconductor film 106 are in contact with each other, so that the metal element is introduced from the metal film 113. Thus, the low-resistance regions 106d including the metal element are formed and the channel formation region 106a is formed under the gate electrode 110. Further, oxygen is diffused into the metal film 113 from the oxide semiconductor film 106 by the heat treatment, so that the metal film 113 is selectively oxidized. Thus, the metal oxide insulating films 113a are formed (see FIG. 15B).

The heat treatment is preferably performed at a temperature higher than or equal to 300° C. and lower than or equal to 700° C., more preferably higher than or equal to 300° C. and lower than or equal to 450° C. under an inert gas atmosphere or reduced pressure. The inert gas atmosphere is preferably an atmosphere which contains nitrogen or a rare gas (e.g., helium, neon, or argon) as its main component and does not contain water, hydrogen, or the like. The heat treatment is preferably performed in an atmosphere in which the surface of the metal film 113 is not oxidized by the heat treatment. Further, the heating time can be set as appropriate by a practitioner such that the oxide semiconductor film 106 and the metal film 113 can react with each other.

By such heat treatment, oxidation of the metal film 113 does not proceed from its surface but proceeds from a portion in contact with the oxide semiconductor film 106. Therefore, the metal oxide insulating films 113a can be formed in regions in contact with the oxide semiconductor film 106 and the metal film 113 remains in another region.

Next, the metal film 113 is removed. Thus, the metal oxide insulating films 114 are formed (see FIG. 15C).

For example, in the case where aluminum is used for the metal film, the metal film 113 can be removed by a wet etching method using an etchant such as HCl, $H_2SO_4$, H$_3$PO$_4$, or H$_2$C$_2$O$_4$. However, the method for removing the metal film 113 is not limited thereto. Depending on the materials of the metal film 113 and the metal oxide insulating films 114, a practitioner can select an etchant or an etching method as appropriate as long as etching selectivity is ensured.

Figure 15A:
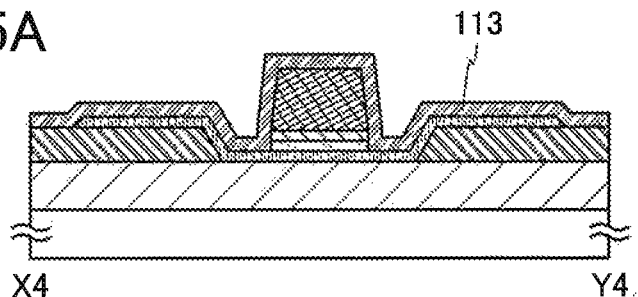
FIGS. 15A to 15D are cross-sectional views illustrating an example of a manufacturing process of a semiconductor device.
Figure 15B:
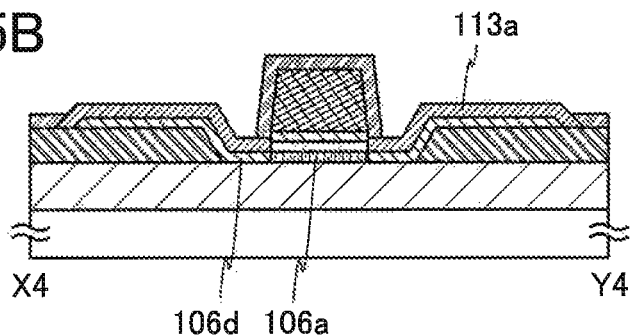
Figure 15C:
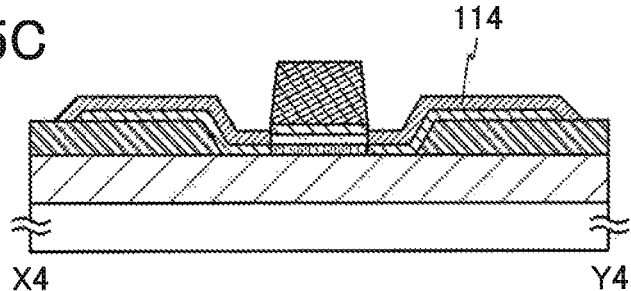
Figure 15D:
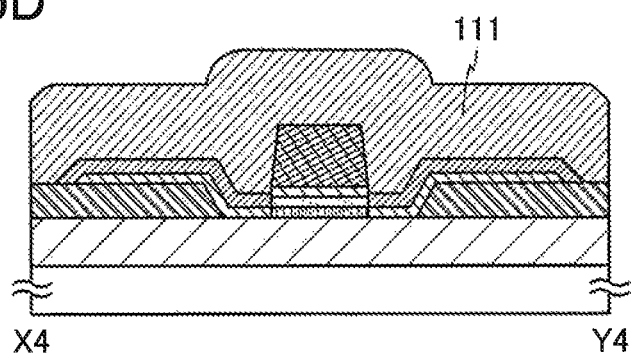

Next, the insulating film 111 is formed over the metal oxide insulating films 114 and the gate electrode 110 (see FIG. 15D).

Then, the insulating film 111 is etched, so that the sidewall insulating films 112 are formed. Thus, the sidewall insulating films 112 are formed on the side surfaces of the gate electrode 110 in a cross section taken along the channel length direction (see FIG. 16A).

The sidewall insulating films 112 can be formed in a self-aligned manner by performing a highly anisotropic etching step on the insulating film 111. In addition to the materials mentioned in [Detailed Description of Sidewall Insulating Film] in Embodiment 1, an oxide film formed of silicon oxide, silicon oxynitride, or the like can be used as the sidewall insulating films 112.

Note that the sidewall insulating films 112 may be formed in such a manner that a resist mask is formed over the insulating film 111 and etching is performed.

Next, the dopant 142 is selectively introduced into the oxide semiconductor film 106 through the metal oxide insulating films 114 with the use of the gate electrode 110 and the sidewall insulating films 112 as masks. In the oxide semiconductor film 106, the channel formation region 106a is formed under the gate electrode 110, the low resistance regions 106d are formed under the sidewall insulating films 112, and the low-resistance regions 106c are formed in contact with the metal oxide insulating films 114 (see FIG. 16B).

The dopant 142 is an impurity that changes the conductivity of the oxide semiconductor film 106. One or more selected from the following can be used as the dopant 142: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

The dopant 142 can be introduced into the oxide semiconductor film 106 through another film (e.g., the metal oxide insulating films 114) by an implantation method. As the method for introducing the dopant 142, an ion implantation method, an ion doping method, a plasma immersion ion implantation method, or the like can be used. In that case, it is preferable to use a single ion of the dopant 142, or a fluoride ion or chloride ion thereof.

The introduction of the dopant 142 may be controlled by setting as appropriate the implantation conditions such as the acceleration voltage and the dosage, or the thickness of the film through which the dopant passes. In this embodiment, phosphorus is used as the dopant 142, whose ion is implanted by an ion implantation method. Note that the dosage of the dopant 142 may be greater than or equal to $1 \times 10^{13}$ ions/cm$^2$ and less than or equal to $5 \times 10^{16}$ ions/cm$^2$.

The dopant 142 may be introduced with the substrate 102 heated.

The introduction of the dopant 142 into the oxide semiconductor film 106 may be performed plural times, and the number of kinds of dopant may be plural.

Although the case where the dopant 142 is introduced is described in this embodiment, the present invention is not limited thereto. It is possible that the dopant 142 is not introduced so that the oxide semiconductor film 106 includes the low-resistance regions 106d and does not include the low-resistance regions 106c.

Figure 16A:
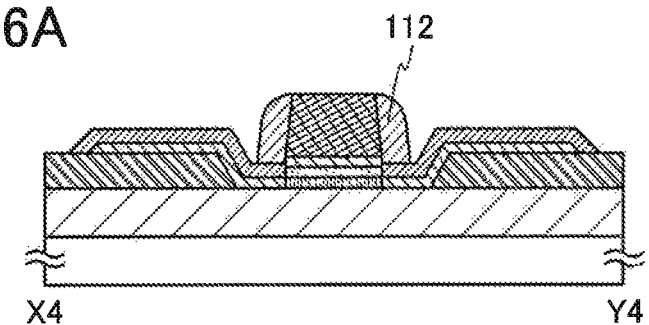
FIGS. 16A to 16C are cross-sectional views illustrating an example of a manufacturing process of a semiconductor device.
Figure 16B:
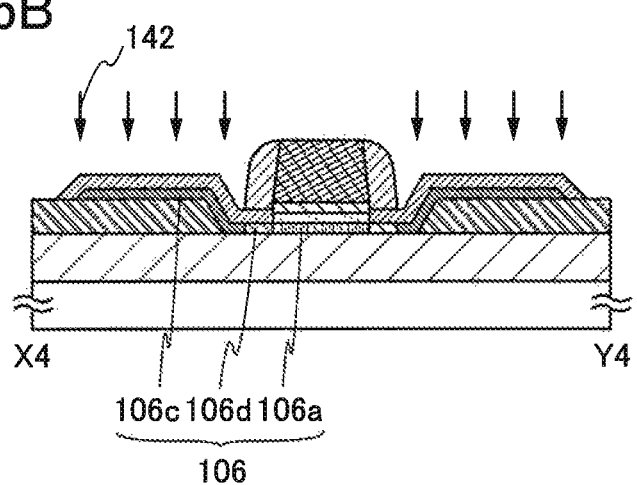
Figure 16C:
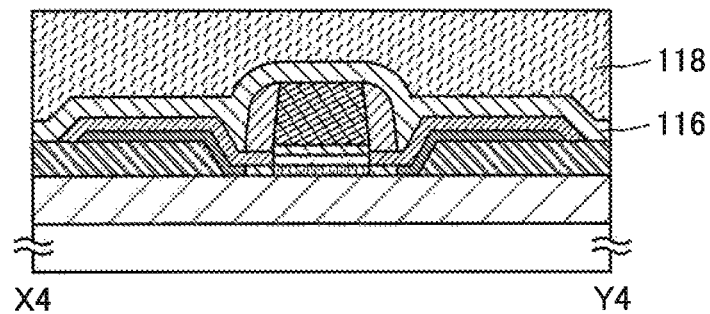

Next, the protective insulating film 116 and the interlayer insulating film 118 are formed to cover the gate electrode 110, the sidewall insulating films 112, the metal oxide insulating films 114, the source electrode 120a, and the drain electrode 120b (see FIG. 16C).

Through the above manufacturing steps, the semiconductor device shown in FIGS. 13A and 13B can be manufactured.

As described in this embodiment, one of the technical ideas of the present invention is as follows. By reaction between an oxide semiconductor film and a metal film, low-resistance regions are formed in the oxide semiconductor film including a channel formation region in a self-aligned manner and part of the metal film is oxidized to form metal oxide insulating films for covering the low-resistance regions. Then, another part of the metal film, which is not oxidized, is removed. Thus, the metal oxide insulating films can prevent release of oxygen contained in an oxide film and the oxide semiconductor film. Further, since the metal film is removed, unnecessary capacitance due to the metal film is not formed. Accordingly, oxygen can be favorably supplied to the oxide semiconductor film including the channel formation region from the oxide film, and a transistor with stable electric characteristics can be provided.

The method and structure described in this embodiment can be combined as appropriate with any of the methods and structures described in the other embodiments.

(Embodiment 5)

In this embodiment, modification examples of the semiconductor devices described in Embodiments 1 to 4 will be described with reference to FIGS. 17A and 17B and FIGS. 18A and 18B. Note that portions similar to those in FIGS. 1A and 1B, FIGS. 2A to 2E, FIGS. 3A to 3E, FIGS. 4A to 4D, FIGS. 5A and 5B, FIGS. 6A to 6E, FIGS. 7A to 7E, FIGS. 8A to 8D, FIGS. 9A and 9B, FIGS. 10A to 10D, FIGS. 11A to 11D, FIGS. 12A to 12C, FIGS. 13A and 13B, FIGS. 14A to 14D, FIGS. 15A to 15D, and FIGS. 16A to 16C are denoted by the same reference numerals, and description thereof is skipped.

First, a structure of a semiconductor device, which is different from that of the semiconductor device described in Embodiment 1, will be described below with reference to FIGS. 17A and 17B.

<Structure Example 5 of Semiconductor Device>

Figure 17A:
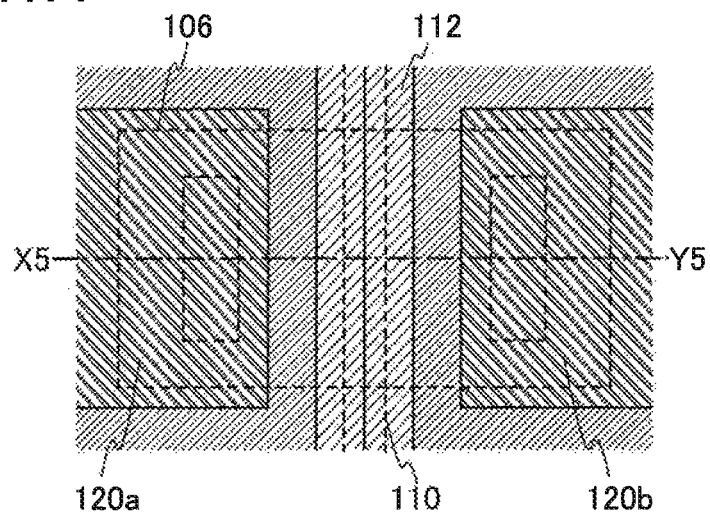
FIGS. 17A and 17B are a plan view and a cross-sectional view illustrating an embodiment of a semiconductor device.
Figure 17B:
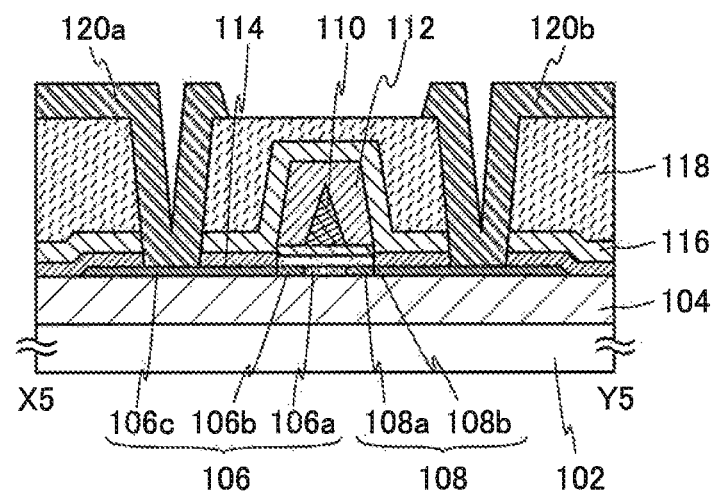

FIGS. 17A and 17B are a plan view and a cross-sectional view of a top-gate self-aligned transistor as an example of a semiconductor device. FIG. 17A is a plan view and FIG. 17B is a cross-sectional view taken along line X5-Y5 in FIG. 17A. Note that in FIG. 17A, some components of the transistor (e.g., the gate insulating film 108) are not illustrated for simplification.

The semiconductor device illustrated in FIGS. 17A and 17B includes the substrate 102, the oxide film 104 formed over the substrate 102, the oxide semiconductor film 106 which is formed over the oxide film 104 and includes the channel formation region 106a and the low-resistance regions 106c having resistance lower than that of the channel formation region 106a, the metal oxide insulating films 114 formed in contact with the low-resistance regions 106c, the gate insulating film 108 formed over the oxide semiconductor film 106, the gate electrode 110 which is formed in contact with the gate insulating film 108 and overlaps with the channel formation region 106a, and the sidewall insulating film 112 which is formed over the gate insulating film 108 and formed on the side surfaces of the gate electrode 110 in a cross section taken along the channel length direction. The low-resistance regions 106c include at least a metal element included in the metal oxide insulating films 114.

In addition, the protective insulating film 116 formed over the metal oxide insulating films 114, the sidewall insulating film 112, and the gate electrode 110, the interlayer insulating film 118 formed over the protective insulating film 116, and the source electrode 120a and the drain electrode 120b electrically connected to the low-resistance regions 106c may be included.

Note that as illustrated in FIG. 17B, the gate insulating film 108 preferably has a stacked structure of the first gate insulating film 108a and the second gate insulating film 108b. In the stacked structure of the gate insulating film 108, the first gate insulating film 108a is an oxide film containing excess oxygen and the second gate insulating film 108b is an insulating film having a blocking function, whereby oxygen can be supplied to the oxide semiconductor film 106 (particularly the channel formation region 106a), and an impurity can be prevented from entering the oxide semiconductor film 106 (particularly the channel formation region 106a) or oxygen can be prevented from being released upward from the first gate insulating film 108a. For example, a silicon oxynitride film can be used as the first gate insulating film 108a and an aluminum oxide film can be used as the second gate insulating film 108b.

The oxide semiconductor film 106 includes the impurity region 106b having resistance different from that of the low-resistance regions 106c between the channel formation region 106a and each of the low-resistance regions 106c. The low-resistance regions 106c and the impurity regions 106b can be formed in a self-aligned manner. Specifically, after the oxide semiconductor film 106 including the channel formation region 106a is formed, a stack of the gate insulating film 108 and the gate electrode 110 is formed over the oxide semiconductor film 106. Then, dopant is selectively introduced into the oxide semiconductor film 106 through the gate insulating film 108 with the use of the gate electrode 110 as a mask, so that the impurity regions 106b are formed. After that, the sidewall insulating film 112 is formed on the side surfaces of the gate electrode 110 in a cross section taken along the channel length direction. Then, part of the gate insulating film 108 is removed with the use of the gate electrode 110 and the sidewall insulating film 112 as masks; thus, a surface of the oxide semiconductor film 106 is exposed. After that, a metal film is formed in contact with part of the oxide semiconductor film and heat treatment is performed in the state where the oxide semiconductor film 106 is in contact with the metal film so that a metal element is introduced into the oxide semiconductor film 106 from the metal film; thus, the low-resistance regions 106c including the metal element can be formed. Further, the metal film which is in contact with the oxide film 104 and the oxide semiconductor film 106 is selectively oxidized by the heat treatment, whereby the metal oxide insulating films 114 are formed. The metal film is removed.

With such a structure, the low-resistance regions 106c and the impurity regions 106b are formed in the oxide semiconductor film 106 in a self-aligned manner, and the metal oxide insulating films 114 are formed over the low-resistance regions 106c. The metal oxide insulating films 114 can effectively prevent entry of an impurity to the oxide semiconductor film 106 or release of oxygen included in the oxide film 104 and the oxide semiconductor film 106. Further, since the metal film is removed, unnecessary capacitance due to the metal film is not formed.

Further, in the oxide semiconductor film 106, the impurity region 106b having resistance different from that of the low-resistance regions 106c is formed between the channel formation region 106a and each of the low-resistance regions 106c. The low-resistance regions 106c are, in other words, regions into which an impurity imparting n-type conductivity to the oxide semiconductor film 106 is introduced at high concentration. The impurity regions 106b are, in other words, regions into which an impurity imparting n-type conductivity to the oxide semiconductor film 106 is introduced at low concentration. With such a structure, a potential difference between the source and the drain which are associated with the channel formation region 106a can be reduced, and the semiconductor device can be highly reliable.

The shapes of the gate electrode 110 and the sidewall insulating film 112 of the semiconductor device in this embodiment are different from those of the semiconductor device in Embodiment 1.

Note that components that can be used for the semiconductor device in this embodiment can be similar to that in Embodiment 1; therefore, components that are different from the components in Embodiment 1 will be described below.

The gate electrode 110 can be formed using a resist mask which is formed by a photolithography method or the like and subjected to a slimming process to have a finer pattern. As the slimming process, an ashing process in which oxygen in a radical state (oxygen radical) or the like is used can be employed, for example. Note that Embodiment 2 and Embodiment 4 can be referred to for the method for forming the impurity regions 106b.

The sidewall insulating film 112 can be formed by etching with the use of a resist mask formed by a photolithography method or the like. The sidewall insulating film 112 needs to be formed in contact with at least the side surfaces of the gate electrode 110, and a structure in which an upper surface of the gate electrode 110 is covered with the sidewall insulating film 112, which is illustrated in FIG. 17B, is also an allowable structure of the sidewall insulating film 112.

As in the semiconductor device illustrated in FIGS. 17A and 17B, the gate electrode 110 is preferably reduced in size because a transistor can be miniaturized. Further, it is more preferable that contact regions of the low-resistance regions 106c and the source and drain electrodes 120a and 120b be made closer to the gate electrode 110 in accordance with reduction of the gate electrode 110 in size as appropriate.

Next, a structure of a semiconductor device, which is different from that of the semiconductor device described in Embodiment 1, will be described below with reference to FIGS. 18A and 18B.

<Structure Example 6 of Semiconductor Device>

Figure 18A:
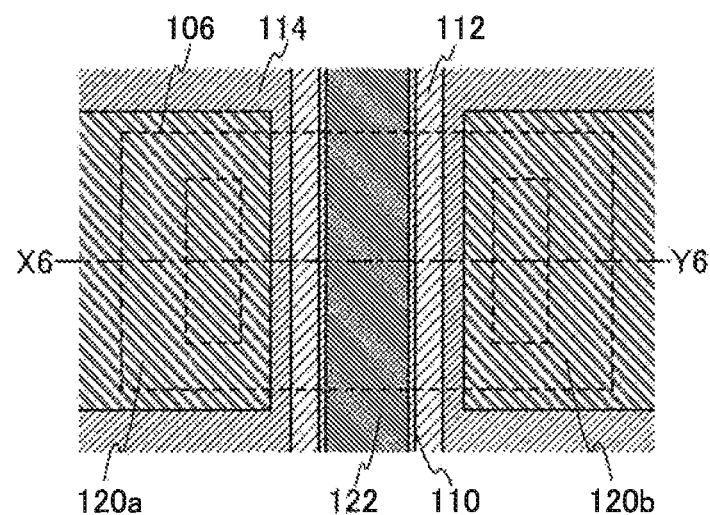
FIGS. 18A and 18B are a plan view and a cross-sectional view illustrating an embodiment of a semiconductor device.
Figure 18B:
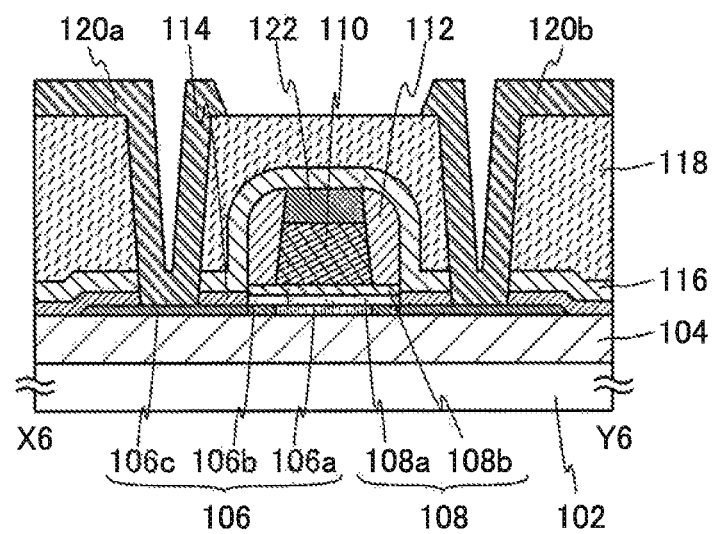

FIGS. 18A and 18B are a plan view and a cross-sectional view of a top-gate self-aligned transistor as an example of a semiconductor device. FIG. 18A is a plan view and FIG. 18B is a cross-sectional view taken along line X6-Y6 in FIG. 18A. Note that in FIG. 18A, some components of the transistor (e.g., the gate insulating film 108) are not illustrated for simplification.

The semiconductor device illustrated in FIGS. 18A and 18B includes the substrate 102, the oxide film 104 formed over the substrate 102, the oxide semiconductor film 106 which is formed over the oxide film 104 and includes the channel formation region 106a and the low-resistance regions 106c having resistance lower than that of the channel formation region 106a, the metal oxide insulating films 114 formed in contact with the low-resistance regions 106c, the gate insulating film 108 formed over the oxide semiconductor film 106, the gate electrode 110 which is formed in contact with the gate insulating film 108 and overlaps with the channel formation region 106a, an insulating film 122 formed over the gate electrode 110, and the sidewall insulating films 112 which are formed over the gate insulating film 108 and formed on side surfaces of the gate electrode 110 and the insulating film 122 in a cross section taken along the channel length direction. The low-resistance regions 106c include at least a metal element included in the metal oxide insulating films 114.

In addition, the protective insulating film 116 formed over the metal oxide insulating films 114, the sidewall insulating films 112, and the insulating film 122, the interlayer insulating film 118 formed over the protective insulating film 116, and the source electrode 120a and the drain electrode 120b electrically connected to the low-resistance regions 106c may be included.

Note that as illustrated in FIG. 18B, the gate insulating film 108 preferably has a stacked structure of the first gate insulating film 108a and the second gate insulating film 108b. In the stacked structure of the gate insulating film 108, the first gate insulating film 108a is an oxide film containing excess oxygen and the second gate insulating film 108b is an insulating film having a blocking function, whereby oxygen can be supplied to the oxide semiconductor film 106 (particularly the channel formation region 106a), and an impurity can be prevented from entering the oxide semiconductor film 106 (particularly the channel formation region 106a) or oxygen can be prevented from being released upward from the first gate insulating film 108a. For example, a silicon oxynitride film can be used as the first gate insulating film 108a and an aluminum oxide film can be used as the second gate insulating film 108b.

The oxide semiconductor film 106 includes the impurity region 106b having resistance different from that of the low-resistance regions 106c between the channel formation region 106a and each of the low-resistance regions 106c. The low-resistance regions 106c and the impurity regions 106b can be formed in a self-aligned manner. Specifically, after the oxide semiconductor film 106 including the channel formation region 106a is formed, a stack of the gate insulating film 108, the gate electrode 110, and the insulating film 122 is formed over the oxide semiconductor film 106. Then, dopant is selectively introduced into the oxide semiconductor film 106 through the gate insulating film 108 with the use of the gate electrode 110 and the insulating film 122 as masks, so that the impurity regions 106b are formed. After that, the sidewall insulating films 112 are formed on the side surfaces of the gate electrode 110 and the insulating film 122 in a cross section taken along the channel length direction. Then, part of the gate insulating film 108 is removed with the use of the gate electrode 110, the insulating film 122, and the sidewall insulating films 112 as masks; thus, a surface of the oxide semiconductor film 106 is exposed. After that, a metal film is formed in contact with part of the oxide semiconductor film and heat treatment is performed in the state where the oxide semiconductor film 106 is in contact with the metal film so that a metal element is introduced into the oxide semiconductor film 106 from the metal film; thus, the low-resistance regions 106c including the metal element can be formed. Further, the metal film which is in contact with the oxide film 104 and the oxide semiconductor film 106 is selectively oxidized by the heat treatment, whereby the metal oxide insulating films 114 are formed. The metal film is removed.

With such a structure, the low-resistance regions 106c and the impurity regions 106b are formed in the oxide semiconductor film 106 in a self-aligned manner, and the metal oxide insulating films 114 are formed over the low-resistance regions 106c. The metal oxide insulating films 114 can effectively prevent entry of an impurity to the oxide semiconductor film 106 or release of oxygen included in the oxide film 104 and the oxide semiconductor film 106. Further, since the metal film is removed, unnecessary capacitance due to the metal film is not formed.

Further, in the oxide semiconductor film 106, the impurity region 106b having resistance different from that of the low-resistance regions 106c is formed between the channel formation region 106a and each of the low-resistance regions 106c. The low-resistance regions 106c are, in other words, regions into which an impurity imparting n-type conductivity to the oxide semiconductor film 106 is introduced at high concentration. The impurity regions 106b are, in other words, regions into which an impurity imparting n-type conductivity to the oxide semiconductor film 106 is introduced at low concentration. With such a structure, a potential difference between the source and the drain which are associated with the channel formation region 106a can be reduced, and the semiconductor device can be highly reliable.

The structure of the semiconductor device described in this embodiment is different from that of the semiconductor device described in Embodiment 1 in that the insulating film 122 is formed over the gate electrode 110. Further, the shapes of the sidewall insulating films 112 in this embodiment are different from those in Embodiment 1.

Note that components that can be used for the semiconductor device in this embodiment can be similar to that in Embodiment 1; therefore, a component that is different from the components in Embodiment 1 will be described below.

[Detailed Description of Insulating Film]

The insulating film 122 is preferably formed using a material which does not react with the metal film to be formed later by heat treatment. For example, a single layer or a stacked layer using any of nitrides such as silicon nitride, aluminum nitride, and gallium nitride can be used. There is no particular limitation on a method for forming the insulating film 122, and a variety of film formation methods such as an evaporation method, a PE-CVD method, a sputtering method, and a spin coating method can be used.

In the formation of the metal oxide insulating films 114, the insulating film 122 can prevent the gate electrode 110 from being directly exposed to an etching gas, an etchant, or the like when the metal film is removed. Note that Embodiment 2 and Embodiment 4 can be referred to for the formation method of the impurity regions 106b.

As described in this embodiment, one of the technical ideas of the present invention is as follows. By reaction between an oxide semiconductor film and a metal film, low-resistance regions are formed in the oxide semiconductor film including a channel formation region in a self-aligned manner and part of the metal film is oxidized to form metal oxide insulating films for covering the low-resistance regions. Then, another part of the metal film, which is not oxidized, is removed. Thus, the metal oxide insulating films can prevent release of oxygen contained in an oxide film and the oxide semiconductor film. Further, since the metal film is removed, unnecessary capacitance due to the metal film is not formed. Accordingly, oxygen can be favorably supplied to the oxide semiconductor film including the channel formation region from the oxide film, and a transistor with stable electric characteristics can be provided.

The methods and structures described in this embodiment can be combined as appropriate with any of the methods and structures described in the other embodiments.

(Embodiment 6)

In this embodiment, an example of a structure which includes the semiconductor device described in this specification, can hold stored data even when not powered, and does not have a limitation on the number of write cycles will be described with reference to drawings.

Figure 19A:
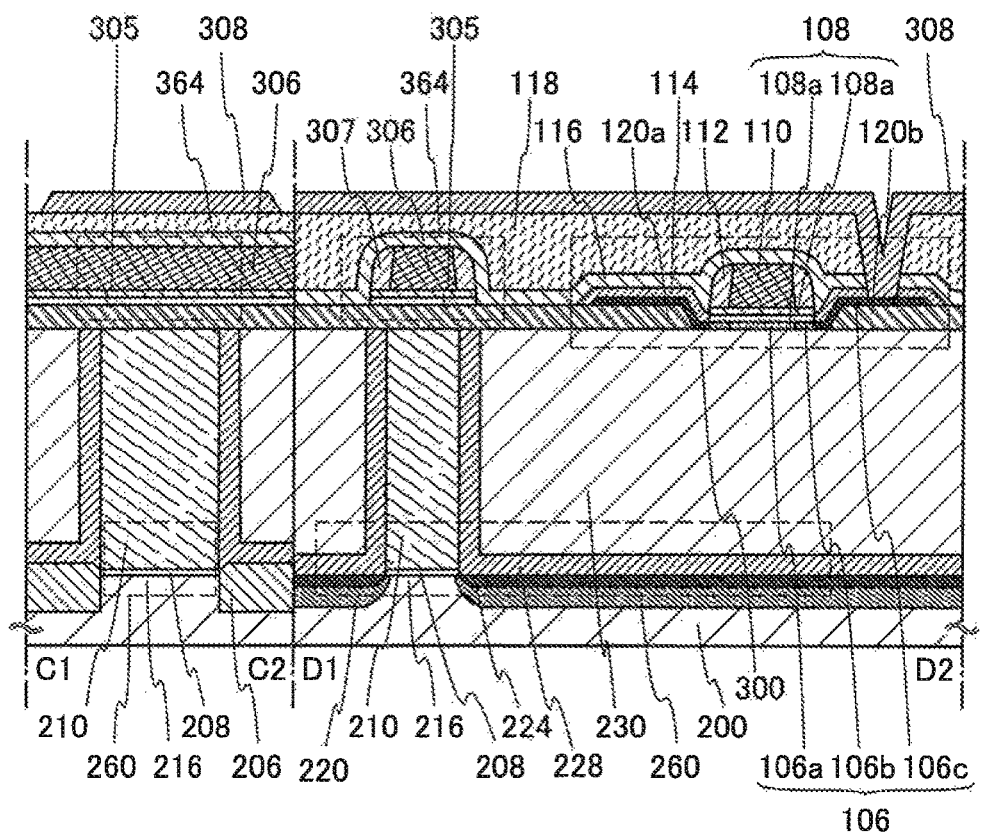
FIGS. 19A to 19C are a cross-sectional view, a plan view, and a circuit diagram illustrating an embodiment of a semiconductor device.
Figure 19B:
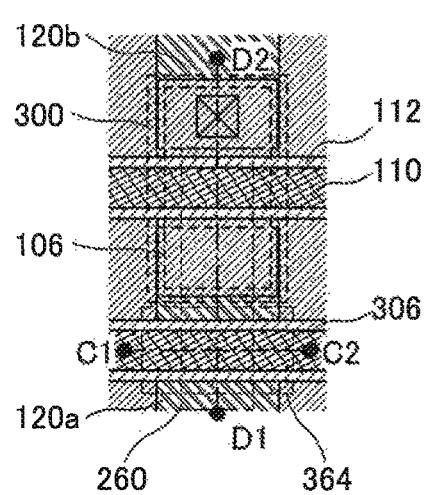
Figure 19C:
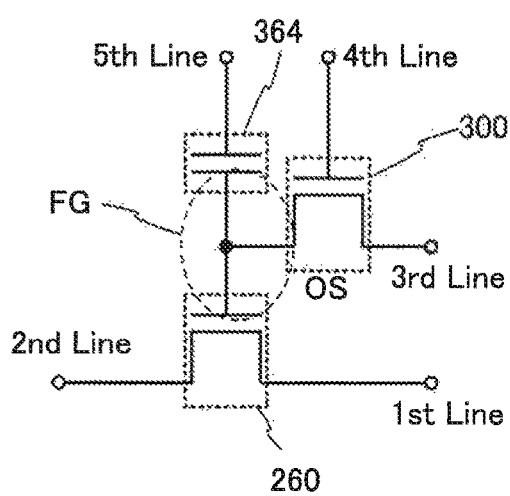

FIGS. 19A to 19C illustrate an example of a structure of the semiconductor device. FIGS. 19A to 19C illustrate a cross-sectional view, a plan view, and a circuit diagram, respectively, of the semiconductor device. Here, FIG. 19A corresponds to a cross section along line C1-C2 and line D1-D2 in FIG. 19B.

The semiconductor device illustrated in FIGS. 19A and 19B includes a transistor 260 including a first semiconductor material in a lower portion, and a transistor 300 including a second semiconductor material in an upper portion. As the transistor 300 including the second semiconductor material, the semiconductor device described in Embodiment 3 can be employed. Note that any of the semiconductor devices described in the other embodiments can also be employed.

Here, the first semiconductor material and the second semiconductor material are preferably materials having different band gaps. For example, the first semiconductor material can be a semiconductor material other than an oxide semiconductor (e.g., silicon) and the second semiconductor material can be an oxide semiconductor. A transistor including a material other than an oxide semiconductor, such as single crystal silicon, can operate at high speed easily. On the other hand, a transistor including an oxide semiconductor enables charge to be held for a long time owing to its characteristics.

Although all the transistors are n-channel transistors here, it is needless to say that p-channel transistors can be used.

The transistor 260 illustrated in FIG. 19A includes a channel formation region 216 provided in a substrate 200 including a semiconductor material (a single crystal semiconductor substrate in this embodiment), impurity regions 220 with the channel formation region 216 provided therebetween, intermetallic compound regions 224 in contact with the impurity regions 220, a gate insulating film 208 provided over the channel formation region 216, and a gate electrode 210 provided over the gate insulating film 208. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". That is, in this specification, the term "source electrode" may include a source region.

An element isolation insulating film 206 is provided over the substrate 200 so as to surround the transistor 260, and an insulating film 228 and an insulating film 230 are provided to cover the transistor 260. Note that for high integration, it is preferable that, as illustrated in FIG. 19A, the transistor 260 do not have a sidewall insulating film. On the other hand, when the characteristics of the transistor 260 have priority, the sidewall insulating film may be formed along a side surface of the gate electrode 210 and the impurity regions 220 may include a region having a different impurity concentration.

The transistor 260 formed using a single crystal semiconductor substrate can operate at high speed. Therefore, when the transistor is used as a reading transistor, data can be read at high speed. Insulating films are formed so as to cover the transistor 260 after the transistor 260 is formed, and then the transistor 300 can be formed. As treatment prior to formation of the transistor 300, CMP treatment is performed on the insulating films, whereby the insulating film 228 and the insulating film 230 which are planarized are formed and, at the same time, an upper surface of the gate electrode 210 is exposed.

As the insulating film 228, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used typically. As the insulating film 230, a silicon oxide film, a silicon oxynitride film, or a silicon nitride oxide film can be used. The insulating film 228 and the insulating film 230 can be formed by a plasma CVD method, a sputtering method, or the like.

Alternatively, an organic material such as a polyimide-based resin, an acrylic-based resin, or a benzocyclobutene-based resin can be used for the insulating film 228. Other than such organic materials, it is also possible to use a low-dielectric constant material (a low-k material) or the like. In the case of using an organic material, the insulating film 228 may be formed by a wet method such as a spin coating method or a printing method.

Note that in this embodiment, a silicon nitride film is used as the insulating film 228, and a silicon oxide film is used as the insulating film 230.

The oxide semiconductor film 106, the source electrode 120a, and the drain electrode 120b are formed over the insulating film 230 which is sufficiently planarized by polishing treatment (such as CMP treatment). Note that the average plane roughness of a surface of the insulating film 230 is preferably less than or equal to 0.15 nm.

The transistor 300 illustrated in FIG. 19A includes an oxide semiconductor film in the channel formation region. Here, the oxide semiconductor film 106 included in the transistor 300 is preferably highly purified. By using a highly purified oxide semiconductor, the transistor 300 can have extremely favorable off-state current characteristics.

The transistor 300 includes the source electrode 120a and the drain electrode 120b formed over the insulating film 230, the oxide semiconductor film 106 which is formed over the insulating film 230, the source electrode 120a, and the drain electrode 120b and includes the channel formation region 106a and the low-resistance regions 106c having resistance lower than that of the channel formation region 106a, the metal oxide insulating films 114 formed in contact with the low-resistance regions 106c, the gate insulating film 108 formed over the oxide semiconductor film 106, the gate electrode 110 which is formed in contact with the gate insulating film 108 and overlaps with the channel formation region 106a, the sidewall insulating films 112 which are formed over the gate insulating film 108 and formed on the side surfaces of the gate electrode 110 in a cross section taken along the channel length direction, and the protective insulating film 116 formed over the metal oxide insulating films 114, the sidewall insulating films 112, and the gate electrode 110. The low-resistance regions 106c include at least a metal element included in the metal oxide insulating films 114. Further, the interlayer insulating film 118 is formed over the protective insulating film 116.

The source electrode 120a and the drain electrode 120b are electrically connected to the low-resistance regions 106c. Further, in the oxide semiconductor film 106, the impurity region 106b having resistance different from that of the low-resistance regions 106c is formed between the channel formation region 106a and each of the low-resistance regions 106c.

Note that as illustrated in FIG. 19A, the gate insulating film 108 preferably has a stacked structure of the first gate insulating film 108a and the second gate insulating film 108b. In the stacked structure of the gate insulating film 108, the first gate insulating film 108a is an oxide film containing excess oxygen and the second gate insulating film 108b is an insulating film having a blocking function, whereby oxygen can be supplied to the oxide semiconductor film 106 (particularly the channel formation region 106a), and an impurity can be prevented from entering the oxide semiconductor film 106 (particularly the channel formation region 106a) or oxygen can be prevented from being released upward from the first gate insulating film 108a. For example, a silicon oxynitride film can be used as the first gate insulating film 108a and an aluminum oxide film can be used as the second gate insulating film 108b.

Since the off-state current of the transistor 300 is small, stored data can be held for a long time by using this transistor. In other words, power consumption can be sufficiently reduced because a semiconductor memory device in which refresh operation is unnecessary or the frequency of refresh operation is extremely low can be provided.

Further, in a region overlapping with the source electrode 120a of the transistor 300, an insulating film 305 formed in the same step as the gate insulating film 108 (the first gate insulating film 108a and the second gate insulating film 108b), and a conductive film 306 formed in the same step as the gate electrode 110 are formed. The source electrode 120a, the insulating film 305, and the conductive film 306 form a capacitor 364. In other words, the source electrode 120a of the transistor 300 serves as one electrode of the capacitor 364, and the conductive film 306 serves as the other electrode of the capacitor 364. Note that in the case where a capacitor is not needed, the capacitor 364 may be omitted. Alternatively, the capacitor 364 may be separately formed over the transistor 300.

Insulating films 307 formed in the same step as the sidewall insulating films 112 of the transistor 300 are provided on side surfaces of the conductive film 306.

The protective insulating film 116 and the interlayer insulating film 118 are provided over the transistor 300 and the capacitor 364, and a wiring 308 for connecting the transistor 300 to another transistor is provided over the interlayer insulating film 118. The wiring 308 is formed in an opening portion formed in the protective insulating film 116, the interlayer insulating film 118, and the like, and is electrically connected to the drain electrode 120b through the low-resistance region 106c.

In FIGS. 19A and 19B, the transistor 260 and the transistor 300 are provided so as to at least partly overlap with each other. The source region or the drain region of the transistor 260 is preferably provided so as to overlap with part of the oxide semiconductor film 106. Further, the transistor 300 and the capacitor 364 are provided so as to overlap with at least part of the transistor 260. For example, the conductive film 306 of the capacitor 364 is provided so as to overlap with at least part of the gate electrode 210 of the transistor 260. With such a planar layout, the area occupied by the semiconductor device can be reduced; thus, higher integration can be achieved.

Next, an example of a circuit configuration corresponding to FIGS. 19A and 19B is illustrated in FIG. 19C.

In FIG. 19C, a first wiring (1st Line) is electrically connected to one of the source electrode and the drain electrode of the transistor 260, and a second wiring (2nd Line) is electrically connected to the other of the source electrode and the drain electrode of the transistor 260. A third wiring (3rd Line) is electrically connected to one of the source electrode and the drain electrode of the transistor 300, and a fourth wiring (4th Line) is electrically connected to a gate electrode of the transistor 300. The gate electrode of the transistor 260 and the other of the source electrode and the drain electrode of the transistor 300 are electrically connected to one electrode of the capacitor 364. A fifth wiring (5th Line) is electrically connected to the other electrode of the capacitor 364.

The semiconductor device having the circuit configuration in FIG. 19C utilizes a characteristic in which the potential of the gate electrode of the transistor 260 can be held, and can thus write, hold, and read data as follows.

Writing and holding of data will be described. The potential of the fourth wiring is set to a potential at which the transistor 300 is turned on, whereby the transistor 300 is turned on. Thus, the potential of the third wiring is supplied to the gate electrode of the transistor 260 and the capacitor 364. In other words, a predetermined charge is supplied to the gate electrode of the transistor 260 (i.e., writing of data). Here, charge for supply of a potential level or charge for supply of a different potential level (hereinafter referred to as Low level charge and High level charge) is given. After that, the potential of the fourth wiring is set to a potential at which the transistor 300 is turned off, so that the transistor 300 is turned off. Thus, the charge given to the gate electrode of the transistor 260 is held (holding).

Since the off-state current of the transistor 300 is extremely small, the charge of the gate electrode of the transistor 260 is held for a long time.

Next, reading of data is described. By supplying an appropriate potential (reading potential) to the fifth wiring while a predetermined potential (constant potential) is supplied to the first wiring, the potential of the second wiring varies depending on the amount of charge held in the gate electrode of the transistor 260. This is because in general, when the transistor 260 is an n-channel transistor, an apparent threshold voltage $V_{th\_H}$ in the case where High level charge is given to the gate electrode of the transistor 260 is lower than an apparent threshold voltage $V_{th\_L}$ in the case where Low level charge is given to the gate electrode of the transistor 260. Here, an apparent threshold voltage refers to the potential of the fifth wiring, which is needed to turn on the transistor 260. Thus, the potential of the fifth wiring is set to a potential $V_0$ existing between $V_{th\_H}$ and $V_{th\_L}$, whereby charge given to the gate electrode of the transistor 260 can be determined. For example, in the case where High level charge is given in writing, when the potential of the fifth wiring is set to $V_0$ ($>V_{th\_H}$), the transistor 260 is turned on. In the case where Low level charge is given in writing, even when the potential of the fifth wiring is set to $V_0$ ($<V_{th\_L}$), the transistor 260 remains in an off state. Therefore, the stored data can be read by the potential of the second wiring.

Note that in the case where memory cells are arrayed to be used, only data of desired memory cells needs to be read. In the case where data is not read, a potential at which the transistor 260 is turned off regardless of the state of the gate electrode, that is, a potential lower than $V_{th\_H}$ may be supplied to the fifth wiring. Alternatively, a potential at which the transistor 260 is turned on regardless of the state of the gate electrode, that is, a potential higher than $V_{th\_L}$ may be supplied to the fifth wiring.

When a transistor having a channel formation region formed using an oxide semiconductor and having extremely small off-state current is used in the semiconductor device in this embodiment, the semiconductor device can store data for an extremely long time. In other words, power consumption can be adequately reduced because refresh operation becomes unnecessary or the frequency of refresh operation can be extremely low. Moreover, stored data can be held for a long time even when power is not supplied (note that a potential is preferably fixed).

Further, in the semiconductor device in this embodiment, a high voltage is not needed for writing data and there is no problem of deterioration of elements. For example, unlike in a conventional non-volatile memory, it is not necessary to inject and extract electrons into and from a floating gate, and thus a problem such as deterioration of a gate insulating layer does not occur at all. In other words, the semiconductor device according to an embodiment of the present invention does not have a limit on the number of times of writing, which is a problem in a conventional non-volatile memory, and reliability thereof is drastically improved. Furthermore, data is written depending on the on state and the off state of the transistor, whereby high-speed operation can be easily achieved.

The method and structure described in this embodiment can be combined as appropriate with any of the methods and structures described in the other embodiments.

(Embodiment 7)

In this embodiment, a structure which includes the semiconductor device described in any of Embodiments 1 to 5, can hold stored data even when not powered, does not have a limitation on the number of write cycles, and is different from the structure described in Embodiment 6, is described with reference to FIGS. 20A and 20B and FIGS. 21A and 21B.

Figure 20A:
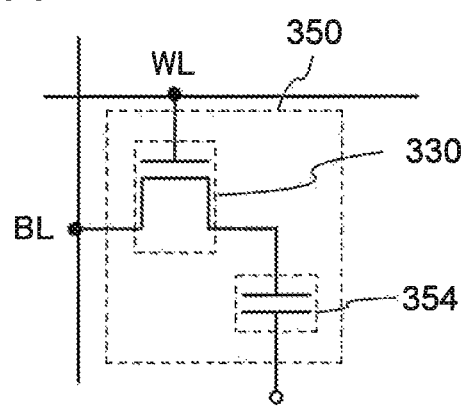
FIGS. 20A and 20B are a circuit diagram and a perspective view illustrating an embodiment of a semiconductor device.
Figure 20B:
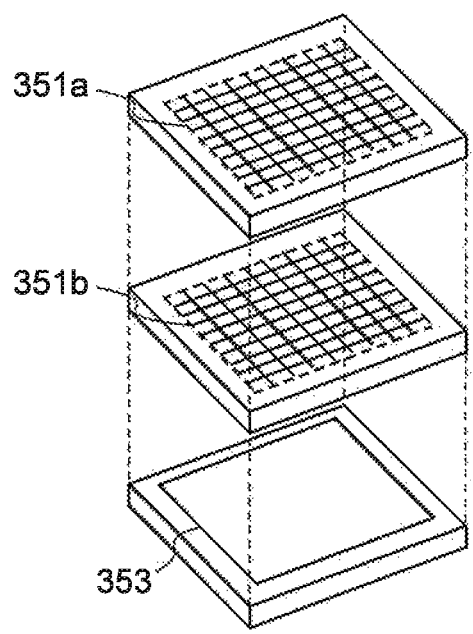

FIG. 20A illustrates an example of a circuit configuration of a semiconductor device, and FIG. 20B is a conceptual diagram illustrating an example of a semiconductor device. First, the semiconductor device illustrated in FIG. 20A will be described, and then, the semiconductor device illustrated in FIG. 20B will be described.

In the semiconductor device illustrated in FIG. 20A, a bit line BL is electrically connected to a source electrode or a drain electrode of a transistor 330, a word line WL is electrically connected to a gate electrode of the transistor 330, and the source electrode or the drain electrode of the transistor 330 is electrically connected to a first terminal of a capacitor 354.

The transistor 330 including an oxide semiconductor has extremely small off-state current. For that reason, the potential of the first terminal of the capacitor 354 (or a charge accumulated in the capacitor 354) can be held for an extremely long time by turning off the transistor 330.

Next, writing and holding of data in the semiconductor device (a memory cell 350) illustrated in FIG. 20A will be described.

First, the potential of the word line WL is set to a potential at which the transistor 330 is turned on, so that the transistor 330 is turned on. Accordingly, the potential of the bit line BL is supplied to the first terminal of the capacitor 354 (writing). After that, the potential of the word line WL is set to a potential at which the transistor 330 is turned off, so that the transistor 330 is turned off Thus, the potential of the first terminal of the capacitor 354 is held (holding).

Because the off-state current of the transistor 330 is extremely small, the potential of the first terminal of the capacitor 354 (or the charge accumulated in the capacitor) can be held for a long time.

Secondly, reading of data will be described. When the transistor 330 is turned on, the bit line BL which is in a floating state and the capacitor 354 are electrically connected to each other, and the charge is redistributed between the bit line BL and the capacitor 354. As a result, the potential of the bit line BL is changed. The amount of change in potential of the bit line BL fluctuates depending on the potential of the first terminal of the capacitor 354 (or the charge accumulated in the capacitor 354).

For example, the potential of the bit line BL after charge redistribution is $(CB \times VB0 + C \times V)/(CB+C)$, where V is the potential of the first terminal of the capacitor 354, C is the capacitance of the capacitor 354, CB is the capacitance of the bit line BL (hereinafter also referred to as bit line capacitance), and VB0 is the potential of the bit line BL before the charge redistribution. Therefore, it can be found that assuming that the memory cell 350 is in either of two states in which the potentials of the first terminal of the capacitor 354 are V1 and V0 (V1>V0), the potential of the bit line BL in the case of holding the potential V1 ($=(CB \times VB0 + C \times V1)/(CB+C)$) is higher than the potential of the bit line BL in the case of holding the potential V0 ($=(CB \times VB0 + C \times V0)/(CB+C)$).

By comparing the potential of the bit line BL with a predetermined potential, data can be read.

As described above, the semiconductor device illustrated in FIG. 20A can hold charge that is accumulated in the capacitor 354 for a long time because the off-state current of the transistor 330 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 20B will be described.

The semiconductor device illustrated in FIG. 20B includes memory cell arrays 351a and 351b including a plurality of memory cells 350 illustrated in FIG. 20A as a memory circuit in an upper portion, and a peripheral circuit 353 in a lower portion which is necessary for operation of the memory cell arrays 351a and 351b. Note that the peripheral circuit 353 is electrically connected to the memory cell arrays 351a and 351b.

In the structure illustrated in FIG. 20B, the peripheral circuit 353 can be provided under the memory cell arrays 351a and 351b. Thus, the size of the semiconductor device can be decreased.

It is preferable that a semiconductor material of the transistor provided in the peripheral circuit 353 be different from that of the transistor 330. For example, silicon, germanium, silicon germanium, silicon carbide, gallium arsenide, or the like can be used, and a single crystal semiconductor is preferably used. Alternatively, an organic semiconductor material or the like may be used. For example, a transistor including a single crystal semiconductor material can operate at sufficiently high speed. Therefore, a circuit (e.g., a logic circuit or a driver circuit) which needs to operate at high speed can be favorably achieved by the transistor.

Note that FIG. 20B illustrates, as an example, the semiconductor device in which two memory cell arrays of the memory cell arrays 351a and 351b are stacked; however, the number of memory cells to be stacked is not limited thereto. Three or more memory cell arrays may be stacked.

Next, a specific structure of the memory cell 350 illustrated in FIG. 20A will be described with reference to FIGS. 21A and 21B.

Figure 21A:
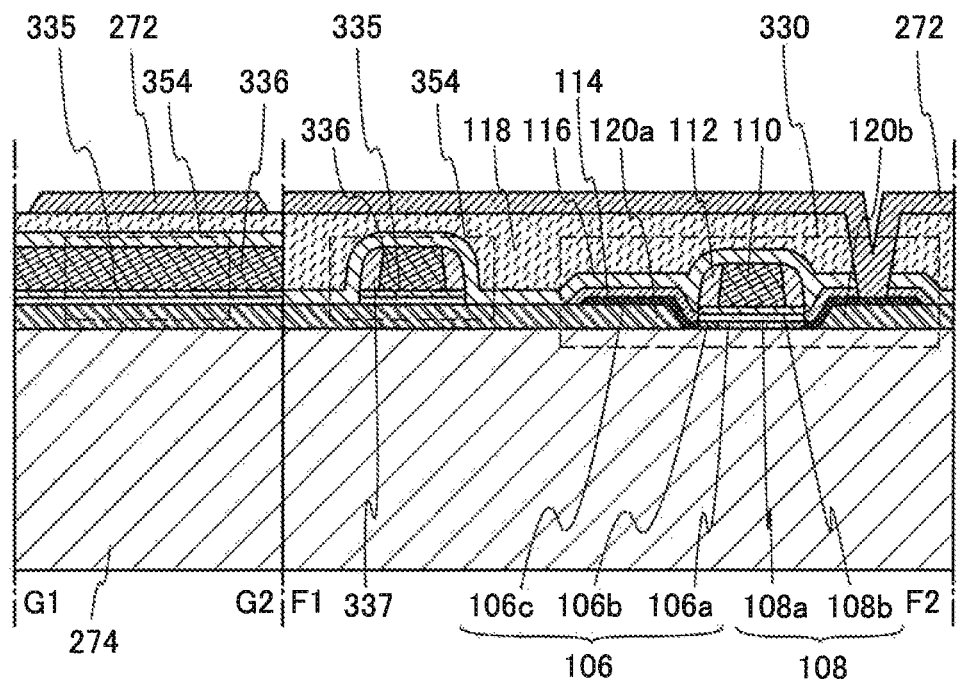
FIGS. 21A and 21B are a cross-sectional view and a plan view illustrating an embodiment of a semiconductor device.
Figure 21B:
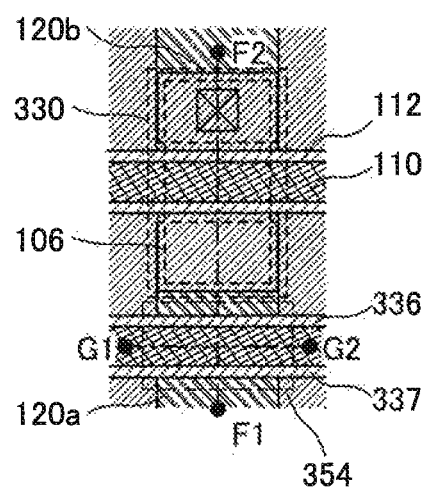

FIGS. 21A and 21B illustrate an example of a structure of the memory cell 350. FIG. 21A is a cross-sectional view of the memory cell 350, and FIG. 21B is a plan view of the memory cell 350. Here, FIG. 21A corresponds to a cross section taken along line F1-F2 and line G1-G2 in FIG. 21B.

The transistor 330 illustrated in FIGS. 21A and 21B can have the same structure as the transistor in Embodiment 3. Note that any of the structures of the transistors described in the other Embodiments may be employed.

The transistor 330 includes the source electrode 120a and the drain electrode 120b formed over an insulating film 274, the oxide semiconductor film 106 which is formed over the insulating film 274, the source electrode 120a, and the drain electrode 120b and includes the channel formation region 106a and the low-resistance regions 106c having resistance lower than that of the channel formation region 106a, the metal oxide insulating films 114 formed in contact with the low-resistance regions 106c, the gate insulating film 108 formed over the oxide semiconductor film 106, the gate electrode 110 which is formed in contact with the gate insulating film 108 and overlaps with the channel formation region 106a, the sidewall insulating films 112 which are formed over the gate insulating film 108 and formed on the side surfaces of the gate electrode 110 in a cross section taken along the channel length direction, and the protective insulating film 116 formed over the metal oxide insulating films 114, the sidewall insulating films 112, and the gate electrode 110. The low-resistance regions 106c include at least a metal element included in the metal oxide insulating films 114. Further, the interlayer insulating film 118 is formed over the protective insulating film 116.

The source electrode 120a and the drain electrode 120b are electrically connected to the low-resistance regions 106c. Further, in the oxide semiconductor film 106, the impurity region 106b having resistance different from that of the low-resistance regions 106c is formed between the channel formation region 106a and each of the low-resistance regions 106c.

Note that as illustrated in FIG. 21A, the gate insulating film 108 preferably has a stacked structure of the first gate insulating film 108a and the second gate insulating film 108b. In the stacked structure of the gate insulating film 108, the first gate insulating film 108a is an oxide film containing excess oxygen and the second gate insulating film 108b is an insulating film having a blocking function, whereby oxygen can be supplied to the oxide semiconductor film 106 (particularly the channel formation region 106a), and an impurity can be prevented from entering the oxide semiconductor film 106 (particularly the channel formation region 106a) or oxygen can be prevented from being released upward from the first gate insulating film 108a. For example, a silicon oxynitride film can be used as the first gate insulating film 108a and an aluminum oxide film can be used as the second gate insulating film 108b.

Since the off-state current of the transistor 330 is small, stored data can be held for a long time by using this transistor. In other words, power consumption can be sufficiently reduced because a semiconductor memory device in which refresh operation is unnecessary or the frequency of refresh operation is extremely low can be provided.

Further, in a region overlapping with the source electrode 120a of the transistor 330, an insulating film 335 formed in the same step as the gate insulating film 108 (the first gate insulating film 108a and the second gate insulating film 108b) and a conductive film 336 formed in the same step as the gate electrode 110 are formed. The source electrode 120a, the insulating film 335, and the conductive film 336 form a capacitor 354. In other words, the source electrode 120a of the transistor 330 serves as one electrode of the capacitor 354, and the conductive film 336 serves as the other electrode of the capacitor 354. Note that in the case where a capacitor is not needed, the capacitor 354 may be omitted. Alternatively, the capacitor 354 may be separately formed over the transistor 330.

Insulating films 337 formed in the same step as the sidewall insulating films 112 of the transistor 330 are provided on side surfaces of the conductive film 336.

The protective insulating film 116 and the interlayer insulating film 118 are provided over the transistor 330 and the capacitor 354, and a wiring 272 connected to an adjacent memory cell is provided over the interlayer insulating film 118. The wiring 272 is formed in an opening portion formed in the interlayer insulating film 118, the protective insulating film 116, and the metal oxide insulating film 114, and is electrically connected to the drain electrode 120b of the transistor 330 through the low-resistance region 106c. Note that the wiring 272 may be directly connected to the drain electrode 120b. The wiring 272 corresponds to the bit line BL in the circuit diagram in FIG. 20A.

In FIGS. 21A and 21B, the drain electrode 120b of the transistor 330 can also function as a source electrode of a transistor included in an adjacent memory cell. With such a planar layout, the area occupied by the semiconductor device can be reduced; thus, higher integration can be achieved.

As described above, the plurality of memory cells formed in multiple layers each include a transistor including an oxide semiconductor. Since the off-state current of the transistor including an oxide semiconductor is small, stored data can be held for a long time by using this transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a miniaturized and highly integrated semiconductor device having stable electric characteristics can be provided.

This embodiment can be combined as appropriate with any of the methods and structures described in the other embodiments.

(Embodiment 8)

In this embodiment, examples of application of the semiconductor device described in any of the above embodiments to portable devices such as a mobile phone, a smartphone, and an e-book reader will be described with reference to FIGS. 22A and 22B, FIG. 23, FIG. 24, and FIG. 25.

In portable devices such as a mobile phone, a smartphone, and an e-book reader, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 22A:
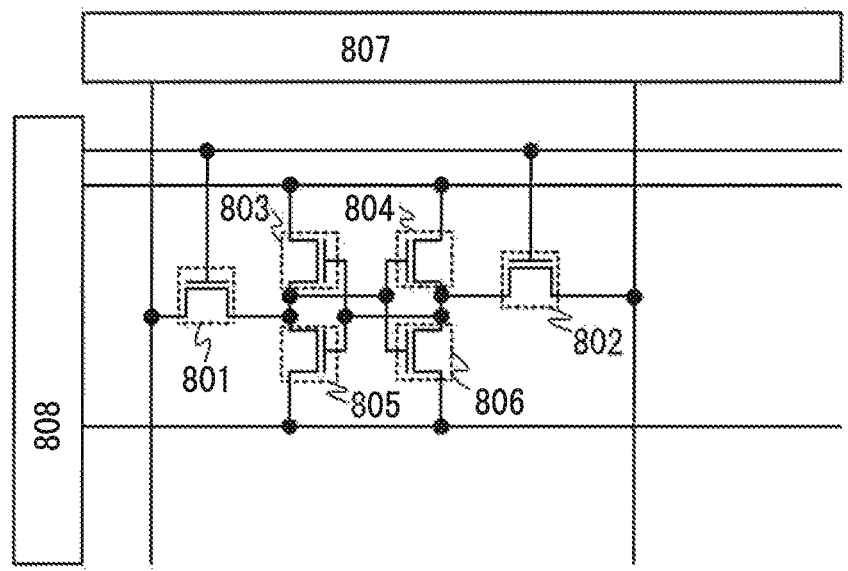
FIGS. 22A and 22B are each a circuit diagram illustrating an embodiment of a semiconductor device.

In an ordinary SRAM, as illustrated in FIG. 22A, one memory cell includes six transistors, that is, transistors 801 to 806, which are driven with an X decoder 807 and a Y decoder 808. The transistors 803 and 805, and the transistors 804 and 806 form inverters, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 22B:
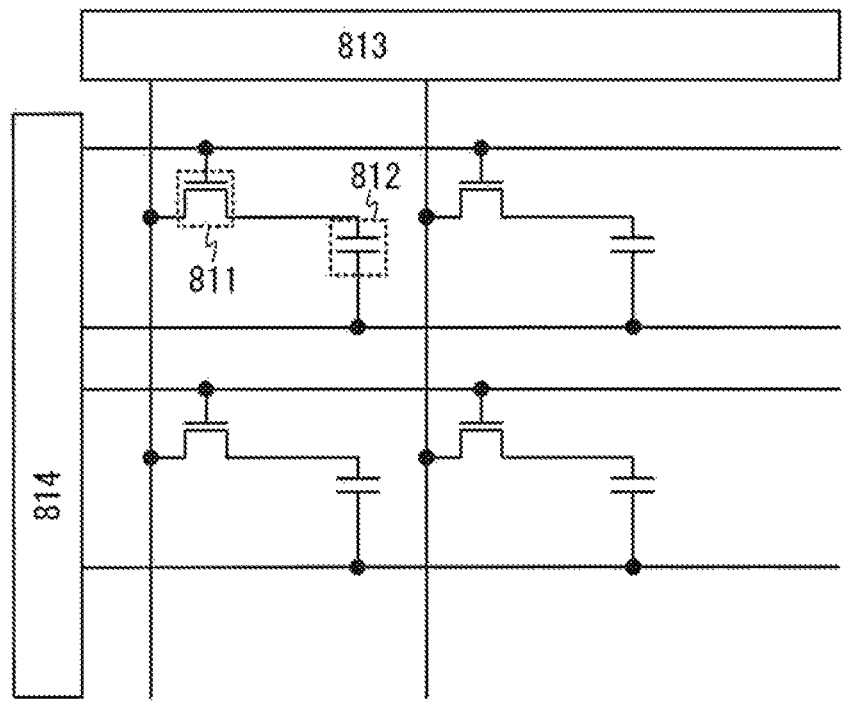

In contrast, in a DRAM, as illustrated in FIG. 22B, a memory cell includes a transistor 811 and a storage capacitor 812, which are driven with an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, the area of the memory cell of the semiconductor device described in any of the above embodiments is about 10 $F^2$ and frequent refreshing is not needed. Therefore, the area of the memory cell is reduced, and power consumption can be reduced.

Figure 23:
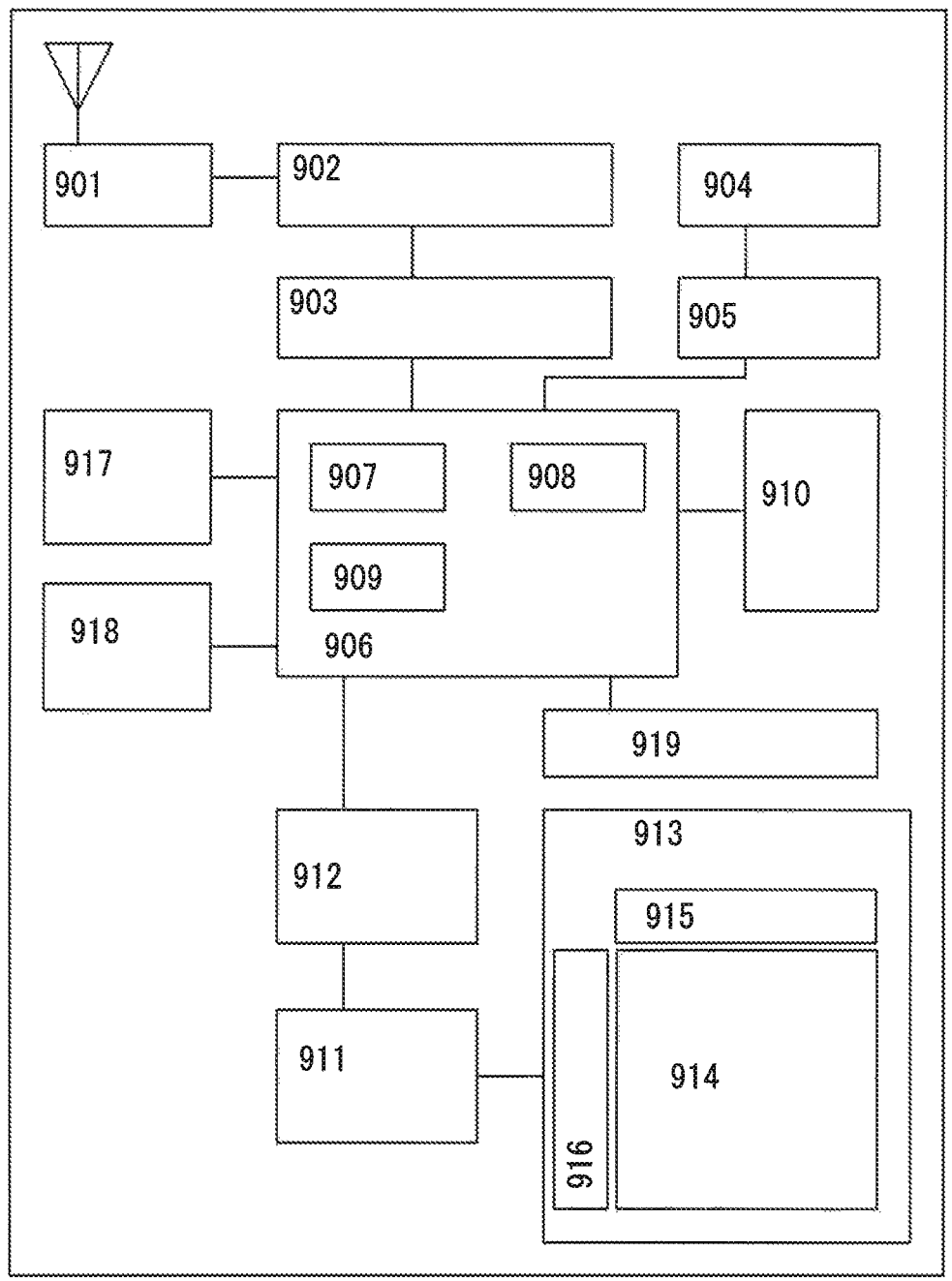
FIG. 23 is a block diagram illustrating an embodiment of a semiconductor device.

Next, FIG. 23 illustrates a block diagram of a portable device. A portable device shown in FIG. 23 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an IF 909. In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 24:
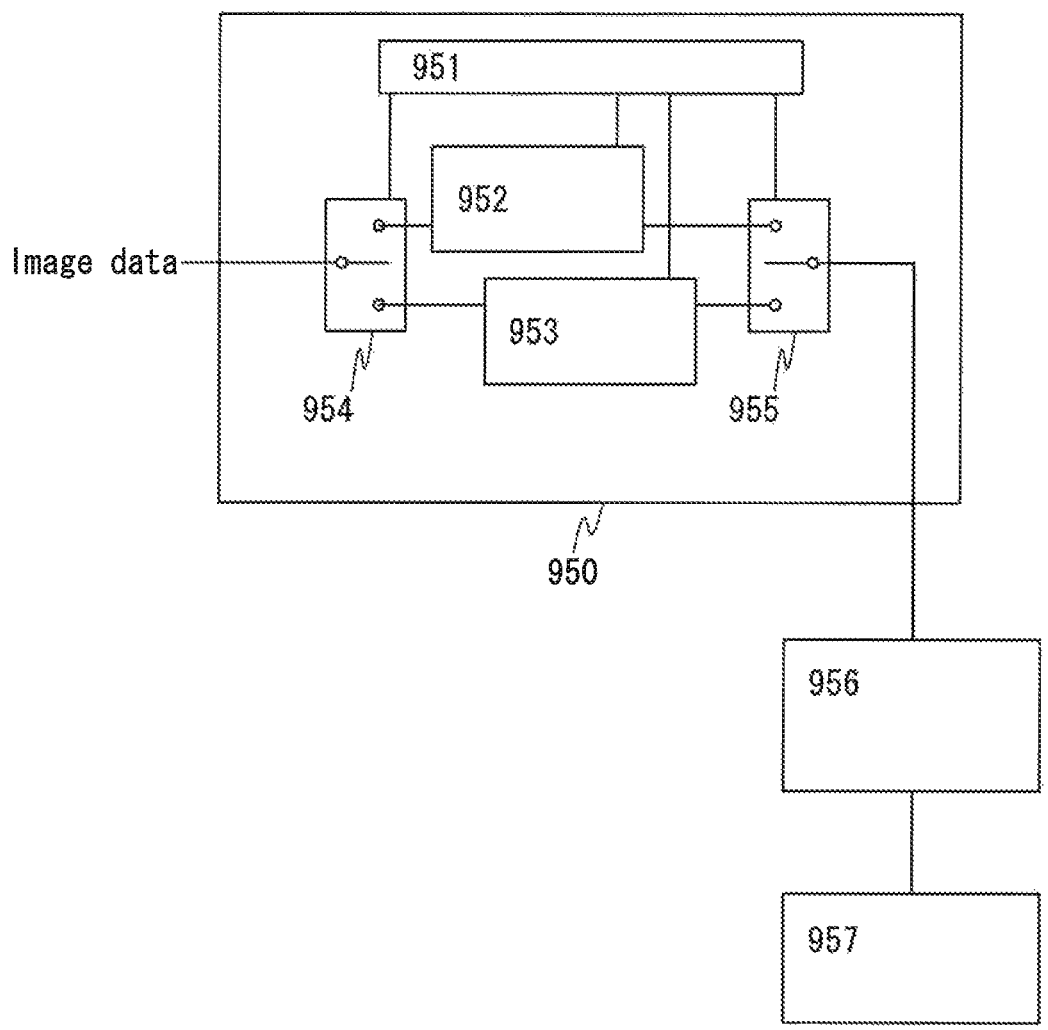
FIG. 24 is a block diagram illustrating an embodiment of a semiconductor device.

Next, FIG. 24 illustrates an example in which the semiconductor device described in any of the above embodiments is used for a memory circuit 950 in a display. The memory circuit 950 illustrated in FIG. 24 includes a memory 952, a memory 953, a switch 954, a switch 955, and a memory controller 951. Further, the memory circuit is connected to a display controller 956 which reads and controls image data input through a signal line (input image data) and data stored in the memory 952 and the memory 953 (stored image data), and is also connected to a display 957 which displays an image based on a signal from the display controller 956.

First, image data (input image data A) is formed by an application processor (not shown). The input image data A is stored in the memory 952 through the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is stored in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

Accordingly, image data is alternately written and read in the memories 952 and 953 so as to be displayed on the display 957. The memories 952 and 953 are not necessarily different memories, and a single memory may be divided to be used. By employing the semiconductor device described in any of the above embodiments for the memory 952 and the memory 953, data can be written and read at high speed and held for a long time, and power consumption can be sufficiently reduced.

Figure 25:
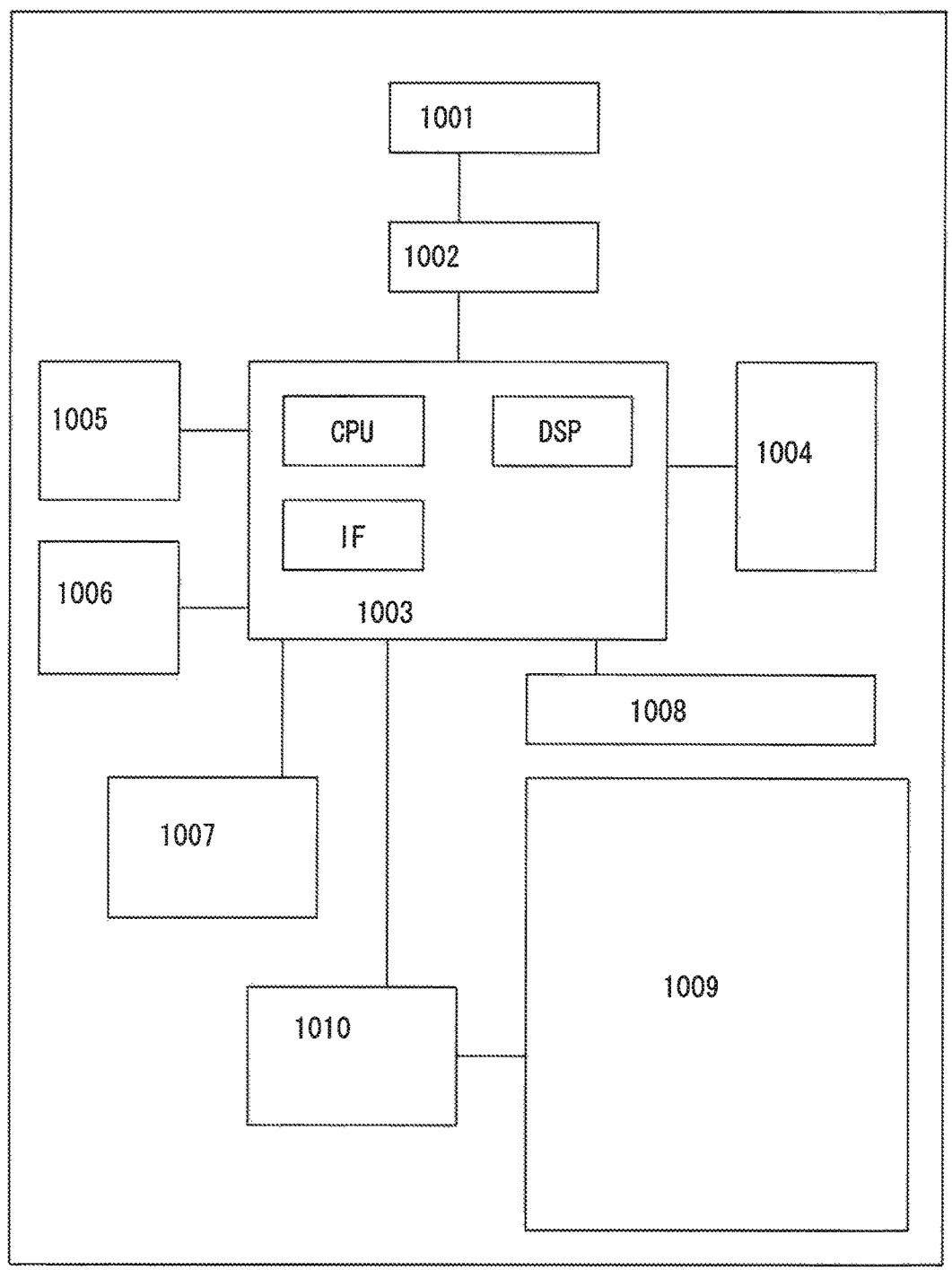
FIG. 25 is a block diagram illustrating an embodiment of a semiconductor device.

Next, FIG. 25 illustrates a block diagram of an e-book reader. FIG. 25 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 25. The memory circuit 1007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to save information for a long time, the information may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, it is possible to obtain a portable device which is capable of reading data at high speed, storing data for a long time, and reducing power consumption.

The methods and structures described in this embodiment can be combined as appropriate with any of the methods and structures described in the other embodiments.

This application is based on Japanese Patent Application serial no. 2012-011160 filed with Japan Patent Office on Jan. 23, 2012, the entire contents of which are hereby incorporated by reference.

What is claimed is:

1. A method for manufacturing a semiconductor device, comprising:
   forming an oxide semiconductor film;
   forming a gate insulating film over the oxide semiconductor film;
   forming a gate electrode over the gate insulating film, the gate electrode overlapping with the oxide semiconductor film;
   forming a metal film in contact with the oxide semiconductor film, the metal film comprising a metal element;
   forming a first region comprising the metal element in the oxide semiconductor film and a metal oxide insulating film in contact with the first region by heat treatment performed in a state where the oxide semiconductor film is in contact with the metal film, wherein a part of the metal film remains unoxidized; and
   removing the part,
   wherein the heat treatment is performed in an inert gas atmosphere.

2. The method for manufacturing a semiconductor device according to claim 1, further comprising:
   introducing dopant into the oxide semiconductor film through the gate insulating film by using the gate electrode as a mask;
   forming a sidewall insulating film on a side surface of the gate electrode; and
   removing a part of the gate insulating film by using the gate electrode and the sidewall insulating film as masks to expose a surface of the oxide semiconductor film,
   wherein the oxide semiconductor film is formed over an oxide film.

3. The method for manufacturing a semiconductor device according to claim 1, further comprising:
   removing a part of the gate insulating film by using the gate electrode as a mask to expose a surface of the oxide semiconductor film;
   forming a sidewall insulating film on a side surface of the gate electrode; and
   introducing dopant into the oxide semiconductor film through the metal oxide insulating film by using the gate electrode and the sidewall insulating film as masks,
   wherein the oxide semiconductor film is formed over an oxide film.

4. The method for manufacturing a semiconductor device according to claim 2, further comprising:
   forming a protective insulating film and an interlayer insulating film over the metal oxide insulating film, the sidewall insulating film, and the gate electrode;
   forming an opening portion reaching the first region in the interlayer insulating film; and
   forming an electrode in the opening portion.

5. The method for manufacturing a semiconductor device according to claim 1, further comprising:
   forming an electrode over an oxide film;
   introducing dopant into the oxide semiconductor film through the gate insulating film by using the gate electrode as a mask;
   forming a sidewall insulating film on a side surface of the gate electrode; and
   removing a part of the gate insulating film by using the gate electrode and the sidewall insulating film as masks to expose a surface of the oxide semiconductor film,
   wherein the oxide semiconductor film is formed over the electrode.

6. The method for manufacturing a semiconductor device according to claim 1, further comprising:
   forming an electrode over an oxide film;
   removing a part of the gate insulating film by using the gate electrode as a mask to expose a surface of the oxide semiconductor film;
   forming a sidewall insulating film on a side surface of the gate electrode; and
   introducing dopant into the oxide semiconductor film through the metal oxide insulating film by using the gate electrode and the sidewall insulating film as masks,
   wherein the oxide semiconductor film is formed over the electrode.

7. The method for manufacturing a semiconductor device according to claim 1, wherein one or more of nitrogen, helium, neon, and argon are used as the inert gas atmosphere.

8. The method for manufacturing a semiconductor device according to claim 1, wherein the metal film comprises one or more elements selected from aluminum, indium, titanium, tin, tungsten, nickel, molybdenum, and zinc.

9. The method for manufacturing a semiconductor device according to claim 2, wherein one or more elements selected from aluminum, indium, titanium, tin, tungsten, nickel, molybdenum, zinc, phosphorus, arsenic, antimony, boron, nitrogen, helium, neon, argon, fluorine, and chlorine are used as the dopant.

10. A method for manufacturing a semiconductor device, comprising:
    forming an oxide semiconductor film;
    forming a gate insulating film over the oxide semiconductor film;
    forming a gate electrode over the gate insulating film, the gate electrode overlapping with the oxide semiconductor film;
    introducing dopant into the oxide semiconductor film through the gate insulating film by using the gate electrode as a mask;
    forming a sidewall insulating film on a side surface of the gate electrode;
    removing a part of the gate insulating film by using the gate electrode and the sidewall insulating film as masks to expose a surface of the oxide semiconductor film;
    forming a metal film in contact with the oxide semiconductor film, the metal film comprising a metal element;
    forming a first region comprising the metal element in the oxide semiconductor film and a metal oxide insulating film in contact with the first region by heat treatment performed in a state where the oxide semiconductor film is in contact with the metal film, wherein a part of the metal film remains unoxidized; and
    removing the part,
    wherein the oxide semiconductor film is formed over an oxide film.

11. The method for manufacturing a semiconductor device according to claim 10, further comprising:
    forming a protective insulating film and an interlayer insulating film over the metal oxide insulating film, the sidewall insulating film, and the gate electrode;
    forming an opening portion reaching the first region in the interlayer insulating film; and
    forming an electrode in the opening portion.

12. The method for manufacturing a semiconductor device according to claim 10, wherein the metal film comprises one or more elements selected from aluminum, indium, titanium, tin, tungsten, nickel, molybdenum, and zinc.

13. The method for manufacturing a semiconductor device according to claim 10, wherein one or more elements selected from aluminum, indium, titanium, tin, tungsten, nickel, molybdenum, zinc, phosphorus, arsenic, antimony, boron, nitrogen, helium, neon, argon, fluorine, and chlorine are used as the dopant.

* * * * *